(12) United States Patent
Zhu et al.

(10) Patent No.: US 11,302,868 B2
(45) Date of Patent: Apr. 12, 2022

(54) METHODS FOR PRODUCING PEROVSKITE-CONTAINING DEVICES

(71) Applicant: Alliance for Sustainable Energy, LLC, Golden, CO (US)

(72) Inventors: Kai Zhu, Littleton, CO (US); Fei Zhang, Lakewood, CO (US); Joseph Jonathan Berry, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 50 days.

(21) Appl. No.: 16/782,891

(22) Filed: Feb. 5, 2020

(65) Prior Publication Data
US 2020/0251654 A1 Aug. 6, 2020

Related U.S. Application Data

(60) Provisional application No. 62/801,398, filed on Feb. 5, 2019.

(51) Int. Cl.
*H01L 51/00* (2006.01)
*H01L 51/42* (2006.01)
*H01G 9/20* (2006.01)

(52) U.S. Cl.
CPC ....... *H01L 51/0003* (2013.01); *H01G 9/2059* (2013.01); *H01L 51/0002* (2013.01); *H01L 51/0026* (2013.01); *H01L 51/4246* (2013.01); *C01P 2002/34* (2013.01); *H01L 51/42* (2013.01); *Y02E 10/549* (2013.01)

(58) Field of Classification Search
CPC ............. H01L 51/0002; H01L 51/0003; H01L 51/4246; H01L 51/0026; C01P 2002/34; Y02E 10/549
See application file for complete search history.

(56) References Cited

U.S. PATENT DOCUMENTS

| | | |
|---|---|---|
| 2009/0246405 A1 | 10/2009 | Tsuchiya et al. |
| 2017/0084400 A1* | 3/2017 | Cheng ..................... C30B 29/54 |
| 2017/0358759 A1* | 12/2017 | Lee .......................... C09K 11/06 |
| 2019/0348577 A1* | 11/2019 | Pathak ................ H01L 33/0075 |

OTHER PUBLICATIONS

Back, H. et al., "Achieving long-term stable perovskite solar cells via ion neutralization," Energy & Environmental Science, vol. 9, 2016, 6 pages.

(Continued)

*Primary Examiner* — Aaron J Gray
(74) *Attorney, Agent, or Firm* — Michael A. McIntyre

(57) ABSTRACT

The present disclosure relates to a method that includes applying a first perovskite precursor solution to a substrate to form a first liquid film of the first perovskite precursor solution on the substrate; from the first liquid film, forming a first intermediate solid perovskite layer on the substrate; repeating at least once, both the applying and the forming, resulting in the creation of at least one additional intermediate solid perovskite layer; and treating a last intermediate solid perovskite layer, resulting from the at least one additional applying and the at least one additional forming, to create a final solid perovskite layer.

20 Claims, 59 Drawing Sheets

(56) References Cited

OTHER PUBLICATIONS

Cebulla, R. et al., "Al-doped zinc oxide films deposited by simultaneous rf and dc excitation of a magnetron plasma: Relationships between plasma parameters and structural and electrical film properties," Journal of Applied Physics, vol. 83, No. 2, 1998, 9 pages.

Choi, W. et al., "Effect of grain alignment on interface trap density of thermally oxidized aligned-crystalline silicon films," Applied Physics Letters, vol. 89, 2006, 3 pages.

Elumalai, N. K. et al., "Hysteresis in organic-inorganic hybrid perovskite solar cells," Solar Energy Materials & Solar Cells, vol. 157, 2016, pp. 476-509.

Gu, Z. et al., "A general printing approach for scalable growth of perovskite single-crystal films," Science Advances, vol. 4, 2018, 9 pages.

Hooton, J. et al., "A comparison of morphology and surface energy characteristics of sulfathiazole polymorphs based upon single particle studies," European Journal of Pharmaceutical Sciences, vol. 28, 2006, pp. 315-324.

Jiang, J. et al., "Polymer Doping for High-Efficiency Perovskite Solar Cells with Improved Moisture Stability," Advanced Energy Materials, vol. 8, 2018, 9 pages.

Li, W. et al., "Subgrain Special Boundaries in Halide Perovskite Thin Films Restrict Carrier Diffusion," ACS Energy Letters, vol. 3, 2018, pp. 2669-2670.

Mor, G. et al., "A review on highly ordered, vertically oriented TiO2 nanotube arrays: Fabrication, material properties, and solar energy applications," Solar Energy Materials & Solar Cells, vol. 90, 2006, pp. 2011-2075.

Owens, D.K., "Estimation of the Surface Free Energy of Polymers," Journal of Applied Polymer Science, vol. 13, 1969, pp. 1741-1747.

Qin, P.L. et al., "Stable and Efficient Organo-Metal Halide Hybrid Perovskite Solar Cells via π-Conjugated Lewis Base Polymer Induced Trap Passivation and Charge Extraction," Advanced Materials, vol. 30, 2018, 12 pages.

Sun, M. et al., "Tuning the crystal growth of perovskite thin-films by adding the 2-pyridylthiourea additive for highly efficient and stable solar cells prepared in ambient air," Journal of Materials Chemistry A, vol. 5, 2017, 9 pages.

Ummadisingu, A. et al., "The effect of illumination on the formation of metal halide perovskite films," Nature, vol. 545, 2017, 5 pages.

Wang, Z.K. et al., "Induced Crystallization of Perovskites by a Perylene Underlayer for High-Performance Solar Cells," ACS Nano, vol. 10, 2016, 11 pages.

Yuan, Y. et al., "Ion Migration in Organometal Trihalide Perovskite and Its Impact on Photovoltaic Efficiency and Stability," ACC Chem. Res., vol. 49, 2016, pp. 286-293.

Yuan, Y. et al., "Contact Angle and Wetting Properties," Surf. Sci. Tech. Chapter 1, vol. 51, 2013, 32 pages.

Zhang, F. et al., "A Novel Dopant-Free Triphenylamine Based Molecular "Butterfly" Hole-Transport Material for Highly Efficient and Stable Perovskite Solar Cells," Advanced Energy Materials, vol. 6, 2016, 7 pages.

Zhao, Y. et al., "Perovskite seeding growth of formamidinium-lead-iodide-based perovskites for efficient and stable solar cells," Nature Communications, vol. 9, 2018, 10 pages.

International Search Report (3 pages) and Written Opinion (4 pages) from corresponding PCT/US20/16872, dated Apr. 29, 2020.

\* cited by examiner

METHODS FOR PRODUCING PEROVSKITE-CONTAINING DEVICES

CROSS-REFERENCE TO RELATED APPLICATIONS

This application claims priority from U.S. Provisional Patent Application No. 62/801,398 filed Feb. 5, 2019, the disclosure of which is incorporated herein by reference in its entirety.

CONTRACTUAL ORIGIN

This invention was made with government support under Contract No. DE-AC36-08G028308 awarded by the Department of Energy. The government has certain rights in the invention.

BACKGROUND

Hybrid organic-inorganic lead halide perovskite solar cells have shown a remarkable rise in power conversion efficiency over a relatively short period of time. But a key challenge hindering the practical application of these cells is long-term stability against moisture. Thus, there remains a need for methods that can produce perovskite-containing devices having improved physical properties, performance characteristics, and long-term stability.

SUMMARY

An aspect of the present disclosure is a method that includes applying a first perovskite precursor solution to a substrate to form a first liquid film of the first perovskite precursor solution on the substrate; from the first liquid film, forming a first intermediate solid perovskite layer on the substrate; repeating at least once, both the applying and the forming, resulting in the creation of at least one additional intermediate solid perovskite layer; and treating a last intermediate solid perovskite layer, resulting from the at least one additional applying and the at least one additional forming, to create a final solid perovskite layer. In some embodiments of the present disclosure, the repeating may be performed between 1 and 10 times.

In some embodiments of the present disclosure, the first perovskite precursor solution may include a precursor for a perovskite defined by $ABX_3$, where A is a first cation, B is a second cation, and X is an anion. In some embodiments of the present disclosure, the first precursor solution may include at least one of $CsPbI_3$, $FAPbI_3$, $MAPbBr_3$, $PbI_2$, andor $PbBr_2$. In some embodiments of the present disclosure, the final solid perovskite layer may include $Cs_{(1-x-y)}FA_xMA_yPb I_{(3-z)}Br_z$, $0 \le x \le 1$, $0 \le y \le 1$, and $0 \le z \le 3$. In some embodiments of the present disclosure, the first perovskite precursor solution may include a polar solvent.

In some embodiments of the present disclosure, the polar solvent may include at least one of dimethyl formamide (DMF)/dimethyl sulfoxide (DMSO), NN-dimethylformamide, γ-butyrolactone, dimethylacetamide, acrylonitrile, tetrahydrofuran, N-methyl-2-pyrrolidone, 1,3-dimethylimidazolidin-2-one, and/or 1,3-dimethyl-3,4,5,6-tetrahydropyrimidin-2(1H)-one. In some embodiments of the present disclosure, the first perovskite precursor solution may include a quantum dot. In some embodiments of the present disclosure, the first perovskite precursor solution used during the first applying and the first forming may include a first precursor.

In some embodiments of the present disclosure, a second perovskite precursor solution used during a second applying and a second forming may include a second precursor that is different from the first precursor. In some embodiments of the present disclosure, each applying may be performed by at least one of a liquid phase processing method, a vapor phase processing method, and/or a gas phase processing method. In some embodiments of the present disclosure, the final solid perovskite layer may include at least one of a physical property and/or a performance metric that is measurably better than the corresponding physical property and/or a performance metric of the first intermediate solid perovskite layer. In some embodiments of the present disclosure, the forming may be performed by contacting the first liquid film with a liquid. In some embodiments of the present disclosure, the liquid may include chlorobenzene. In some embodiments of the present disclosure, the treating may include annealing the intermediate solid perovskite layer.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 9A—control; FIG. 9B—SSG1; FIG. 9C—SSG2; FIG. 9D—SSG3; and FIG. 9E—SSG4. The SSG2 sample (FIG. 9C) showed the longest lifetime for ground-state bleach.

REFERENCE NUMBERS

Figure 1A:
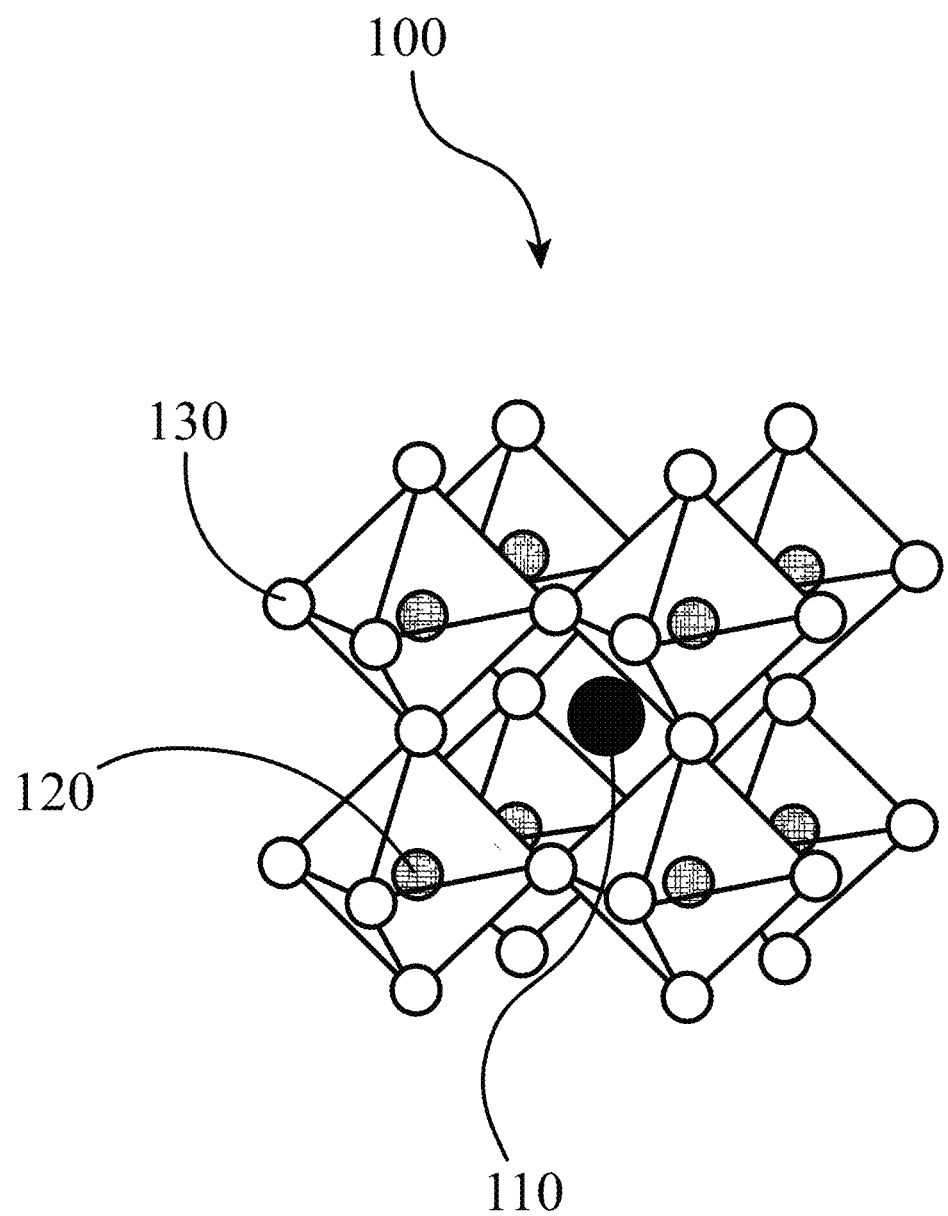
FIGS. 1A, 1B, and 1C illustrate a perovskite, according to some embodiments of the present disclosure.

100 . . . perovskite
110 . . . A-cation
120 . . . B-cation
130 . . . X-anion
200 . . . self-seeding growth (SSG) method
210 . . . preparing a perovskite precursor solution
215 . . . precursor solution
220 . . . applying of perovskite precursor solution
225 . . . liquid film of perovskite precursor solution
230 . . . forming of intermediate solid perovskite layer
235 . . . intermediate solid perovskite layer
240 . . . recycling
250 . . . treating of intermediate solid perovskite layer
260 . . . final solid perovskite layer
300 . . . seed layer
310 . . . growth layer
320 . . . gradient layer
330 . . . substrate
400 . . . photovoltaic (PV) device
410 . . . first contact
420 . . . first charge transport layer
430 . . . second charge transport layer
440 . . . second contact

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present disclosure, the term "substantially" is defined as approaching a specific numeric value or target to within 20%, 15%, 10%, 5%, or within 1% of the value or target. In further embodiments of the present disclosure, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present disclosure, the term "about" is used to indicate an uncertainty limit of less than or equal to ±20%, ±15%, ±10%, ±5%, or ±1% of a specific numeric value or target. In some embodiments of the present disclosure, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to methods for producing perovskite-containing devices, e.g. solar cells, having improved physical properties and performance characteristics. In particular, the present disclosure relates to a new method, referred to herein, as a "self-seeding growth" (SSG) method. As shown herein, the SSG method, using a one-step solution formulation, is capable of producing high-quality perovskite thin layers with, among other things, reduced defect density, fewer apparent grain boundaries, improved charge-carrier transport and lifetime, and enhanced hydrophobicity for enhanced stability. Using a formamidinium/methylammonium/cesium (FA/MA/Cs)-based perovskite, photovoltaic devices manufactured using the SSG method described herein show an improved efficiency from 17.76% (not using the SSG method, also referred to herein as the "control" method) to 20.30% (utilizing the SSG method), with an unencapsulated device produced using the SSG method retaining >80% of its initial power conversion efficiency over 4,680 hours of storage in an ambient environment with high relative humidity. In addition, as shown herein, the SSG method may be applied to different substrates (e.g., $SnO_2$ vs. $TiO_2$; planar vs. mesoporous) and using different perovskite compositions (e.g. FA/MA and MA based perovskites), making the SSG method a flexible one, capable of preparing a variety of high-quality perovskite thin layers for multiple device applications.

Figure 1B:
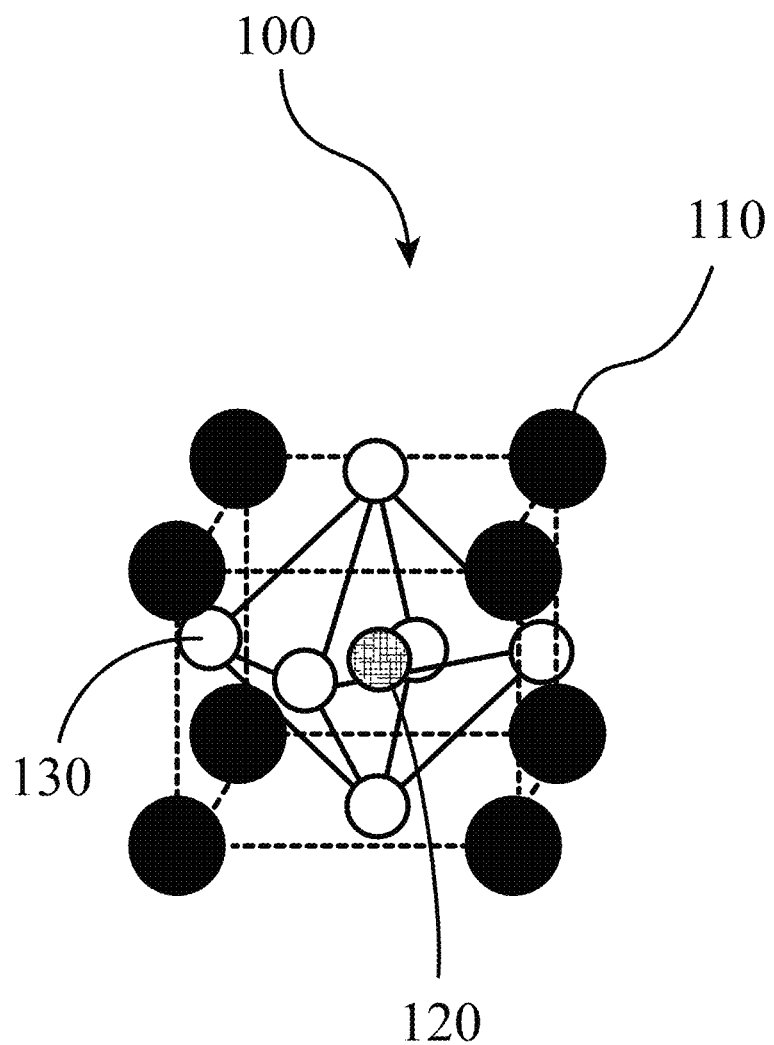
Figure 1C:
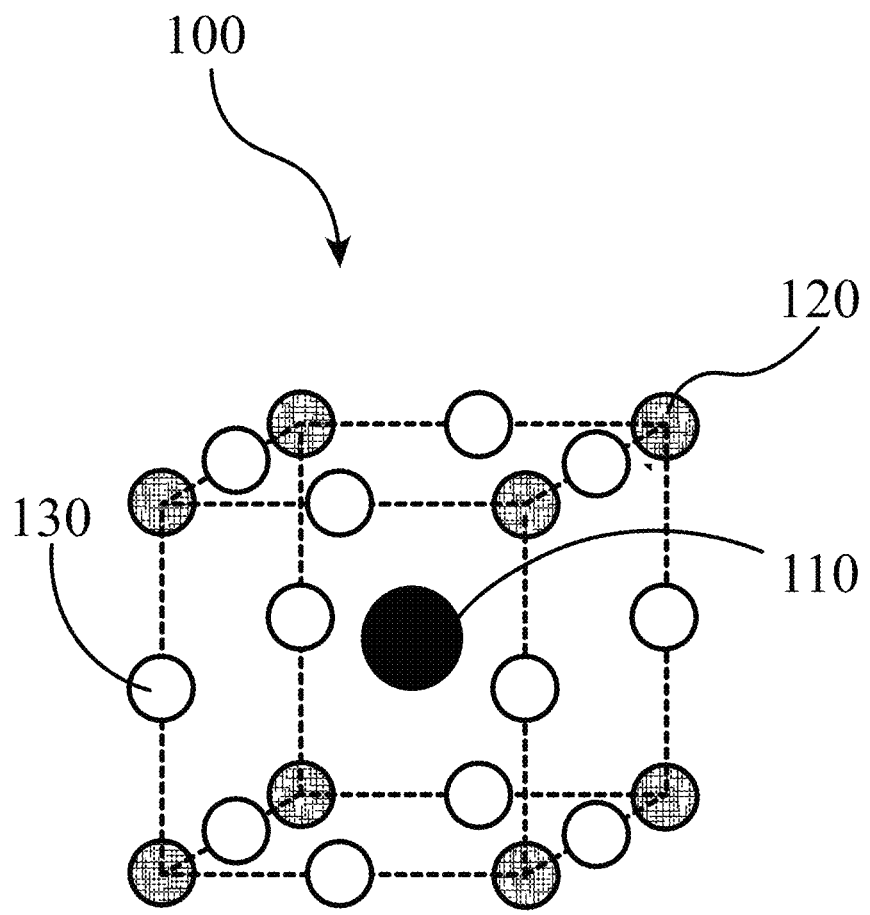

FIGS. 1A, 1B, and 1C illustrate that perovskites 100, for example hybrid organic-inorganic lead halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions centrally located between B-cations 120 along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in FIG. 1B, the stoichiometry simplifies to B=1, A=8*0.124 =1, and X=6*0.5=3, or $ABX_3$. Similarly, referring again to FIG. 1C, since the A-cation is centrally positioned, it is not shared with any of the unit cell's neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present disclosure, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2 CH_2NH_3^+$), butylammonium ($CH_3CH_2 CH_2 CH_2NH_3^+$), formamidinium ($NH_2CH=NH_2^+$), hydrazinium, acetylammonium, dimethylammonium, imidazolium, guanidinium and/or any other suitable nitrogen-containing and/or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as a straight-chain or a branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), iso-propyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, a perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and the X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Therefore, a perovskite 100 may have more than one halogen element, where the various halogen elements are present in non-integer quantities; e.g. x is not equal to 1, 2, or 3. In addition, perovskite halides, like other organic-inorganic perovskites, can form not only three-dimensional (3-D), but also two-dimensional (2-D), one-dimensional (1-D), and/or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens. Any combination is possible provided that the charges balance.

For example, a perovskite having the basic crystal structure illustrated in FIG. 1A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1-}B^{3+}X_6$, with examples of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 2:
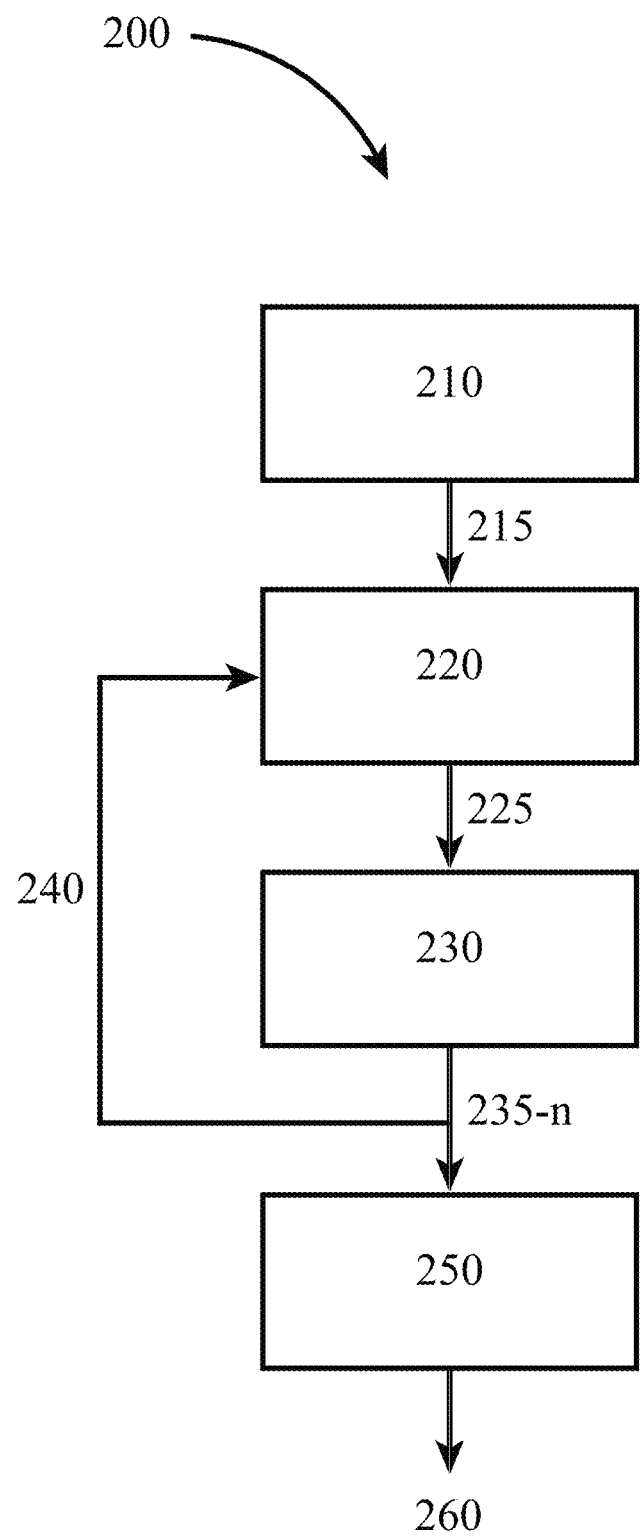
FIG. 2 illustrates a method for making a perovskite, according to some embodiments of the present disclosure.

FIG. 2 illustrates an example of a self-seeding growth (SSG) method 200 for making a solid perovskite layer 260, according to some embodiments of the present disclosure. In general, the SSG method 200 described herein produces a perovskite seed layer (i.e. nucleation layer) on a substrate (not shown), where the seed layer results in the subsequent formation of a higher-quality perovskite layers due to subsequent processing steps. Although solution methods are described below for producing a perovskite seed layer on a substrate, it is believed that non-solution processing steps may be used for any one or all of the processing steps illustrated in FIG. 2. For example, vapor phase processing and/or solid-state processing methods may be used in place of and/or in addition to any one of the solution processing steps illustrated in FIG. 2. In some embodiments of the present disclosure, a precursor solution 215 may contain quantum dots, e.g. perovskite quantum dots, resulting in a liquid film 225 on a substrate, where the liquid film 225 contains quantum dots. In some embodiments of the present disclosure, these quantum dots may provide a "seed layer" and/or nucleation sites on which subsequent applications of precursor solution(s), with or without quantum dots, may nucleate to form an improved final solid perovskite layers 260, especially when compared to standard solution processing methods to produce solid perovskite layers having substantially the same chemical compositions (e.g. of $ABX_3$).

In some embodiments of the present disclosure, a SSG method 200 may begin with the preparation 210 of a perovskite precursor solution. For example, a precursor solution 215 may be produced by mixing suitable solid perovskite precursors into a solvent, for example dimethylformamide (DMF) and/or dimethyl sulfoxide (DMSO). Examples of solid perovskite precursors include $CsPbI_3$, $FAPbI_3$, $MAPbBr_3$, $PbI_2$, and/or $PbBr_2$, to target a final solid perovskite layer having a composition of $Cs_{(1-x-y)}FA_xMA_y$-$PbI_{(3-z)}Br_z$. However, any suitable perovskite precursor materials may be chosen according to the final desired solid perovskite layer that is targeted. Further examples of final target perovskites include $FA_xMA_{(1-x)}PbI_{(3-y)}Cl_y$ and mixed B-cation perovskites including $Pb_xSn_{(1-x)}$.

The SSG method 200 may then proceed with a first applying 220-1 of a first perovskite precursor solution 215-1 onto a substrate (not shown). Depending on the photovoltaic device being fabricated, a substrate may be any one of various layers of the targeted photovoltaic device's stack; e.g. a hole-transport layer, an electron-transport layer, a conducting layer, a contact layer, and/or a transparent layer. Specific examples of substrates suitable for the present SSG methods described herein include metal oxides, conducting metal oxides, transparent conducting oxides, metals, plastics, polymers, and/or resins. The first applying 220-1 of the first precursor solution 215-1 onto the substrate may be accomplished by any suitable solution processing technique, for example, at least one of spin-coating, blade-coating, curtain-coating, dip-coating, and/or spray-coating. The applying of the first precursor solution 215-1 may then result in the formation of a first liquid film 225-1 of the first precursor solution 215-1 on the substrate. Once deposited, the first liquid film 225-1 of the first precursor solution 215-1 may result in the forming 230 of a first intermediate solid perovskite layer 235-1 on the substrate. The first forming 230-1 of the first intermediate solid perovskite layer 235-1 may be achieved by various methods, including at least one of solvent treatment (i.e. solvent extraction), heat treatment, exposure to a relatively dry gas, and/or exposure to the local ambient conditions.

At this point exemplary SSG method 200, according to some embodiments of the present disclosure, the first intermediate solid perovskite layer 235-1 may take one of two paths. From FIG. 2, the first path is to a downstream treating 250 of the first intermediate solid perovskite layer 235-1. The treating 250 may include, among other things, heat-treating (i.e. annealing) the first intermediate solid perovskite layer 235-1, resulting in the creation of the final solid perovskite layer 260-1 exiting the method 200. However, referring again to FIG. 2, the first intermediate solid perovskite layer 235-1 may take a second path, which recycles the first intermediate solid perovskite layer 235-1 back to a second applying 220-2 of a second perovskite precursor solution 215-2 to the surface of the first intermediate solid perovskite layer 250-1. This second path is indicated in FIG. 2 by the reference numeral 240 for recycling the first intermediate solid perovskite layer 235-1 back to the applying 220 step, at this point in the method 200, a second applying 220-2 step. So, referring again to FIG. 2, when n=1, the first intermediate solid perovskite layer 235-1 is not recycled back to the applying 220 step and only makes one pass (passes=n=1) through a first applying 220-1 step and a first forming 230-1, resulting in the synthesis of a final solid perovskite layer 260-1. As used herein, a method that makes only one pass through the process/method 200 to produce an intermediate solid perovskite layer 235-1 and, after treating 250, a final solid perovskite layer 260-1, is referred to herein as the "control" method.

Although, the method 200 with n=1 can produce a final solid perovskite layer 260-1, the SSG method 200 described herein is capable of producing significantly better quality and/or performing final solid perovskite layers 260-n when n is greater than one (e.g. between 2 and 5 inclusively), when the intermediate solid perovskite layer 235-n is cycled back to the applying 220 step at least once; e.g. n is equal to two or more. Without wishing to be bound by theory, it is hypothesized that when an intermediate solid perovskite layer, e.g. 235-1, is recycled 240 back to a second applying 220-2 step of the method 200, the newly applied precursor solution 215-2, which in some embodiments includes a solvent, may at least partially dissolve the first intermediate solid perovskite layer 235-1. In other words, at least some of the "building blocks" making up the first intermediate solid perovskite layer 235-1, e.g. A-cations, B-cations, and/or X-anions, may be dissolved by the solvent contained in the second perovskite precursor solution 215-2. However, since the second precursor solution 215-2 already contains a non-zero concentration of the perovskite precursor materials, an equilibrium may be achieved between the concentration of the perovskite precursor materials contained in the solution and the perovskite materials present as a solid on the substrate. The end result may be, on the substrate, a new liquid film 225-2 containing the perovskite precursor materials, including the dissolved portion the intermediate solid perovskite layer, and a nucleation layer (not shown), e.g. the non-dissolved portion of the first intermediate solid perovskite layer 235-1, also present on the substrate. This nucleation layer or "seed" layer, the remnants of the now at least partially dissolved first intermediate perovskite layer 235-1, may then provide a surface, which may enable improved crystallization to occur during the subsequent second forming 230-2 step, to yield a new, second intermediated solid perovskite layer 235-2, and eventually, if exiting the method 200 through the treating 250 step, a final solid perovskite layer 260-2, having improved physical properties and performance characteristics, when compared to the "control" perovskite 260-1.

The method 200 just described for producing a second intermediate solid perovskite layer 235-2, corresponding to completing a first applying 220-1 of a first perovskite precursor solution 215-1 first to a new, "clean" substrate, followed by a second applying 220-2 of a second perovskite precursor solution 215-2 to the first formed intermediate solid perovskite layer 235-1, resulting in the forming of a second intermediate perovskite layer 235-2, may be repeated as many times as deemed necessary. As described in more detail below, in some embodiments of the present disclosure, the recycling 240 may be performed between 1 and 20 times, or between 1 and 10 times, or between 1 and 5 times.

Further, in some embodiments of the present disclosure, an SSG method may not complete each subsequent applying 220 and forming 230 steps exactly the same as the earlier completed applying 220 and forming 230 steps. For example, as described above, a first applying 220-1 step may include a first precursor solution 215-1 containing already formed perovskite quantum dots (i.e. nanocrystals), such that the first intermediate solid perovskite layer 235-1 is constructed primarily of a layer of perovskite quantum dots. Then, a second applying 220-2 step may include the application of a second perovskite precursor solution 215-2, where this solution contains the precursors in a substantially dissolved state. Then, in the subsequent forming 230-2 step, the previously deposited quantum dots may provide a seeding layer (i.e. nucleation layer) that enables the synthesis, during the second forming 230-2 step, of a subsequent intermediate solid perovskite layer 235-2 having improved properties. In some embodiments of the present disclosure, during a first applying 220-1 and first forming 230-1 steps, a first precursor solution 215-1 may be utilized having certain advantages such as lower costs, optimum solubilities, etc. to produce a first intermediate solid perovskite layer 235-1 having a first composition (e.g. methylammonium lead iodide, i.e. MAPI), followed by a second applying 220-2 and a second forming 230-2 using a second precursor solution 215-2 that is different from the first precursor solution 215-1 (e.g. containing multiple A-cations [e.g. Cs/MA/FA] and multiple X-anions [e.g. Br/Cl/I]). Thus, in some embodiments of the present disclosure, a first precursor solution 215-1 and each subsequent precursor solution 215-n may be substantially the same. In other embodiments of the present disclosure, a first precursor solution 215-1 and each subsequent precursor solution 215-n may be substantially different.

Further, as described above, a method 200 may include processing steps that are entirely solution phase processing steps. However, in some embodiments of the present disclosure, a method for producing high-quality perovskite films and perovskite-film-containing devices may use a combination of liquid phase processing steps and vapor phase processing steps. For example, referring again to FIG. 2, a method 200 may begin with a first applying 220-1 step and a first forming 230-1 step that are performed essentially at the same time by the use of a vapor-phase depositing step, resulting in the creation of a first intermediate solid perovskite layer 235-1. Suitable vapor-phase depositing methods include atom layer deposition (ALD), chemical vapor deposition (CVD), pulsed laser deposition (PLD), evaporation, and sputtering. The first intermediate perovskite layer 235-1 may then be recycled 240-1 to a second applying 220-2 of a first perovskite precursor solution 215-A to the surface of the first intermediate perovskite layer 235-1, such that this exemplary method 200, then proceeds to downstream processing steps as described above.

Figure 3:
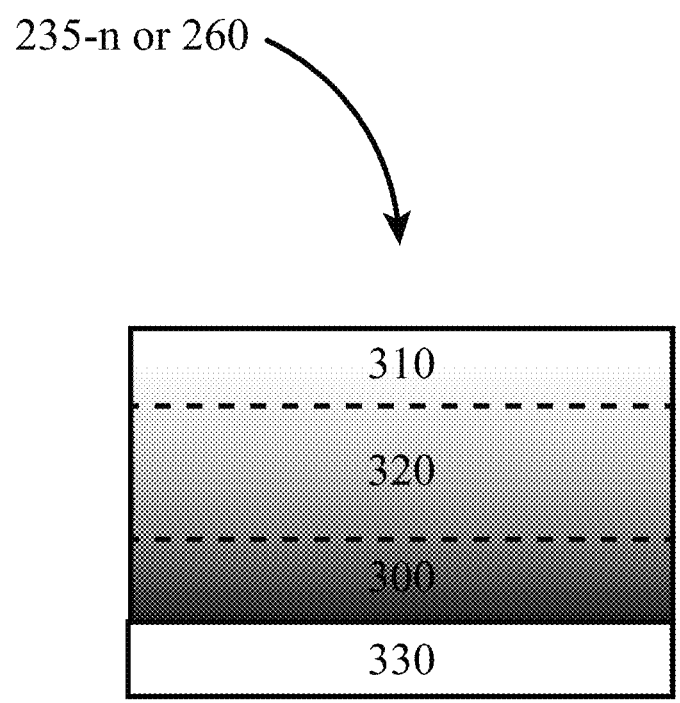
FIG. 3 illustrates a perovskite layer, made according to the method shown in FIG. 2, according to some embodiments of the present disclosure.

FIG. 3 illustrates an example of a solid perovskite layer, either an intermediate solid perovskite layer 235-n or a final solid perovskite layer 260, made according to the SSG method described herein. In some embodiments of the present disclosure, a final solid perovskite layer 260-n, where n is greater than one, resulting from the SSG method described above, may include a gradient layer 320 positioned between a seed layer 300 and a growth layer 310, where all three of these layers are positioned on a substrate 330. The seed layer 300 may correspond to "seed" crystals positioned on the substrate 330 resulting from one or more applications of a perovskite precursor solution to an already deposited intermediate solid perovskite layer, according to the SSG method 200 shown in FIG. 2. As described above, the applying 220-n+1 of a precursor solution 215-n+1 to an already formed intermediate solid perovskite layer 235-n may result in at least the partial dissolution of the intermediate solid perovskite layer 235-n, such that only a portion of the material originally used to synthesize this layer remains on the substrate 230. This remaining material may make up the seed layer 300 on which nucleation of next intermediate solid perovskite layer 235-n+1 can grow, resulting in the growth layer 310 shown in FIG. 3. The growth layer 310 may continue to develop as the intermediate solid perovskite layer is treated (see the treating 250 step of FIG. 2) to form the final target solid perovskite layer 260. Similarly, the gradient layer 320 positioned between the seed layer 300 and the growth layer 310 may develop and/or change during the final treating step to produce the final solid perovskite layer 260. It is anticipated that the seed layer 300 may have at least one physical property and/or performance metric that is statistically different from the corresponding physical property and/or performance metric of the growth layer 310. Possible examples of such a physical property and/or performance metric include at least one of crystallinity, defect density, grain boundaries, etc. The gradient layer 320 may have a value or range of values of the characteristic physical property and/or performance metric that lies somewhere on the continuum between the corresponding values for the growth layer 310 and the seed layer 300. In some embodiments of the present disclosure, the final perovskite, after annealing, may have a thickness between 50 nm and 10 microns, or between 100 nm and 5 microns.

Figure 4:
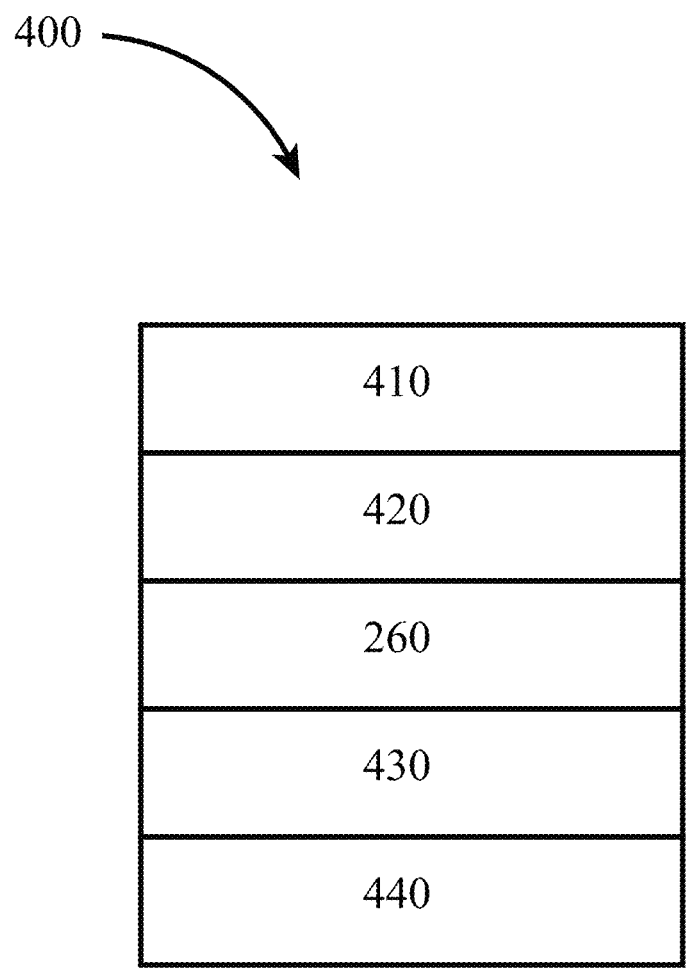
FIG. 4 illustrates a device that includes a perovskite layer like the perovskite layer shown inf FIG. 3, according to some embodiments of the present disclosure.

FIG. 4 illustrates a photovoltaic (PV) device 400 that may incorporate the solid perovskite layer 260 described above for FIGS. 1A, 1B, 1C, 2 and 3. In some embodiments of the present disclosure, the PV device 400 may include a first charge transport layer 420 (e.g., $TiO_2$, $SnO_2$, $BaSnO_4$, and ZnO) and a second charge transport layer 430 (e.g., Spiro-MeOTAD, P3HT, and PTAA), where the solid perovskite layer 260 is positioned between the first charge transport layer 420 and the second charge transport layer 430. In addition, the PV device 400 may include a first contact 410 (e.g., FTO and ITO) and a second contact 440 (e.g., Au and Ag), where the first charge transport layer 420 is positioned between the first contact 410 and the solid perovskite layer 260, and the second charge transport layer 430 is positioned between the second contact 440 and the solid perovskite layer 260. The materials listed above for these various layers, e.g. charge transport layers, contact layers, are exemplary and any other materials suitable for the various roles are considered within the scope of the present disclosure.

Thus, the present disclosure relates to a new, general approach—a self-seeding growth (SSG) as shown in FIG. 2 and described above—that modifies a one-step perovskite precursor formulation to create perovskite active layers and tune the formation of these layers. This SSG method is further illustrated in FIG. 5 in a cartoon form for an example of a laboratory-scale method of the SSG method. Compared to incumbent technologies, the SSG methods described herein produce perovskite thin layers exhibiting reduced defect density, fewer apparent grain boundaries, improved charge-carrier transport and lifetime, and enhanced ability to repel moisture/water. Using FA/MA/Cs-based perovskites, the power conversion efficiency (PCE) increased from 17.76% for the control method (non-SSG method) to 20.30% for the device produced by the SSG method, as described herein. In addition, SSG-based perovskite solar cells exhibited much improved robustness against high humidity without any additional encapsulation, such as with glass or ethylene vinyl acetate. When stored in an ambient environment, the PCE for the SSG-produced perovskite devices showed no degradation after 720 hours in 10%-20% relative humidity (RH), then remained at 96% of the initial PCE after 1,440 hours in 30%-50% RH, and finally dropped to 84% of the initial PCE after another 2,520 hours in 50%-75% RH (total 4,680 hours of test). It is also shown herein that the SSG method can be applied to different substrates (e.g., $SnO_2$ vs. $TiO_2$; planar vs. mesoporous) and perovskite compositions (e.g., FA/MA and MA based perovskites), making it a general approach for preparing high-quality perovskite thin layers for many different device applications.

Figure 5:
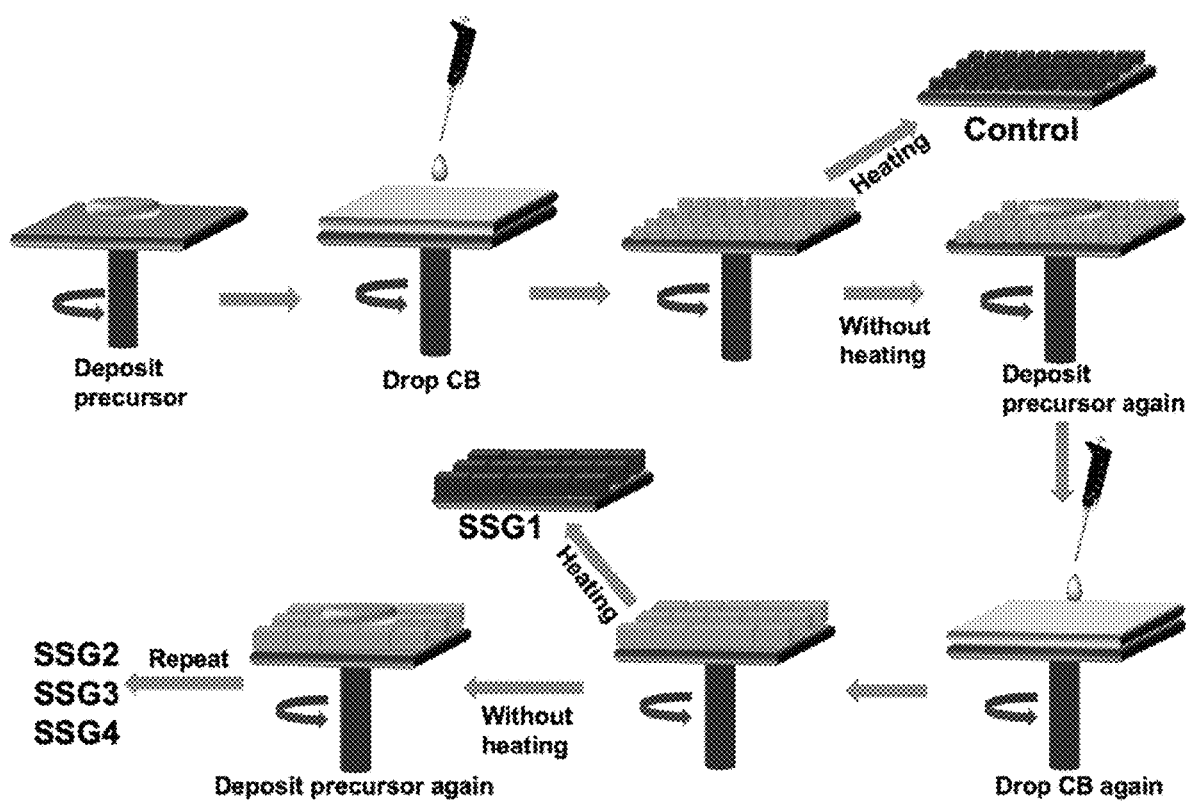
FIG. 5 illustrates a schematic of self-seeding growth (SSG) method for depositing perovskite films, according to some embodiments of the present disclosure. CB is chlorobenzene.

According to the SSG method described herein (see FIG. 2), seeds and/or seed layers (i.e. nucleation layers) were formed to facilitate perovskite layer growth, using a perovskite precursor solution based on a FA/MA/Cs perovskite composition. Thus, as described above, the applying 220 of a perovskite precursor solution 215 to an already formed intermediate solid perovskite layer 235, followed by a forming 230 step, was repeated a number of times. As shown below, the nomenclature SSG1-4 corresponds to the number of times the perovskite layer is passed through applying 220 and forming 230 steps of the SSG method 200 shown in FIG. 2, where SSG1 corresponds to one pass (passes=n=1), and SSG4 corresponds to four passes (passes=n=4 (recycled three times through the SSG process)). FIG. 5 schematically illustrates the SSG process for growing perovskite thin layers in the laboratory, using spin-coating for the applying of the perovskite precursor solution to a substrate. In this example of the SSG method, a triple-cation perovskite precursor solution included CsI, FAI, MABr, $PbI_2$, and $PbBr_2$ in a mixed solvent of dimethyl formamide (DMF)/dimethyl sulfoxide (DMSO) (at a 4:1 volume ratio) with 1.4 M $Pb^{2+}$. Other suitable solvents include one or more of NN-dimethylformamide, γ-butyrolactone, dimethylacetamide, acrylonitrile, tetrahydrofuran, N-methyl-2-pyrrolidone, 1,3-dimethylimidazolidin-2-one, and/or 1,3-dimethyl-3,4,5,6-tetrahydropyrimidin-2(1H)-one. Then, 60 μL of the as-prepared precursor solution was applied by spin-coating the precursor solution onto mesoporous $TiO_2$-coated FTO/glass substrates. During the last 15 seconds of a 30 second spin duration of a spin-coating step, 140 μL of chlorobenzene (CB) was dropped onto the above layer to promote the forming of the intermediate solid perovskite layer (n=1). Other suitable antisolvents include at least one of toluene, anisole, and/or diethyl ether. Without transferring the intermediate solid perovskite layer to a hotplate for annealing, another 60 μL of as-prepared precursor solution was applied by spin-coating onto the first intermediate solid perovskite layer (i.e. 235-1, also SSG1), followed by the same antisolvent treatment resulting, resulting in the next intermediate solid perovskite layer (i.e. 235-2, also SSG2). This method may be repeated multiple times (e.g. n>1) before the final treating step is performed to produce the final solid perovskite layer (i.e. solid perovskite layer 260 which is equal to the treated intermediate perovskite layer 235-n); e.g. by annealing at elevated temperature.

Figure 6A:
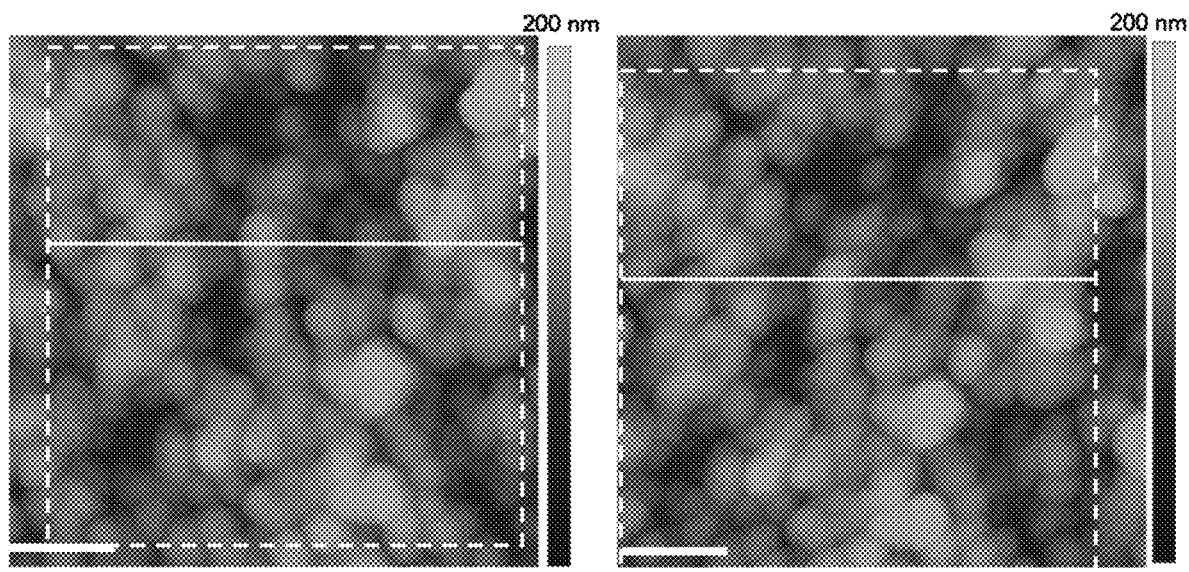
FIG. 6A illustrates atomic force microscopy (AFM) measurements: (left) pristine $TiO_2$; (right) SSG2 perovskite thin films without heating and followed by washing with DMSO/DMF, according to some embodiments of the present disclosure. The scale bar is 200 nm.
Figure 6B:
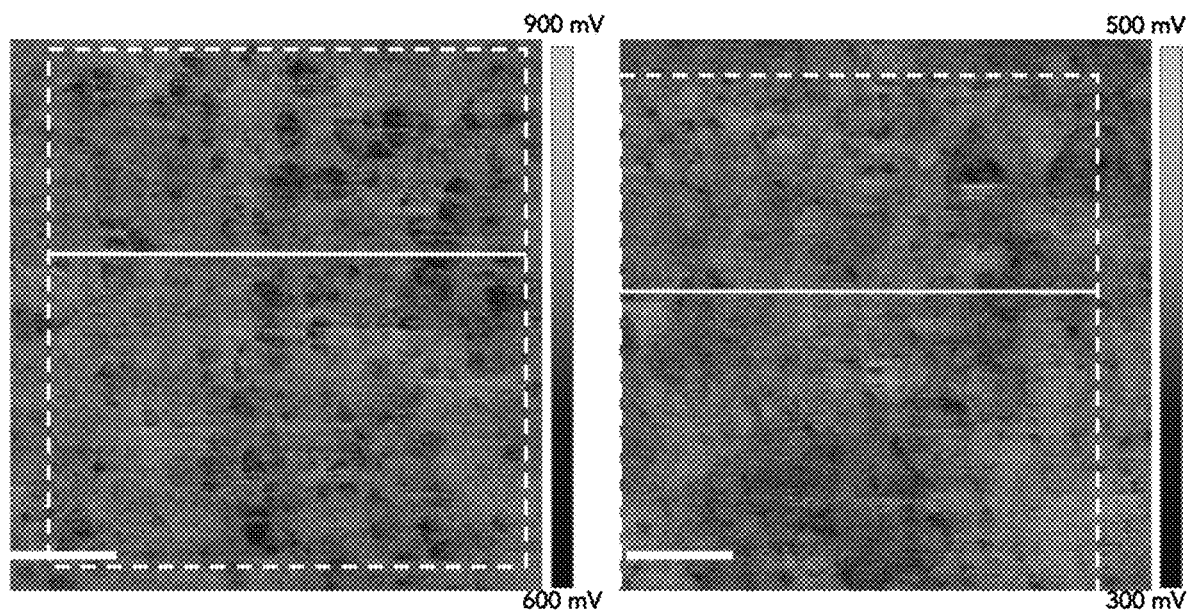
FIG. 6B illustrates Kelvin probe force microscopy (KPFM) measurements: (left) pristine $TiO_2$; (right) SSG2 perovskite thin films without heating and followed by washing with DMSO/DMF, according to some embodiments of the present disclosure. The scale bar is 200 nm.

To evaluate the impact of the self-seeding growth method (i.e. the SSG method) described above, a series of analyses were performed. First, the surface potential and morphology were examined by scanning Kelvin probe force microscopy (KPFM) and atomic force microscopy (AFM) respectively, with results shown in FIGS. 6A-6D, where FIG. 6A shows the AFM results and FIG. 6B shows the KPFM results. Pristine $TiO_2$ was prepared and subsequently on the same layer the SSG method was implemented with two passes (SSG process repeated twice; SSG2, n=2) to produce an intermediate solid perovskite layer, without heating; this was then washed with the same amount of DMSO/DMF as used in the perovskite applying steps (reference number 220 in FIG. 2). FIG. 6A shows that both samples, the starting pristine $TiO_2$ (left) and the same $TiO_2$ having a perovskite film (for n=2, SSG2) deposited on the pristine $TiO_2$ (right), had the same morphologies at the same locations on the $TiO_2$. Therefore, the AFM analysis suggests that the solvent (DMSO/DMF) mostly dissolved and removed the intermediate solid perovskite layer resulting from the SSG method (for n=2), such that the original morphology of the starting $TiO_2$ was recovered. In other words, the pure solvent treatment effectively removed most of the perovskite material, resulting in a clean $TiO_2$ surface having the same morphology as the original pristine $TiO_2$ surface.

Figure 6C:
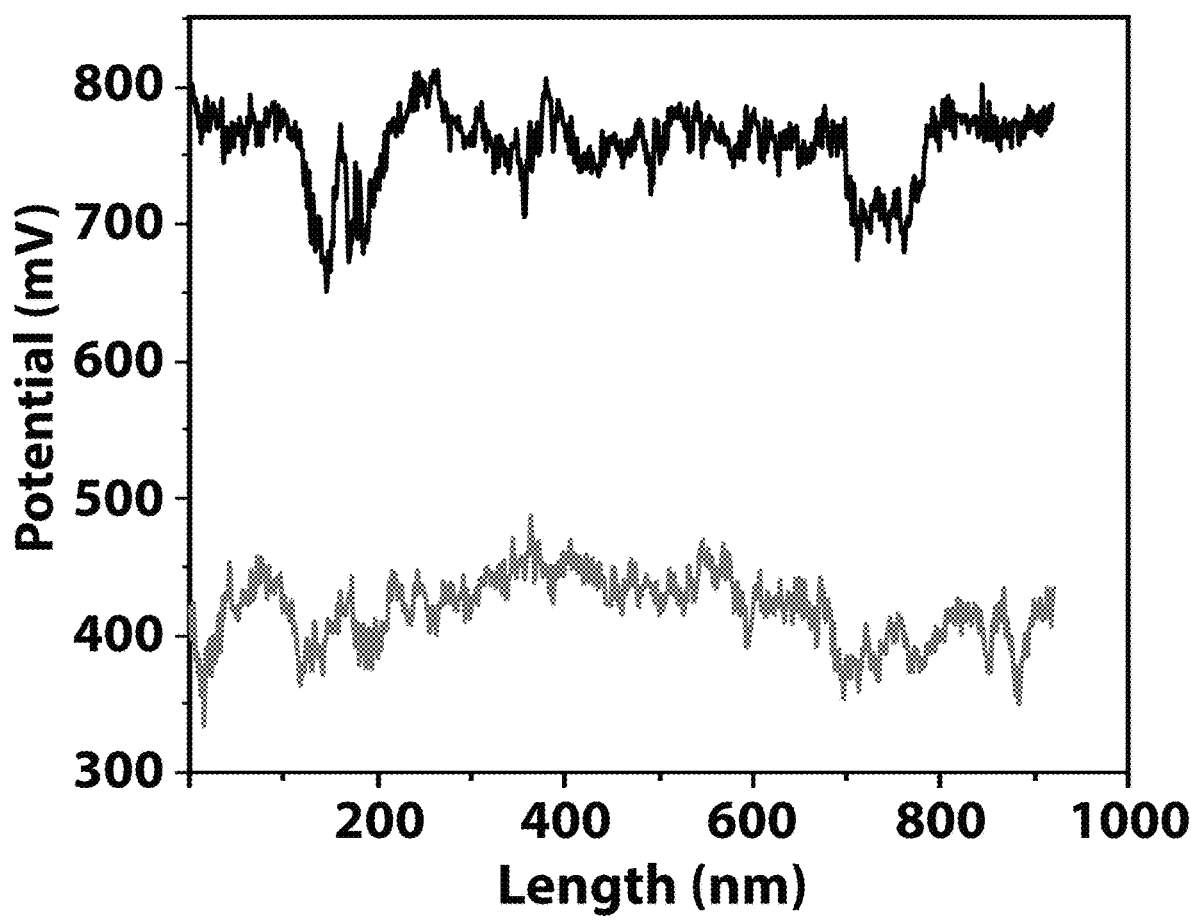
FIG. 6C illustrates line profiles obtained from FIG. 6B, according to some embodiments of the present disclosure. The top, dark trace corresponds to pristine $TiO_2$. The bottom, lighter trace corresponds to $TiO_2$ having a perovskite layer (SSG2) washed with solvent.

However, the corresponding KPFM images of the pristine starting $TiO_2$ surface compared to the $TiO_2$ having perovskite layers first deposited by the SSG method described herein, followed by removal of the perovskite layers by treating with pure solvent, corresponding the left and right panels of FIG. 6B, show that there is a substantial difference in the surface potential between these two $TiO_2$ surfaces. A significant decrease of the KPFM potential value was observed after the perovskite precursor coating/washing process. The line scans in the AFM images were compared with the KPFM results, taking the morphology along with the coincident profiles of the potential, to quantitatively evaluate the potential change. FIG. 6C shows that the mean of potential profile changes from ~800 mV to ~400 mV between the two $TiO_2$ samples, with some degree of fluctuation. To map the inhomogeneity of the potential change, the right panel of FIG. 6B was subtracted from the left panel of FIG. 6B to generate FIG. 6D. Note that due to drift during measurement, the images of FIG. 6B were not exactly the same for the same location.

Figure 6D:
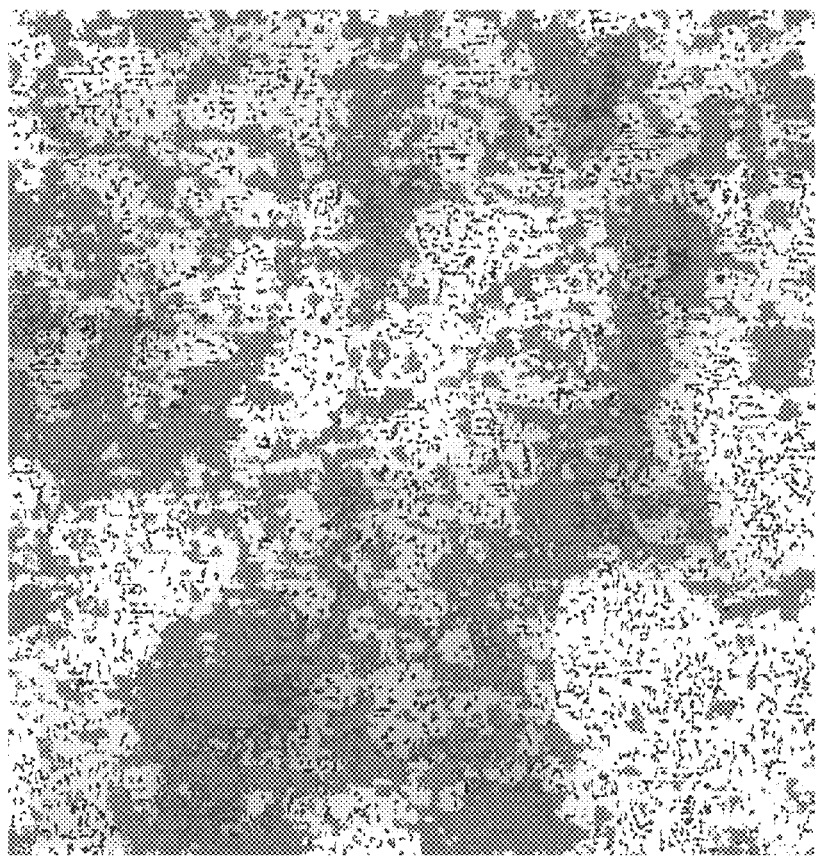
FIG. 6D illustrates the result of subtracting the traces shown in FIG. 6B, the right image subtracted from the left image, according to some embodiments of the present disclosure.
Figure 7A:
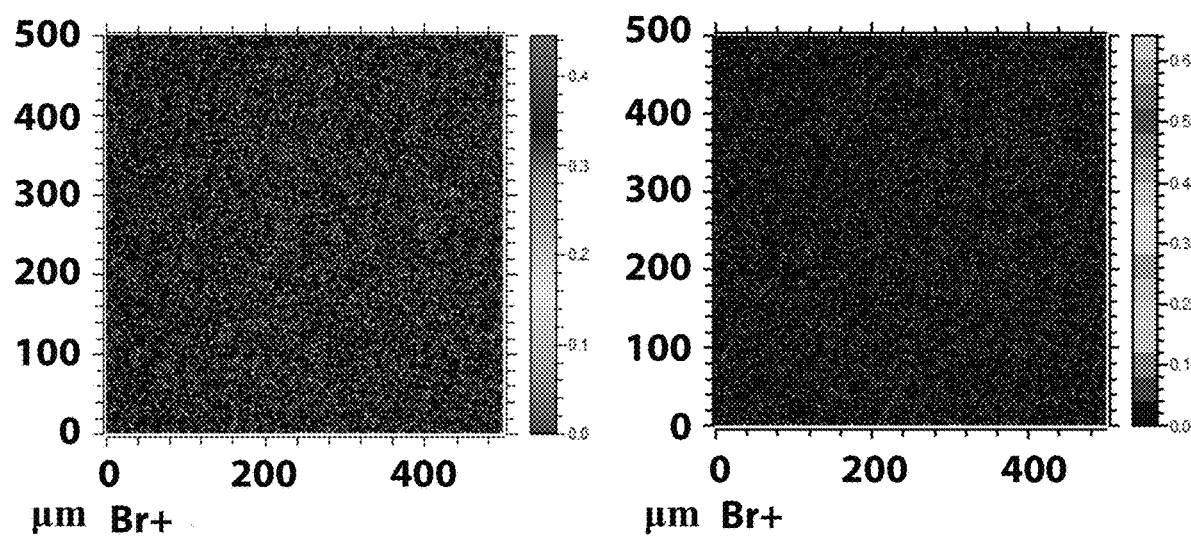
FIGS. 7A-D illustrates time-of-flight secondary-ion mass spectrometry (TOF-SIMS) 2D images of selected element distribution (Br, Pb, Cs, and Ti, FIGS. 7A-D respectively) in (left) a clean substrate and (right) after standard perovskite deposition followed by washing with DMSO/DMF, according to some embodiments of the present disclosure. The color bar next to each image shows the intensity scale in counts/pixel, which is unique for each image.
Figure 7B:
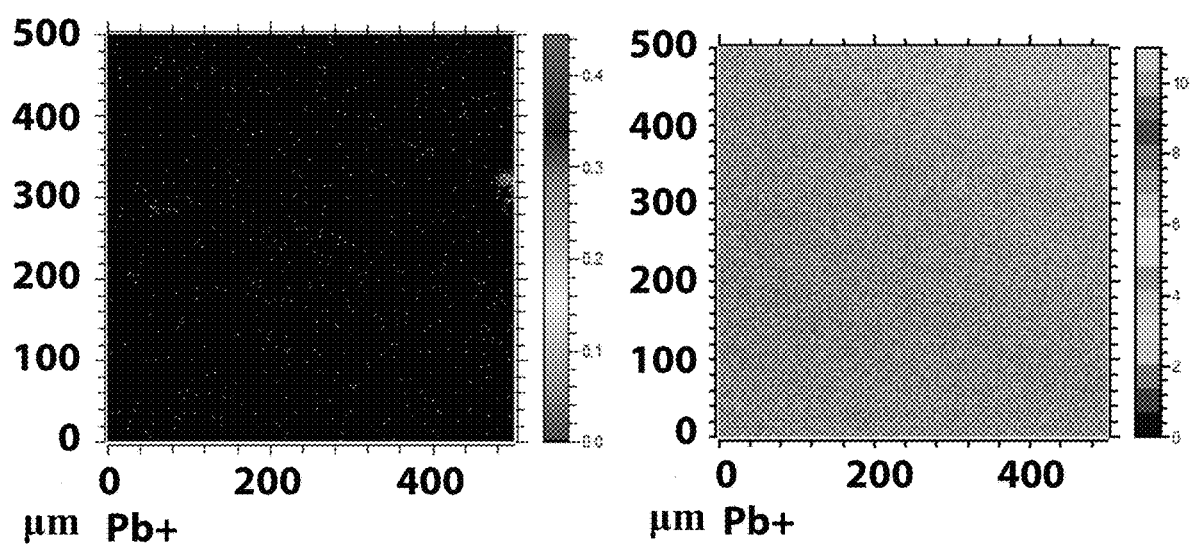
Figure 7C:
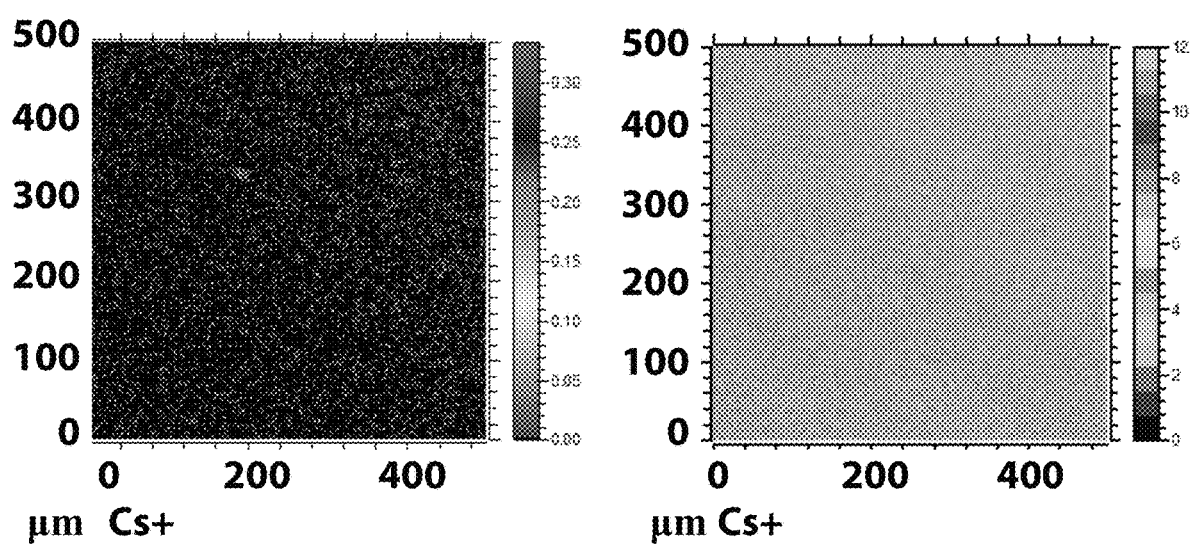
Figure 7D:
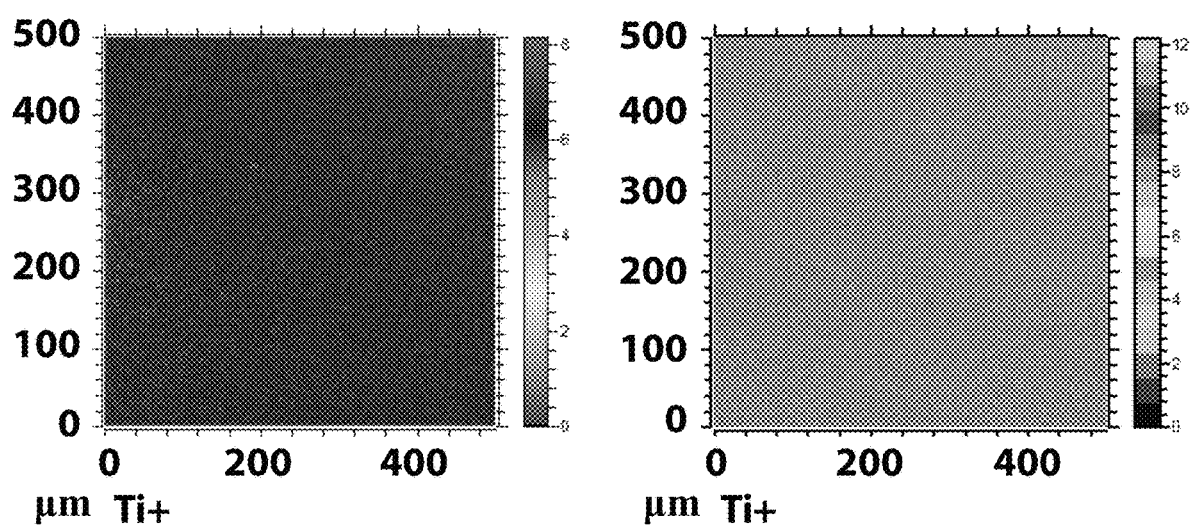

To compensate for this drift, matching sub-sections were selected from the images and the potential subtracted within these images, pixel by pixel; the selected regions are marked by the dashed-line rectangles in the images of FIGS. 6A and 6B. In FIG. 6D, the grayscale image shows the nonuniformity of the potential change, where the background represents a potential value of ~300 mV and the darker shading represents higher potential values. The KPFM tip used was Pt-Ir-coated and the tip work function was ~5.1 eV. KPFM measures the contact potential difference between the tip and sample, and the sample surface work function is obtained from the tip work function subtracting the measured potential value. So, the work function of pristine $TiO_2$ was between about 4.3 eV and 4.4 eV. In contrast, the work function of the washed SSG2 sample was between about 4.6 eV and 4.7 eV. The increase of work function indicates that some perovskite material was left over on the $TiO_2$ surface (although the AFM topography did not change), which may be hypothesized to provide seeds for subsequent perovskite crystallization-hence the use herein of the term "self-seeding". Time-of-flight secondary-ion mass spectrometry (TOF-SIMS) was also performed to identify the distribution of elements in the washed SSG2 sample on FTO/compact-$TiO_2$/mesoporous-$TiO_2$ substrates. FIGS. 7A-7D provide clear evidence of residual Pb, Br, and Cs left on the $TiO_2$ substrate, even after solvent washing, which is consistent with the KPFM results.

Figure 8A:
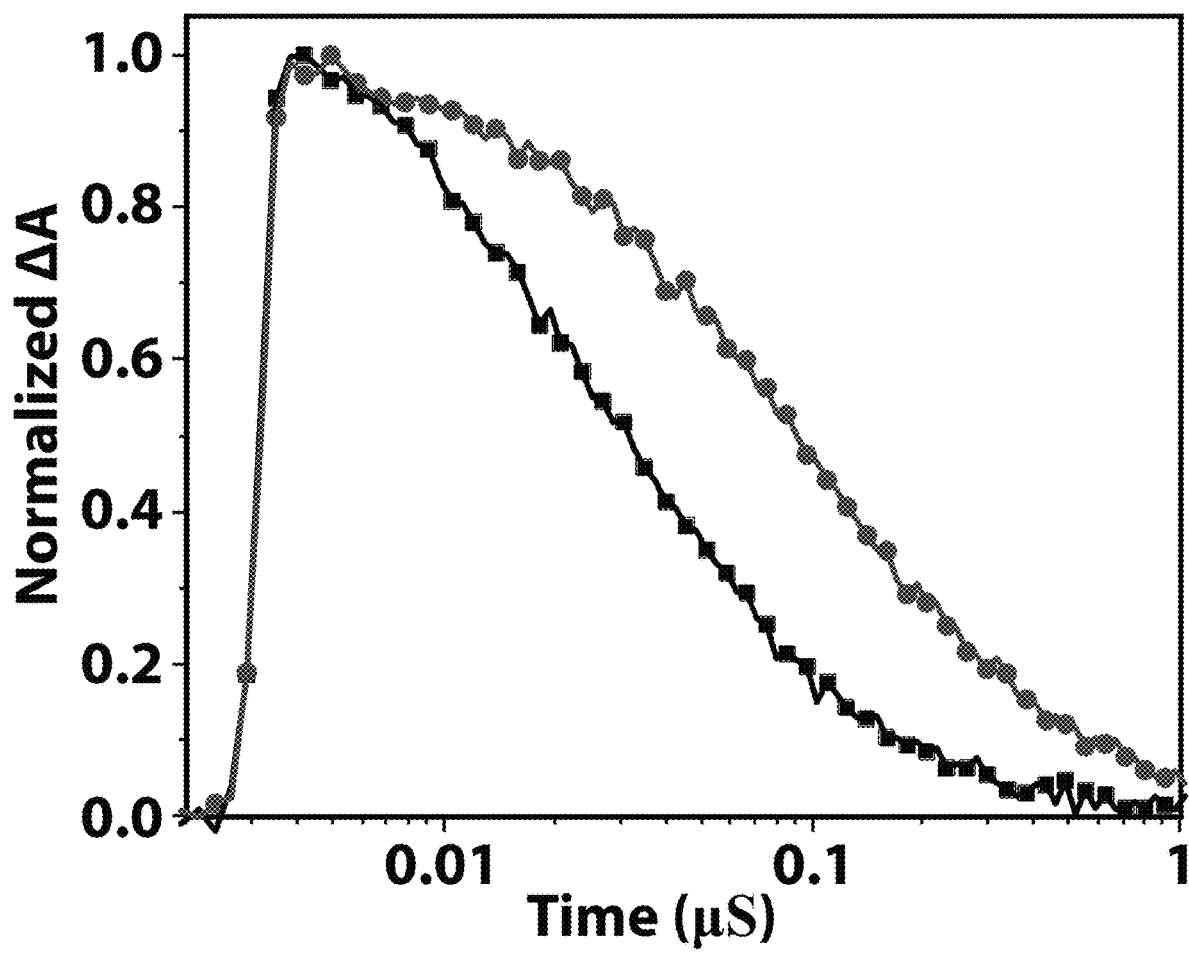
FIG. 8A illustrates a comparison of the normalized transient absorption kinetics at the center of the ground-state bleach measured for a perovskite film made by the control method (data set with circle symbols) and a perovskite thin film made by the SSG method described herein (data set with square symbols), according to some embodiments of the present disclosure.
Figure 9A:
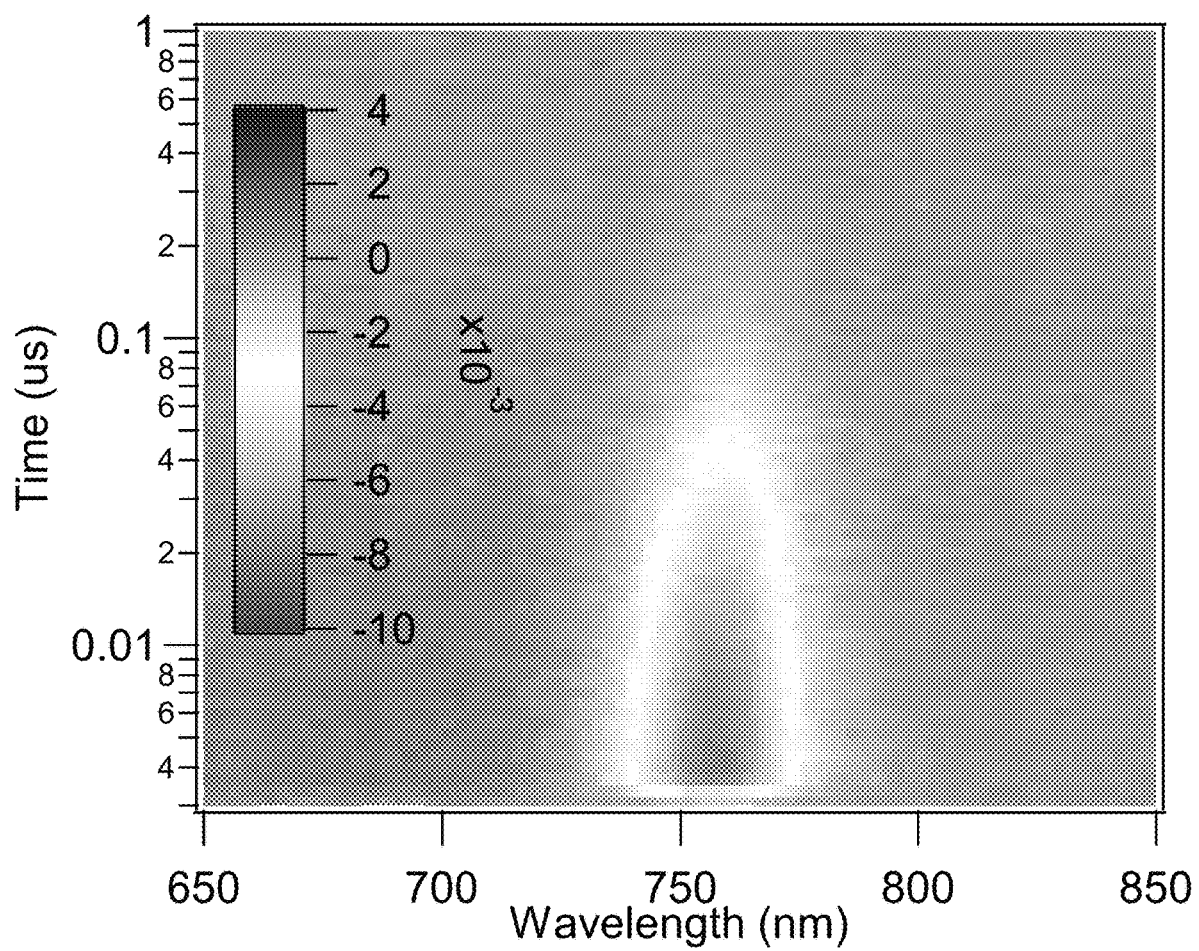
FIGS. 9A-9E illustrate grayscale images of transient absorption measurement of the control and various SSG perovskite thin films (on glass substrates) pumped at 520 nm, according to some embodiments of the present disclosure. Intensities of lighter shades and darker shades in the grayscale images represent the magnitude of the ground-state bleach and induced absorption, respectively.
Figure 9B:
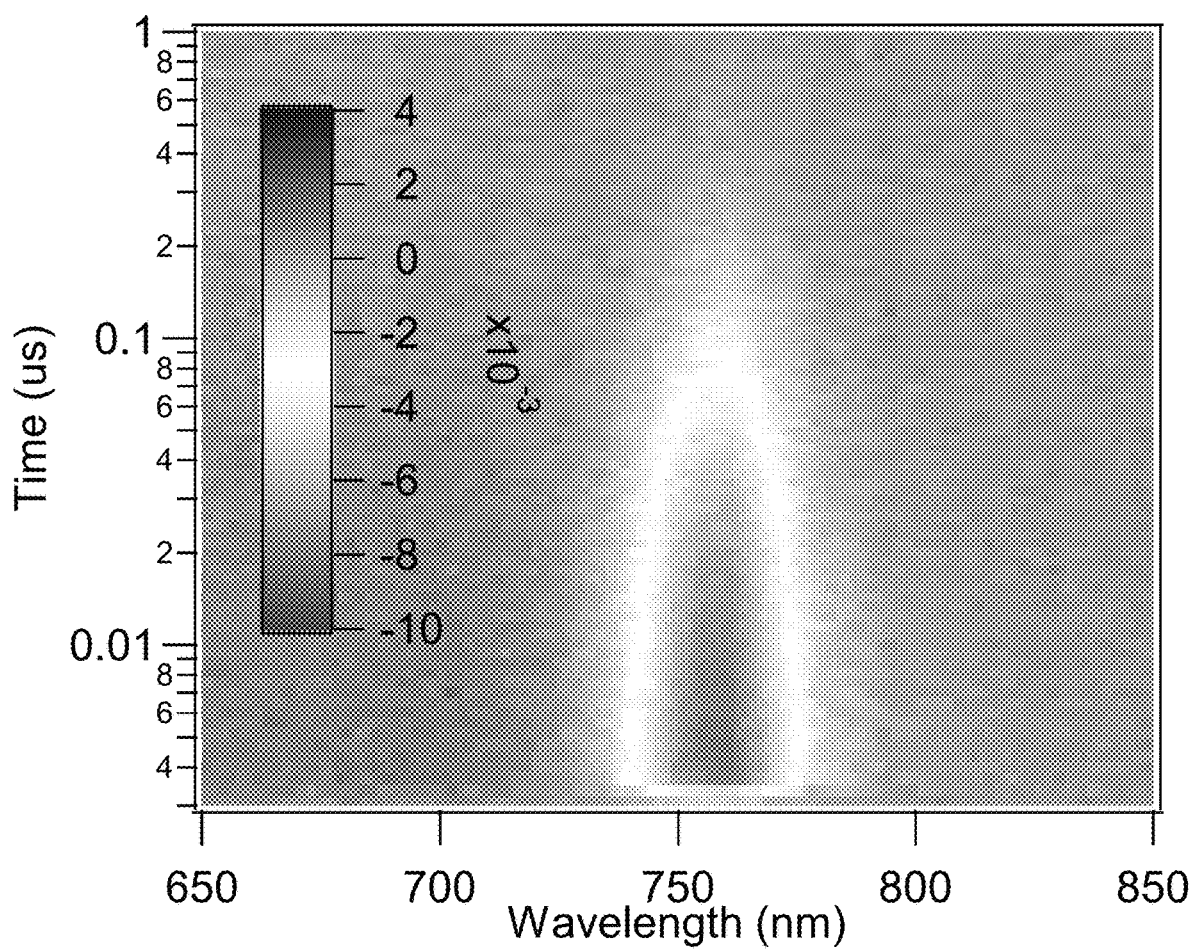
Figure 9C:
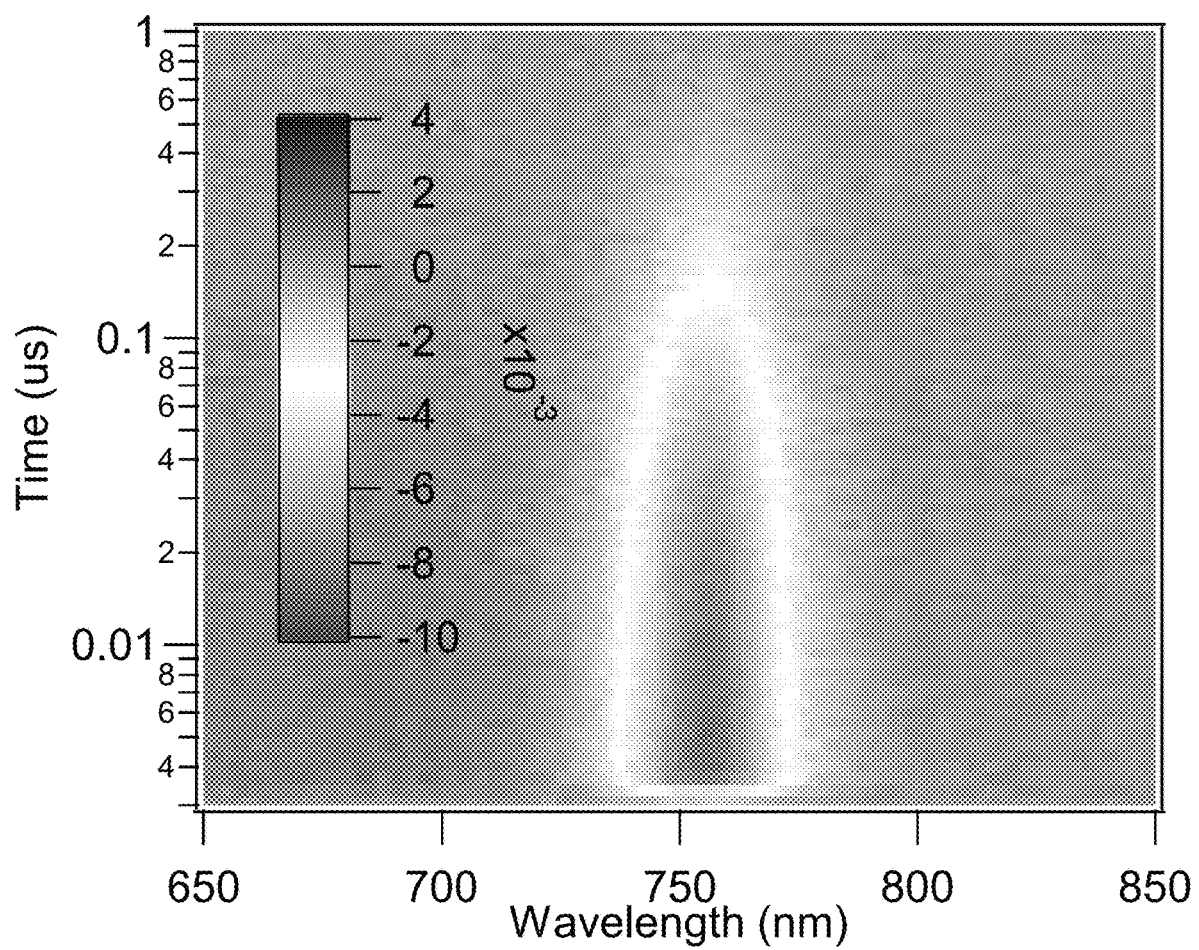
Figure 9D:
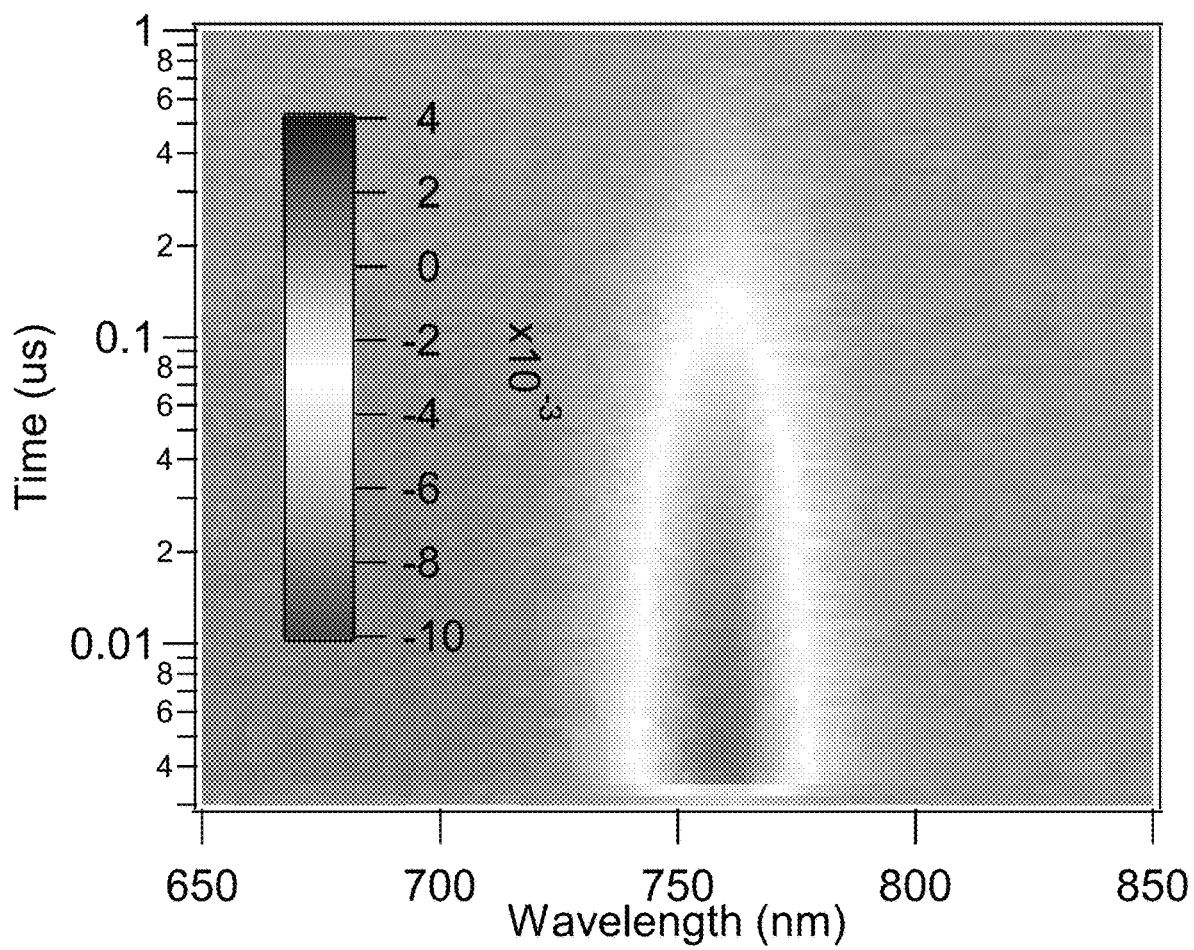
Figure 9E:
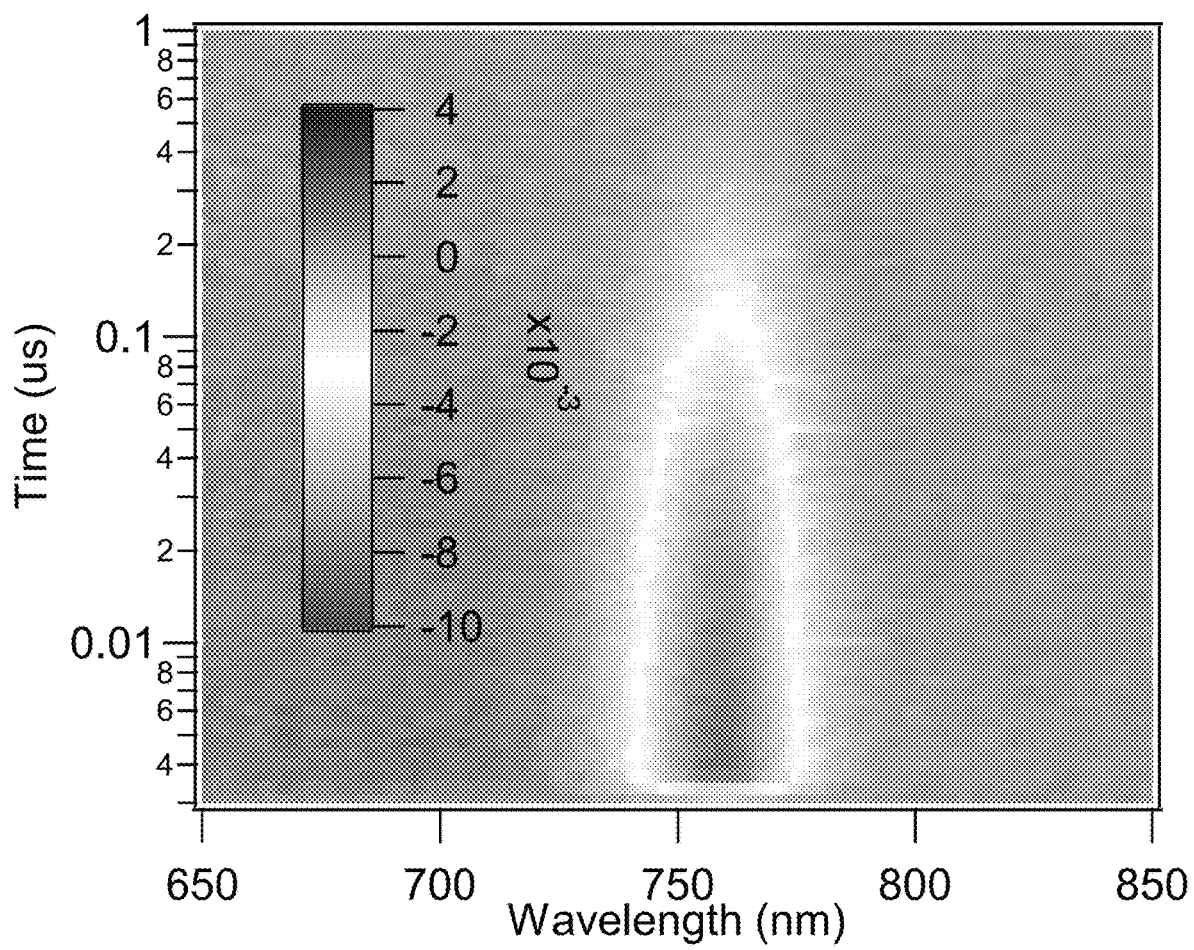

To gain insight into the optoelectronic properties resulting from the self-seeding effect in the perovskite layers, transient absorption (TA) and time-resolved microwave conductivity (TRMC) measurements were performed on these samples. FIG. 8A displays the normalized TA kinetics probed at the center of the ground-state bleach wavelength (~760 nm) after 520-nm excitation and FIGS. 9A and 9C display the grayscale image of the corresponding perovskite layers. To extract the lifetime of charge carriers, the transient kinetics was modeled with a bi-exponential fitting function; the results are shown in Table 1.

TABLE 1

Bi-exponential fitting results of transient absorption decays

| Sample | Lifetime 1 | Lifetime 2 |
|---|---|---|
| Control | 25 ± 1 ns | 163 ± 10 ns |
| SSG 1 | 49 ± 2 ns | 302 ± 30 ns |
| SSG 2 | 83 ± 3 ns | 543 ± 32 ns |
| SSG 3 | 68 ± 3 ns | 385 ± 28 ns |
| SSG 4 | 66 ± 3 ns | 367 ± 28 ns |

Figure 8B:
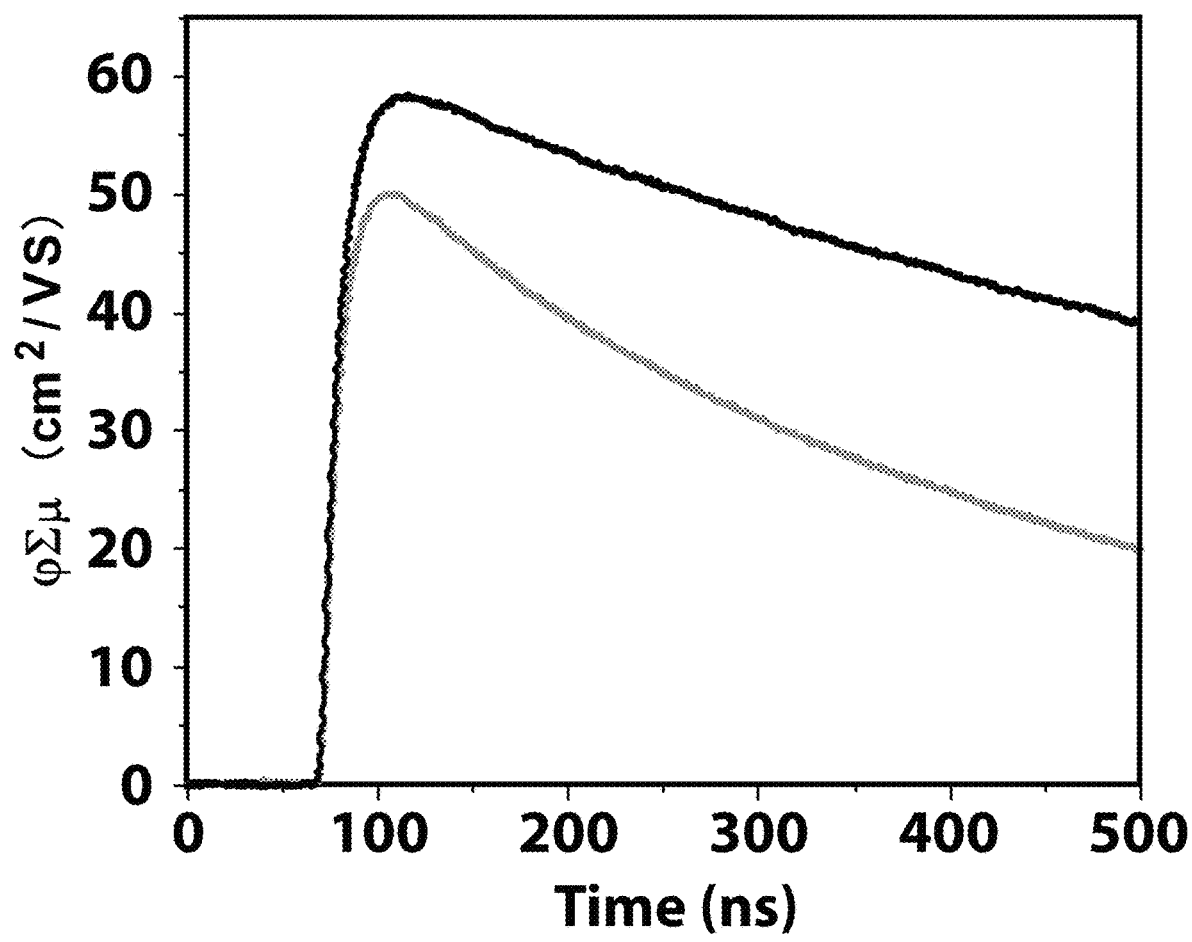
FIG. 8B illustrates a comparison of time-resolved microwave conductivity measurements for a perovskite film made by the control method (dark trace) and a perovskite thin film made by the SSG method described herein (light trace), according to some embodiments of the present disclosure.
Figure 9F:
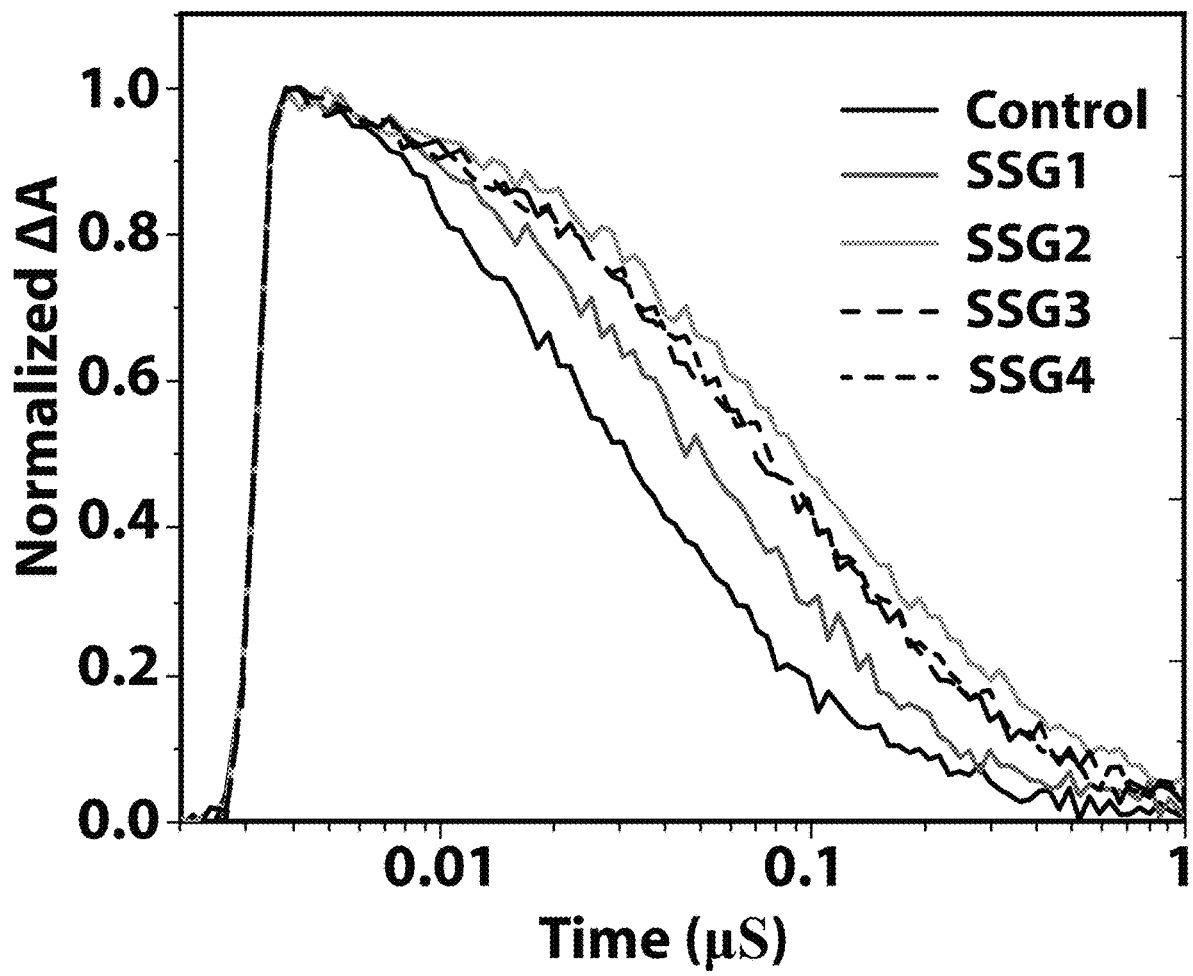
FIG. 9F illustrates the normalized transient absorption kinetics at the center of the ground-state bleach for the perovskite films shown in FIGS. 9A-9E, according to some embodiments of the present disclosure.

Two decay time constants can be obtained for the pristine control layer (i.e. n=1; only a single occurrence of both the applying 220 and forming 230 steps of FIG. 2): the fast component (25 ns) and the slow component (160 ns) from bi-exponential fitting. Irrespective of the origins of the decay kinetics, as a result of the SSG method described herein, the samples exhibited longer decay times for both components. In particular, the SSG2 sample shows a 3× increase in lifetime for both the fast component (83 ns) and slow component (543 ns) as shown in FIG. 9F. The reduced lifetimes of the SSG3 and SSG4 samples is presumably caused by the over-application of DMSO and CB, which may have a negative impact on crystallization. The improved lifetimes demonstrated by the SSG1 and SSG2 samples are consistent with a reduction in defects resulting from an enhancement in crystallinity with a commensurate reduction in the number of grain boundaries, which, in turn, reduces the number of trapped charge carriers. This should slow the recombination of free carriers, representing a longer carrier lifetime, which could account for the increased open-circuit voltages ($V_{oc}$) and fill factors (FF) observed for these samples and described in more detail below (see FIGS. 17A-17D). TRMC decay data are presented in FIG. 8B and FIG. 10 and were fitted to bi-exponential fittings; the average lifetime and mobility values are summarized in Table 2.

TABLE 2

Summary of the average lifetime and mobility by TRMC

| Sample | Lifetime [ns] | Mobility [$cm^2$ $v^{-1}s^{-1}$] |
|---|---|---|
| Control | 411 | 50 |
| SSG 1 | 853 | 52.3 |
| SSG 2 | 969 | 58.4 |
| SSG 3 | 888 | 54.8 |
| SSG 4 | 774 | 51.3 |

Figure 10:
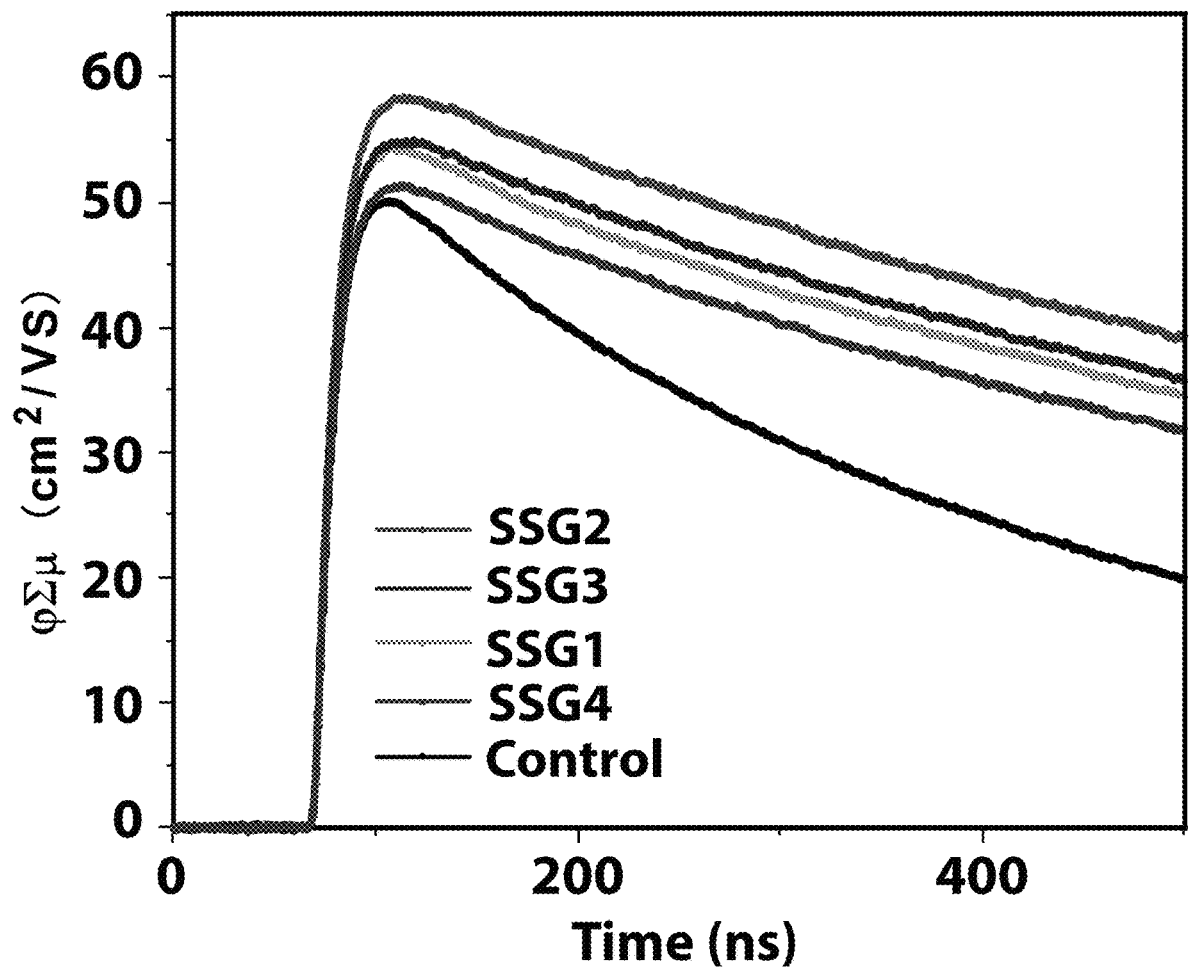
FIG. 10 illustrates photoconductivity ($\phi\Sigma\mu$) transients for various perovskite thin films by time-resolved microwave conductivity characterization, according to some embodiments of the present disclosure. The 640-nm excitation intensity was at about $3\times10^9$ cm$^{-2}$ absorbed photon flux. The legend lists the films in the order that they are traced in the figure from top to bottom.

Similar to the trend observed in TA measurements, TRMC results show that the SSG1 sample showed improvement in both carrier mobility and lifetime (see FIG. 10). The improvement was maximized for the SSG2 sample. For the SSG3 and SSG4 samples, the carrier mobility and lifetime were reduced in comparison to the SSG2 sample but were still better than the control sample. The improved carrier mobility and lifetime further confirm the SSG effect on reducing trap density in perovskite layers, which again is consistent with the higher $V_{oc}$, short-circuit current density (Jsc), and FF of the corresponding PSCs (see FIGS. 17A-17D).

Figure 8C:
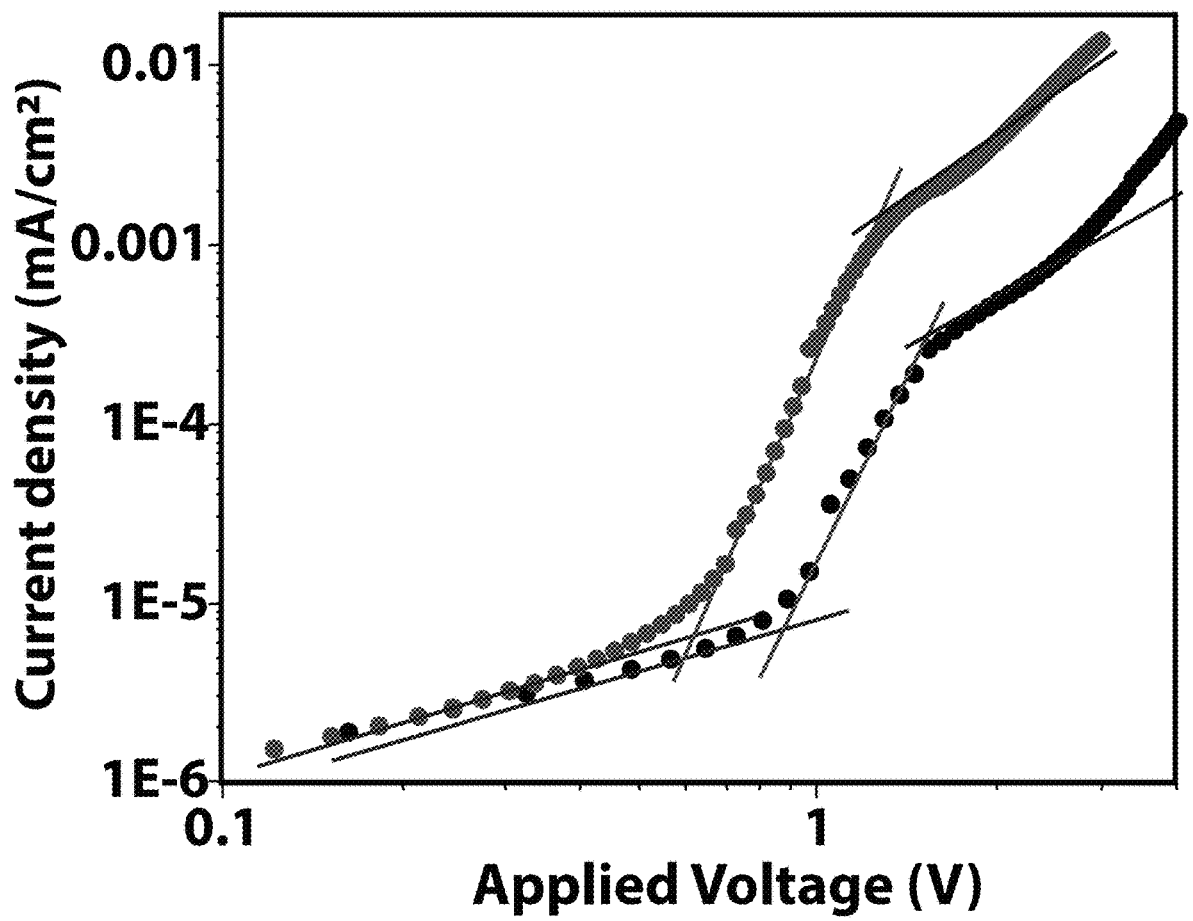
FIG. 8C illustrates a comparison of space-charge-limited current measurements for a perovskite film made by the control method (top data set) and a perovskite thin film made by the SSG method described herein (bottom data set), according to some embodiments of the present disclosure.
Figure 11:
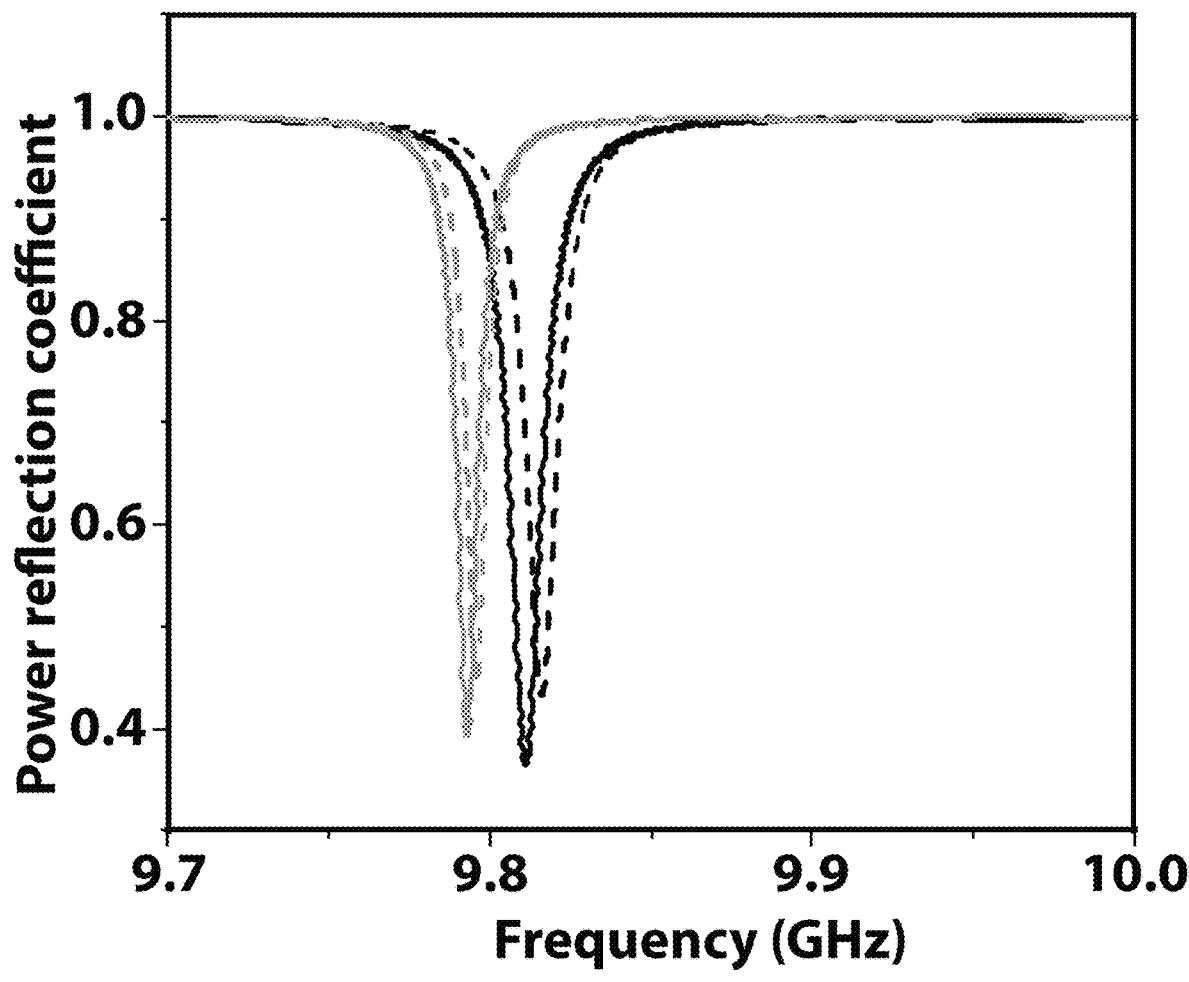
FIG. 11 illustrates power reflection coefficient versus frequency for the control and SSG2 perovskite thin films by dark microwave conductivity (DMC) measurement, according to some embodiments of the present disclosure. The DMC (also referred to as steady-state microwave absorption) measurements were carried out to quantify the dark carrier density for perovskite thin-film samples. Black lines correspond to the control. Lighter lines to SSG2.

To assess the impact of the SSG method on trap density, space-charge-limited current (SCLC) measurements of the corresponding perovskite layers were made. The current-voltage (I-V) characteristics of the control device and the device resulting from the SSG2 sample are shown in FIG. 8C. The trap-state density ($N_t$) was calculated using the trap-filled-limit voltage equation $N_t=2\varepsilon\varepsilon_0 V_{TFL}/qd^2$ according to a previous report. The trap density of the SSG2 perovskite layer (~1.4×10$^{16}$ cm$^{-3}$) was substantially lower than the control (~2.1×10$^{16}$ cm$^{-3}$), which is consistent with the TA and TRMC results as well as the higher $V_{oc}$ and FF demonstrated by the resultant solar cells made from these materials. This was also confirmed by a reduced dark carrier density as measured by dark microwave conductivity for pristine control perovskite layer ($n_d$=9.7×10$^{15}$ cm$^{-3}$) in comparison to the SSG2 perovskite sample ($n_d$=6.0×10$^{15}$ cm$^{-3}$), as shown in FIG. 11. Thus, the combination of these measurements then provides a clear indication of a reduced trap density after use of the SSG method. Dark lines correspond to the control perovskite on quartz (solid line) and the quartz onto which it was deposited (dashed line). Lighter lines correspond to the SSG2 perovskite on quartz (solid line) and the quartz onto which it was deposited (dashed line).

Figure 8D:
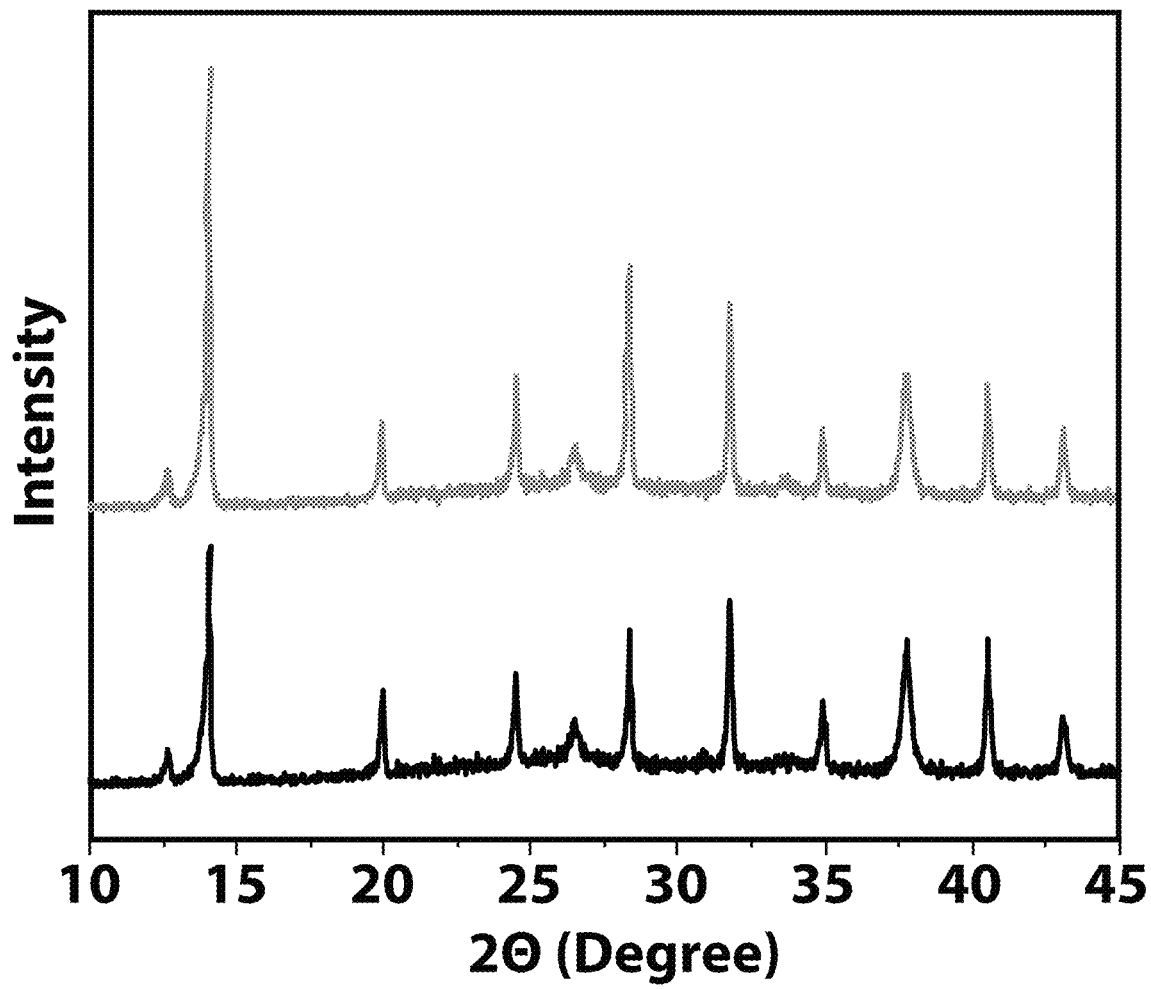
FIG. 8D illustrates a comparison of X-ray diffraction patterns for a perovskite film made by the control method (bottom data set) and a perovskite thin film made by the SSG method described herein (top data set), according to some embodiments of the present disclosure.

X-ray diffraction (XRD) measurements were performed to study the crystalline structure of perovskite layers on FTO/compact-$TiO_2$/mesoporous-$TiO_2$ substrates (see FIG. 8D). The XRD patterns exhibited similar, strong, and sharp perovskite characteristic peaks. The intensity of the SSG2 perovskite layer at the (110) peak (14.02°) becomes stronger and the full width at half maximum (FWHM, 0.21°) is decreased when compared with the control perovskite layer (0.27°), which also suggests that the SSG method can improve the crystallization of the perovskite and/or provide a more-preferred perovskite crystal (110) orientation. The improved crystallization process may be attributed to the self-seeding effect of SSG method on the crystal growth.

Figure 12:
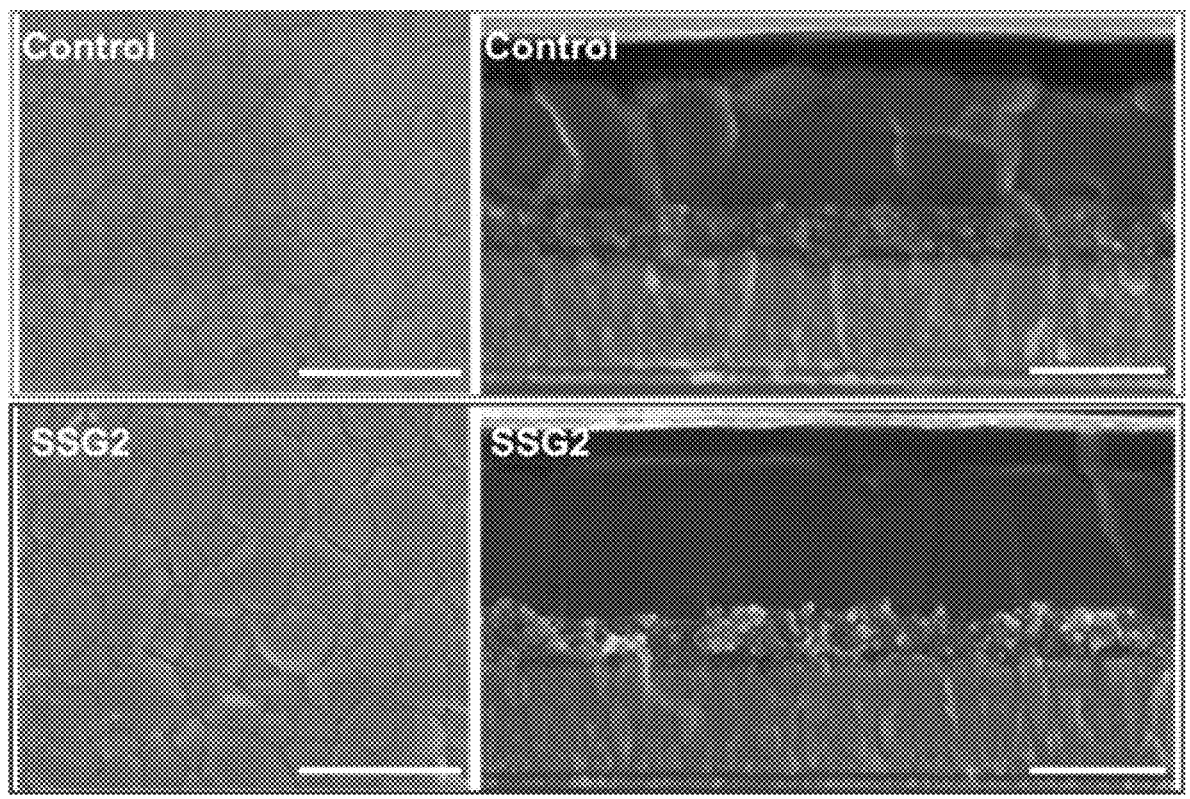
FIG. 12 illustrates perovskite film morphologies by scanning electron microscopy, according to some embodiments of the present disclosure. Top view (left; scale bar: 1 µm) and cross-sectional view (right; scale bar: 500 nm) of the control and SSG2 perovskite thin films and devices. These show the various device stack layers, starting from the top: gold contact, spiro-OMeTAD HTL, perovskite layer, mesoporous TiO$_2$, compact TiO$_2$, FTO layer.
Figure 13:
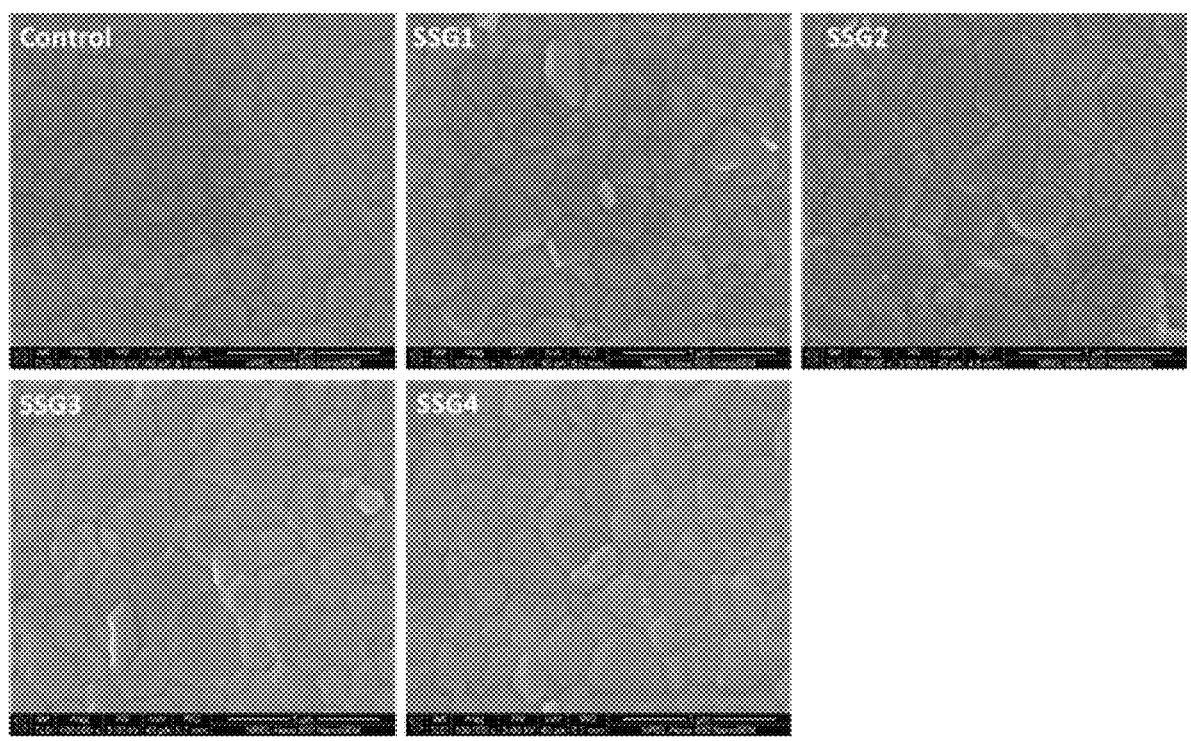
FIG. 13 illustrates top-view scanning electron microscopy (SEM) images of the control and SSG perovskite thin films after heating treatment, according to some embodiments of the present disclosure. These films were deposited on FTO/compact TiO$_2$/mesoporous TiO$_2$ substrates.
Figure 14A:
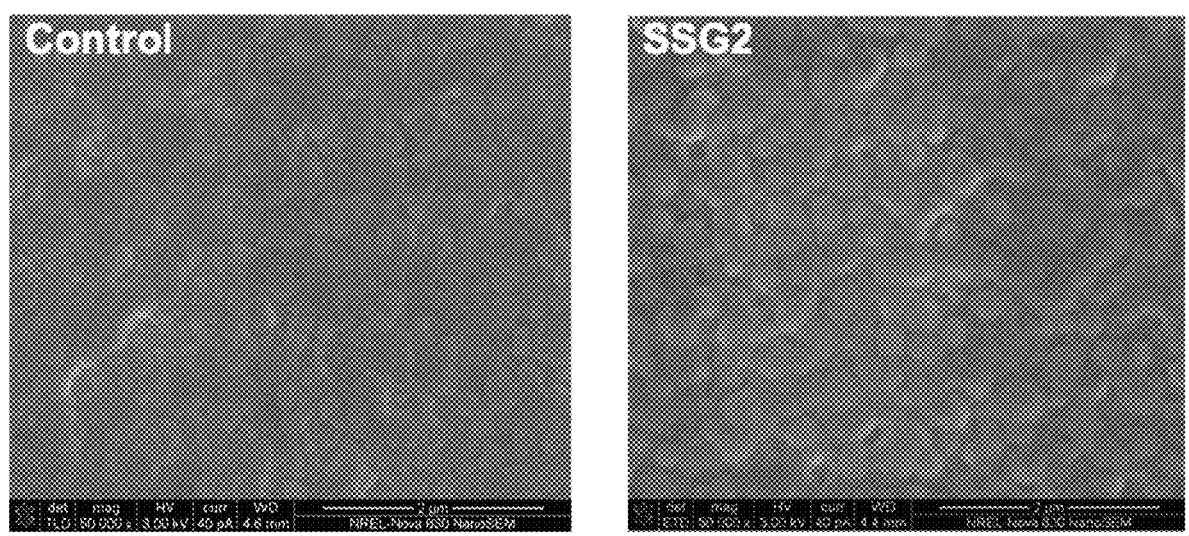
FIG. 14A illustrates SEM images of the control and SSG2 perovskite thin films without heating, according to some embodiments of the present disclosure. These films were deposited on FTO/compact TiO$_2$/mesoporous TiO$_2$ substrates.
Figure 14B:
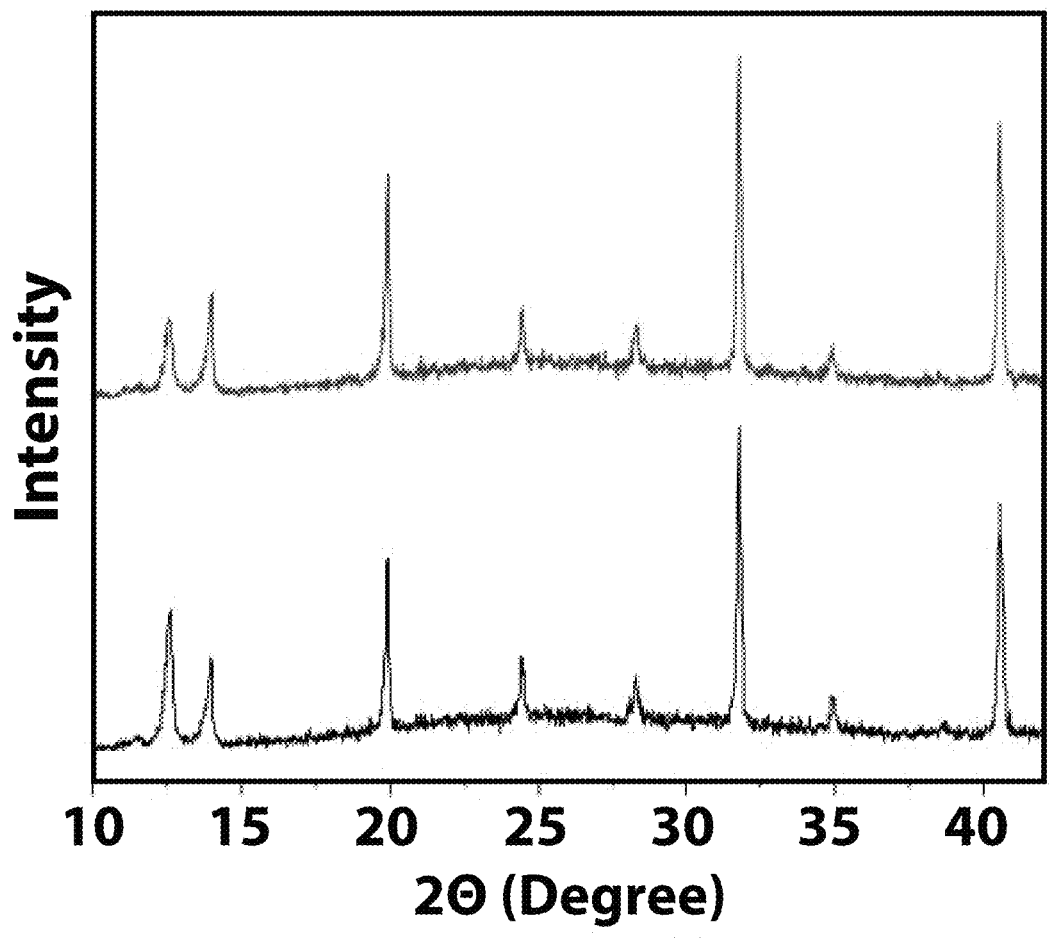
FIG. 14B illustrates XRD patterns of the control (bottom trace) and SSG2 perovskite thin films (top trace) without heating, according to some embodiments of the present disclosure. These films were deposited on FTO/compact TiO$_2$/mesoporous TiO$_2$ substrates.
Figure 15A:
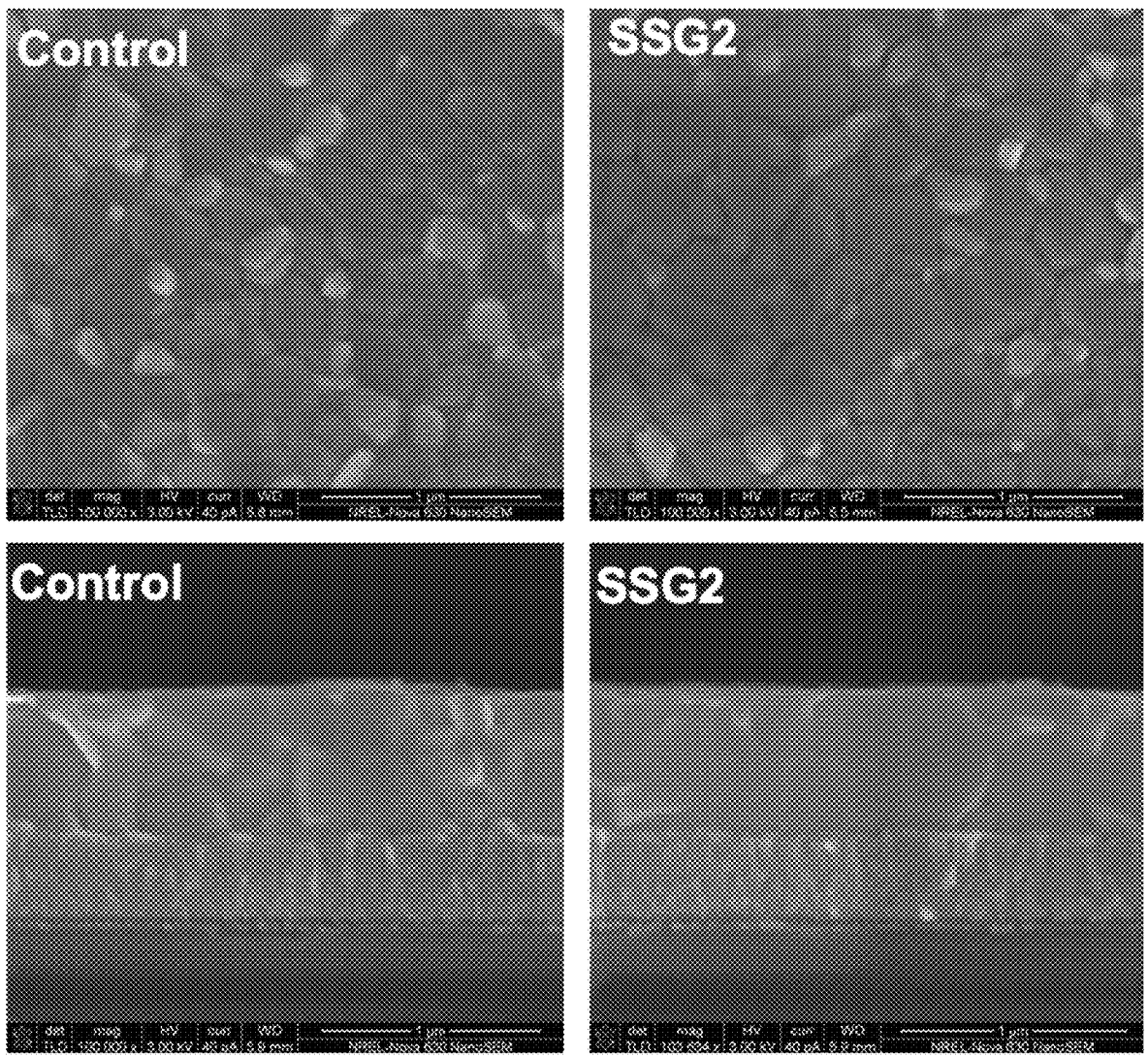
FIG. 15A illustrates top views and cross-sectional SEM images of the control and SSG2 perovskite thin films with heating, according to some embodiments of the present disclosure. These films were deposited on SnO$_2$/FTO/glass substrates.
Figure 15B:
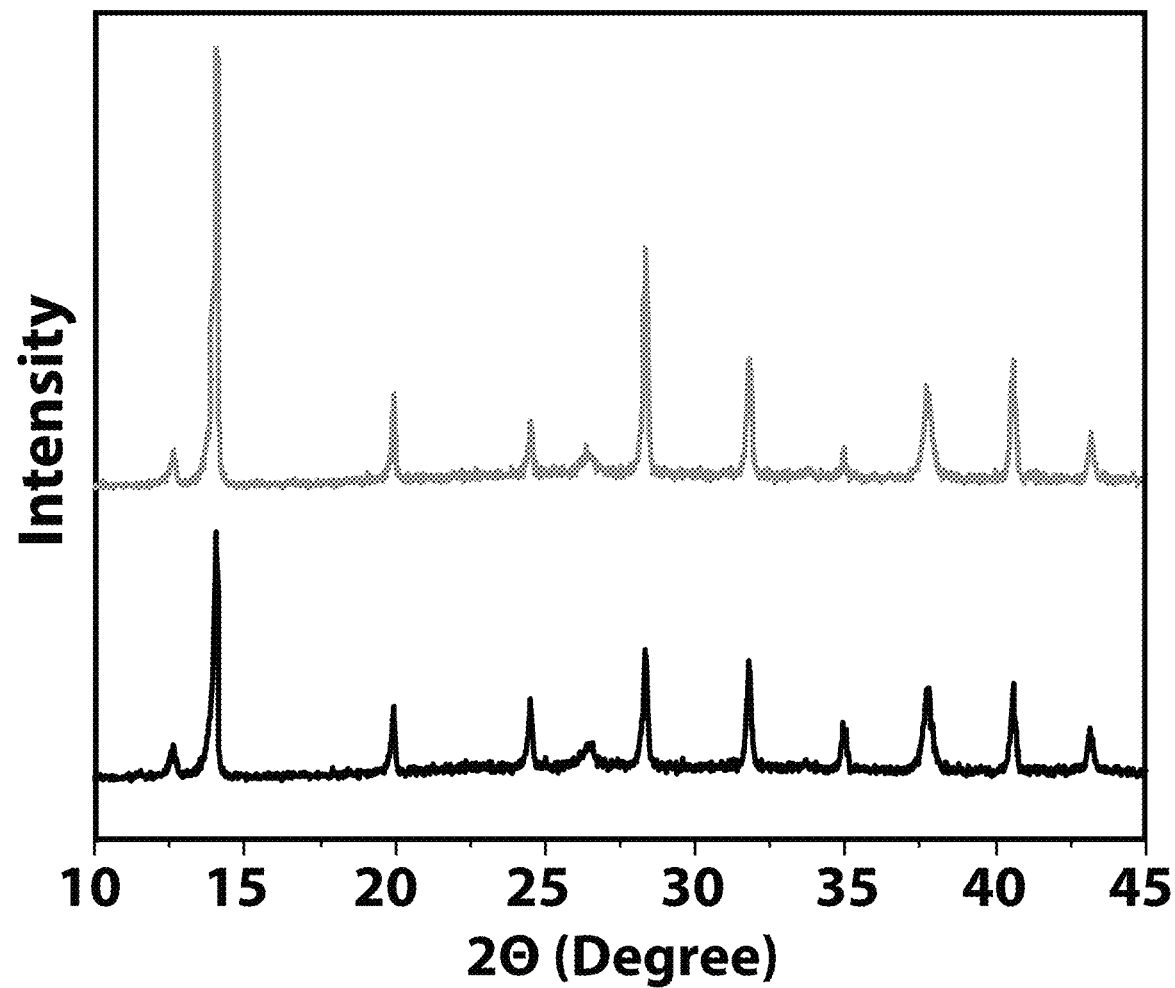
FIG. 15B illustrates XRD patterns of the control (bottom trace) and SSG2 perovskite thin films (top trace) with heating, according to some embodiments of the present disclosure. These films were deposited on SnO$_2$/FTO/glass substrates.
Figure 16A:
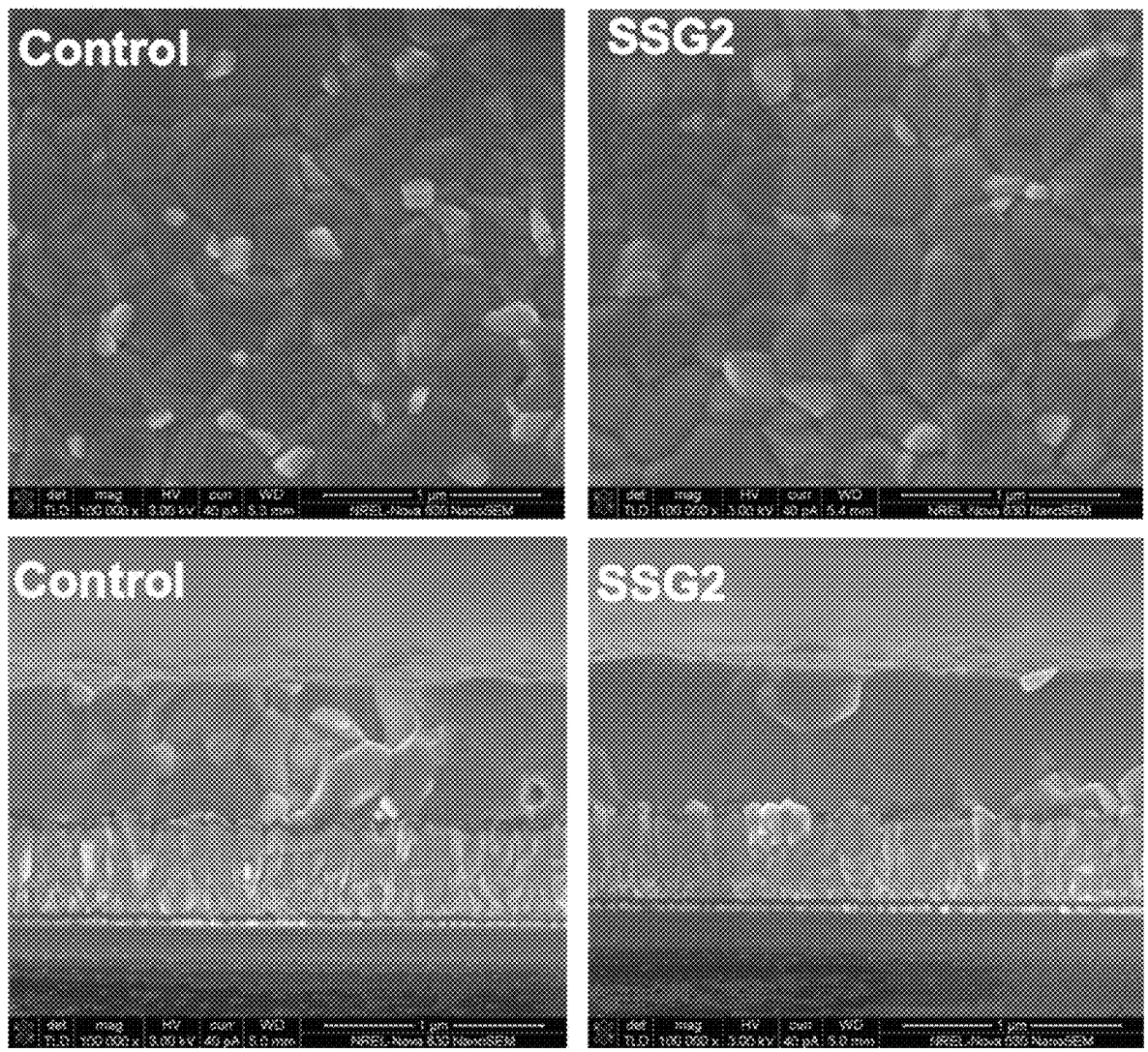
FIG. 16A illustrates top-views and cross-sectional SEM images of the control and SSG2 perovskite thin films with heating, according to some embodiments of the present disclosure. These films were deposited on compact-TiO$_2$/FTO/glass substrates.
Figure 16B:
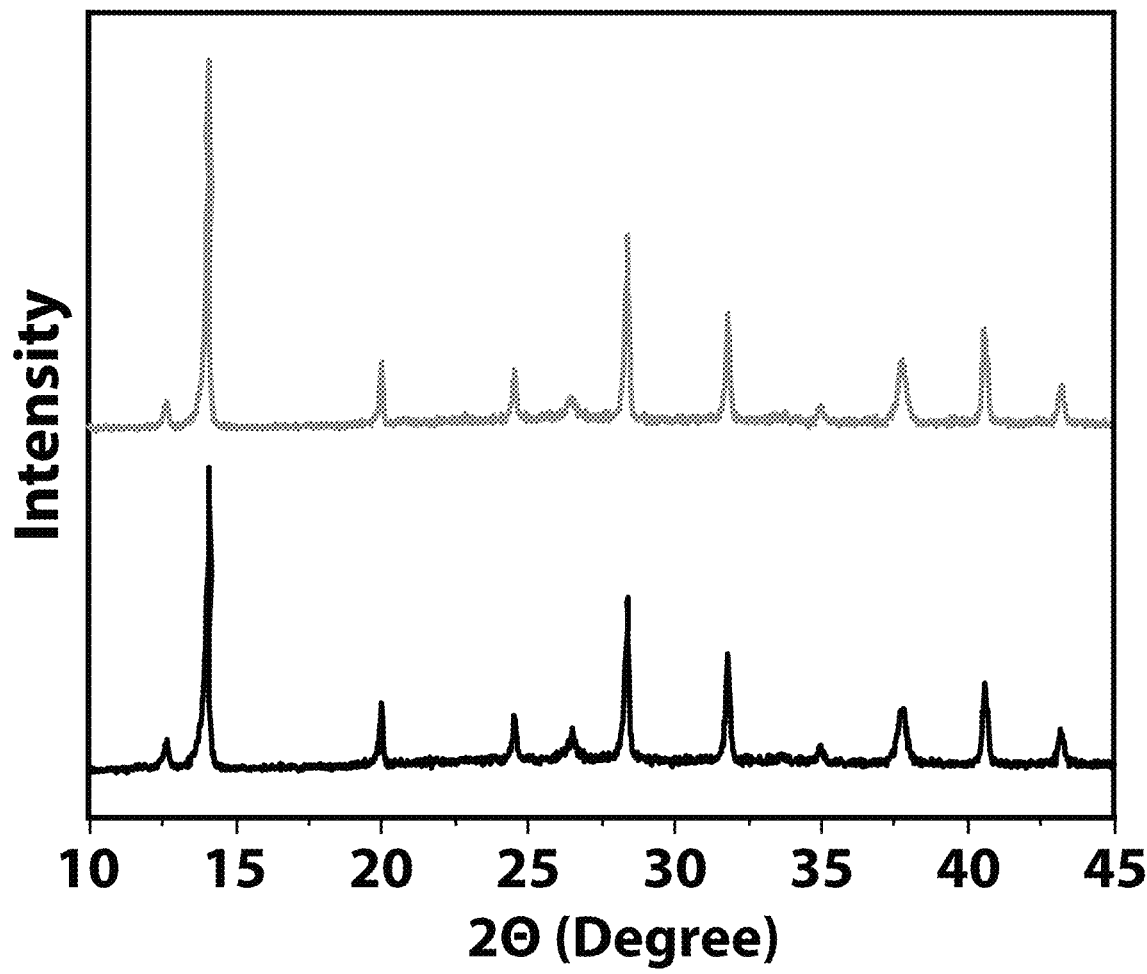
FIG. 16B illustrates XRD patterns of the control (bottom trace) and SSG2 perovskite thin films (top trace) with heating, according to some embodiments of the present disclosure. These films were deposited on compact-TiO$_2$/FTO/glass substrates.

The high-quality crystallization as one of the main factors for improved device performance. Scanning electron microscopy (SEM) images of the corresponding perovskite layers deposited on FTO substrate are presented in FIG. 12 and FIG. 13. As illustrated from the top-view SEM, the change in morphology is consistent with an increase in the homogeneity of the active layer in cross-section view and an increase of the apparent grain size from the top view for the SSG perovskite layer. There are few inhomogeneities in the SSG cross-section, which are from grain boundaries (GBs); most of these GBs exhibit a perpendicular orientation to the substrate. The SEM and XRD of the perovskite layers without heating were compared. FIG. 14A shows that the SSG2 sample also presents larger grain size and greater crystallinity than the control sample without heating, which is consistent with the result for perovskite layers prepared with heating. To check whether the SSG process depends on the type of substrate, the SEM and XRD of samples deposited on FTO/compact-$TiO_2$ and FTO/$SnO_2$ nanoparticle substrates were compared. FIGS. 15A, 15B, 16A, and 16B show that the SSG2 samples also have larger apparent grain size, fewer GBs, and greater crystallinity than the control samples for both substrates; this indicates that the SSG process is a promising general approach for various types of substrates.

Figure 17A:
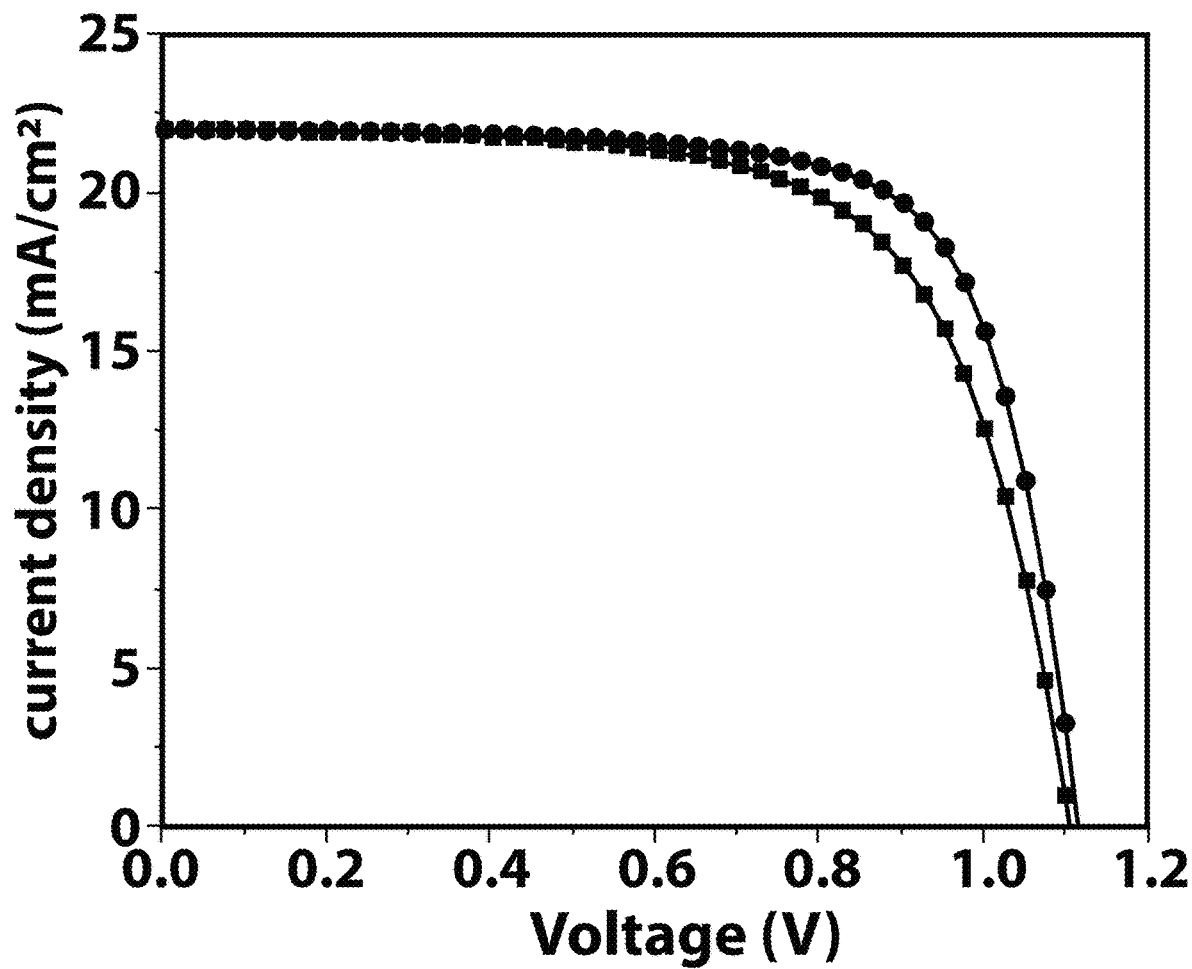
FIG. 17A illustrates photocurrent density-voltage curves of perovskite solar cells based on the control film, according to some embodiments of the present disclosure. Both backward-scan (circle symbols) and forward-scan curves (square symbols) were measured with a bias step of 10 mV and delay time of 0.1 seconds.
Figure 17B:
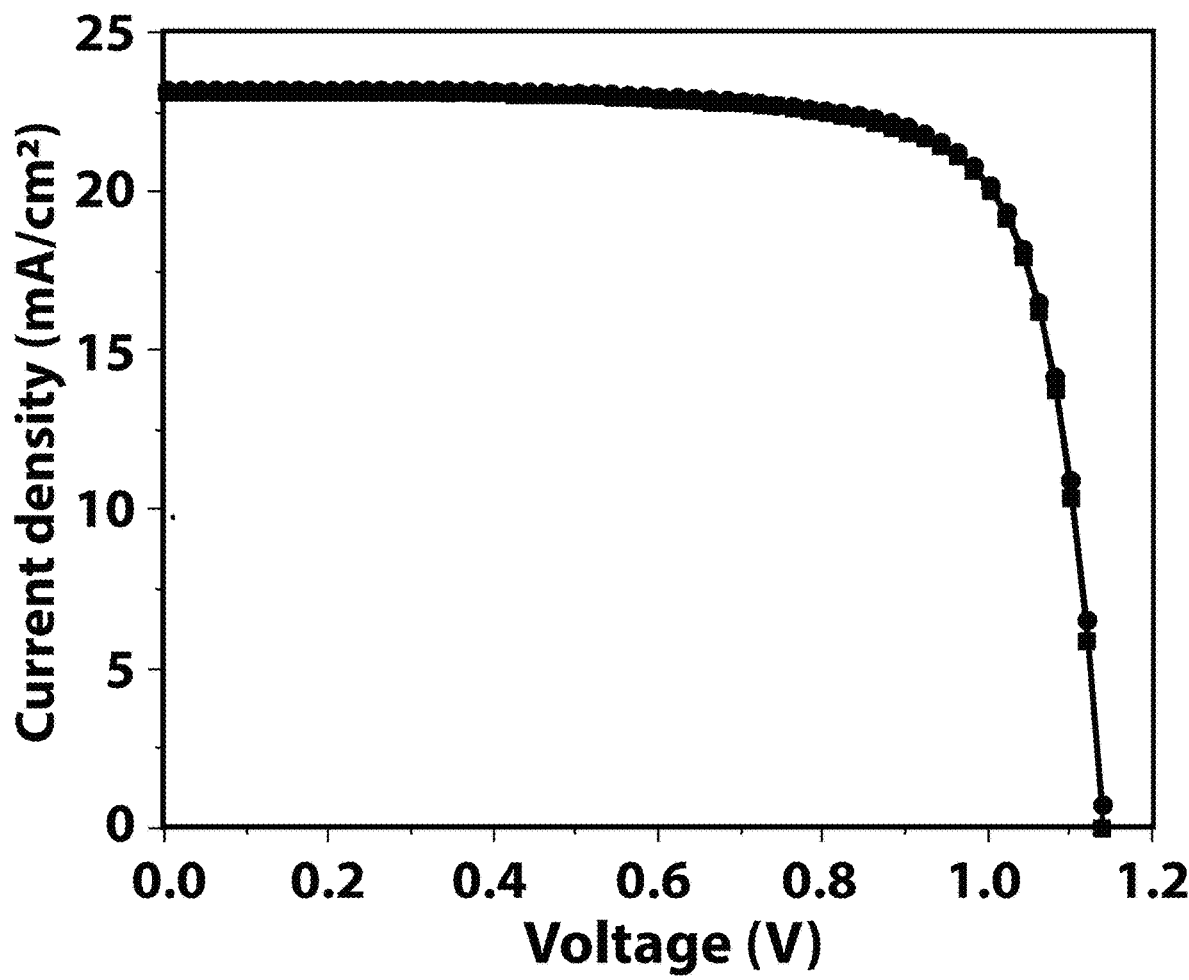
FIG. 17B illustrates photocurrent density-voltage curves of perovskite solar cells based on SSG2 perovskite thin films, according to some embodiments of the present disclosure. Both backward-scan (circle symbols) and forward-scan curves (square symbols) were measured with a bias step of 10 mV and delay time of 0.1 seconds.

The cell architecture in this study utilized a mesoporous structure with a full device stack defined by: Au/spiro-OMeTAD/perovskite/mesoporous-$TiO_2$/compact-$TiO_2$/FTO/glass. The typical photocurrent density-voltage (J-V) curves of the control and SSG2 PSCs under AM 1.5 G illumination with the light intensity of 100 mW $cm^{-2}$ are shown in FIGS. 17A and 17B with a full comparison of the current-voltage curves for each of the SSG1-4 PSCs shown in FIGS. 18A-18E; all the corresponding photovoltaic parameters are summarized in Table 3.

TABLE 3

Performance parameters of corresponding perovskite-based solar cells under different scan directions with a bias step of 10 mV and the delay time of 0.1 seconds.

| Sample | Scan direction | $V_{oc}$ [V] | $J_{sc}$ [mA $cm^{-2}$] | FF | PCE [%] |
|---|---|---|---|---|---|
| Control | backward | 1.12 | 21.98 | 0.72 | 17.76 |
|  | forward | 1.10 | 22.01 | 0.67 | 16.19 |
| SSG1 | backward | 1.13 | 22.79 | 0.74 | 19.06 |
|  | forward | 1.13 | 22.78 | 0.73 | 18.79 |
| SSG2 | backward | 1.14 | 23.12 | 0.77 | 20.30 |
|  | forward | 1.14 | 23.17 | 0.76 | 20.10 |
| SSG3 | backward | 1.13 | 23.29 | 0.75 | 19.74 |
|  | forward | 1.13 | 23.28 | 0.74 | 19.47 |
| SSG4 | backward | 1.12 | 23.35 | 0.72 | 18.83 |
|  | forward | 1.11 | 23.36 | 0.72 | 18.67 |

Figure 17C:
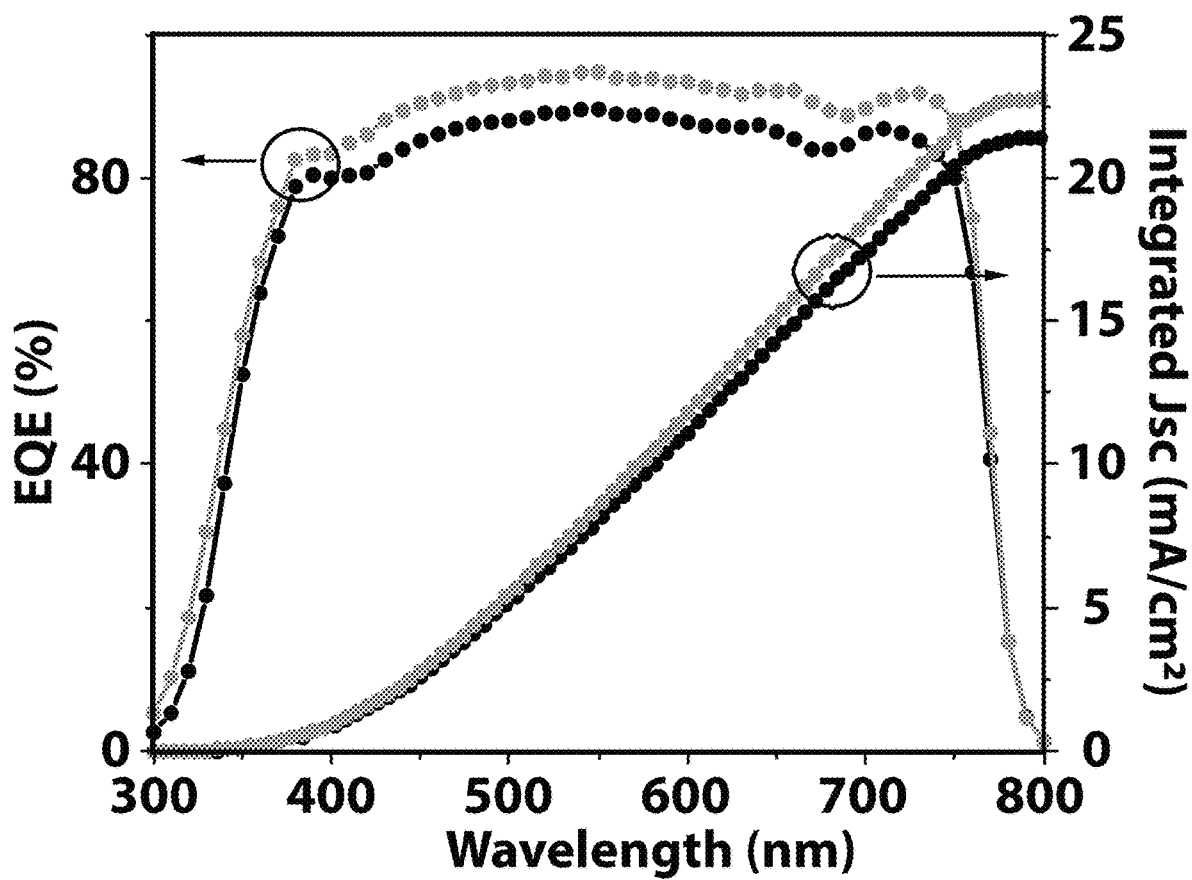
FIG. 17C illustrates external quantum efficiency (EQE) spectra with integrated current curves, according to some embodiments of the present disclosure. The control corresponds to the black traces, the SSG2 film to the lighter traces.
Figure 17D:
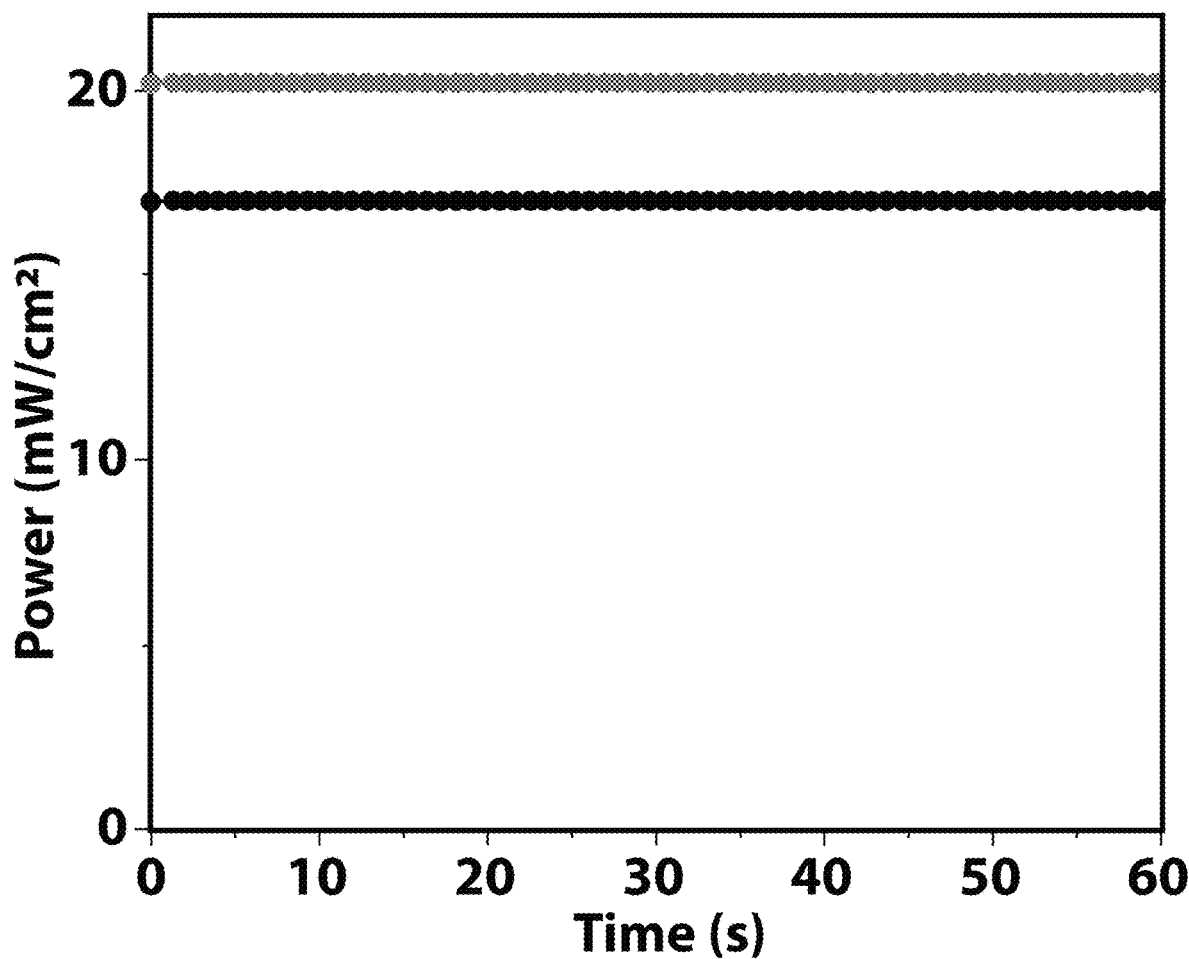
FIG. 17D illustrates stabilized power output (SPO) of the corresponding devices, according to some embodiments of the present disclosure. The control corresponds to the black traces, the SSG2 film to the lighter traces.
Figure 18A:
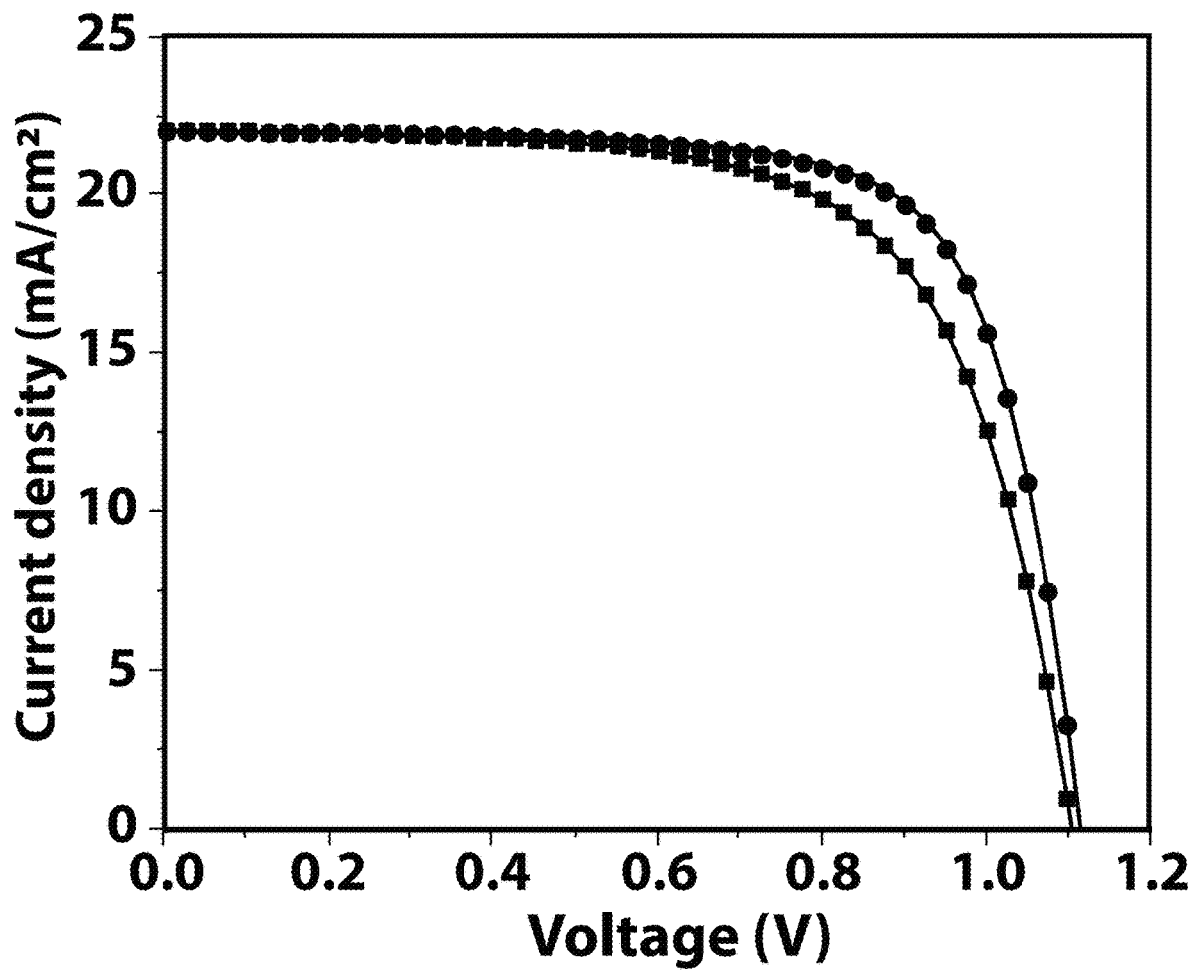
FIGS. 18A-18E illustrate photocurrent density-voltage (J-V) curves of champion perovskite solar cells based on control and SSG perovskite thin films, according to some embodiments of the present disclosure. Both backward-scan (circle symbols) and forward-scan curves (square symbols) were measured with a bias step of 10 mV and the delay time of 0.1 seconds.
Figure 18B:
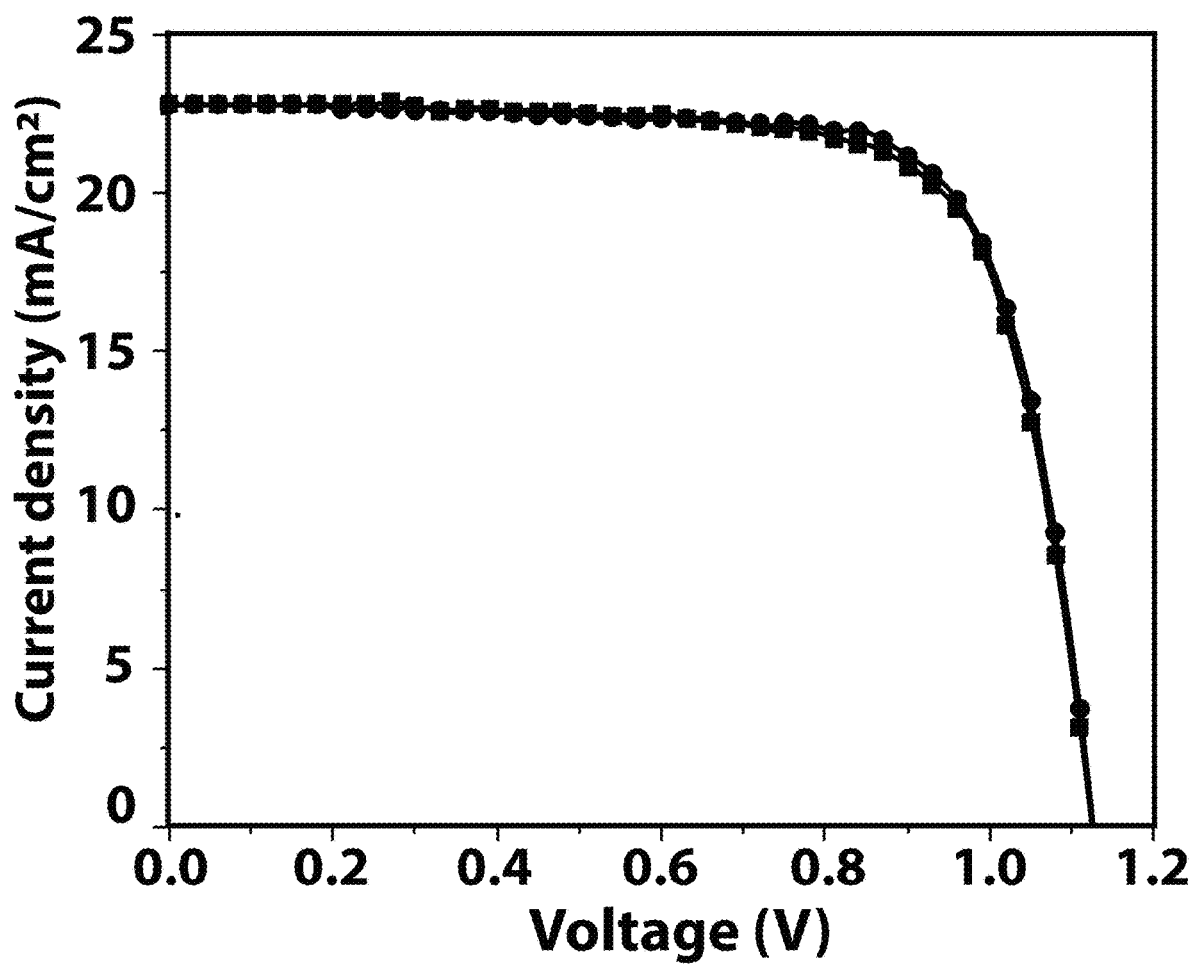
Figure 18C:
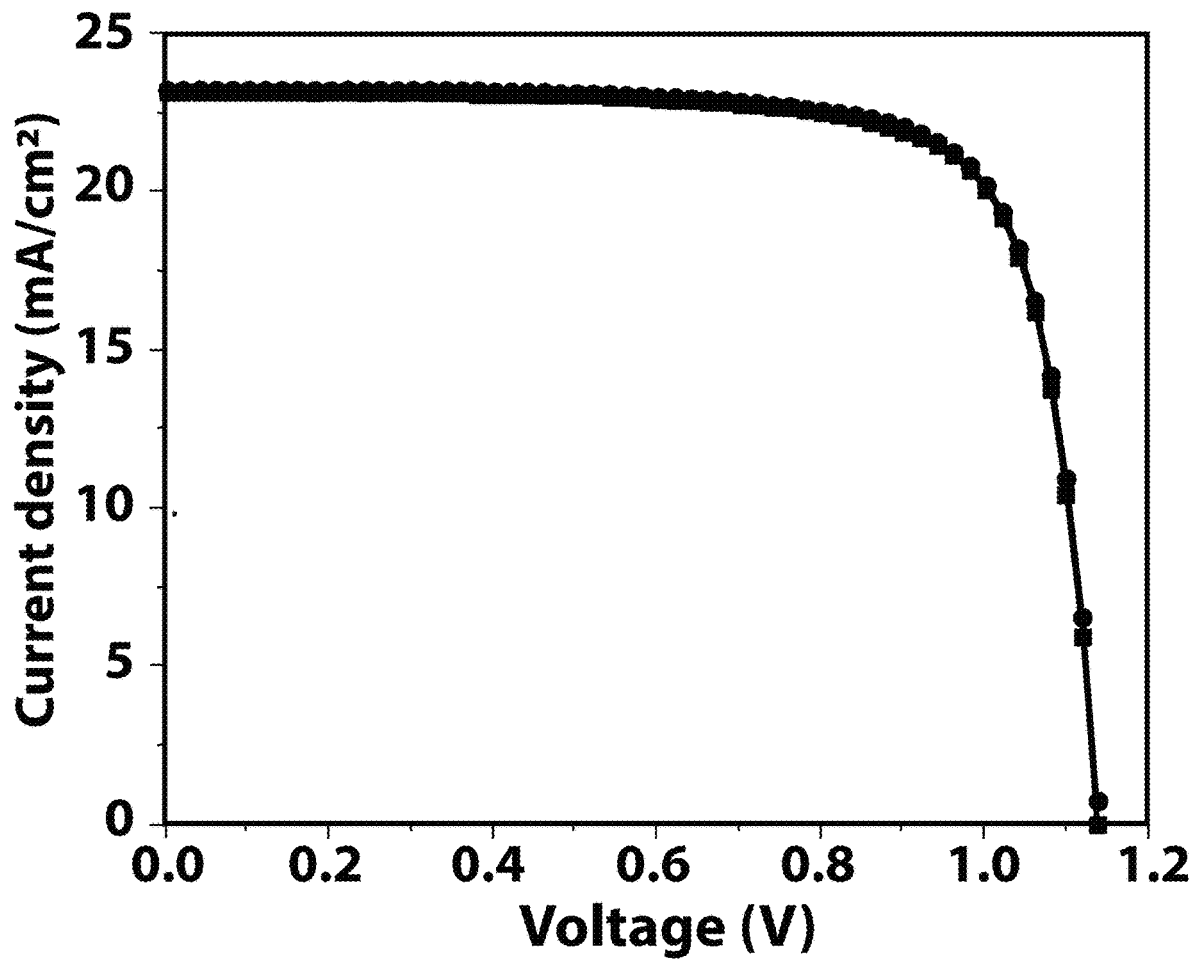
Figure 18D:
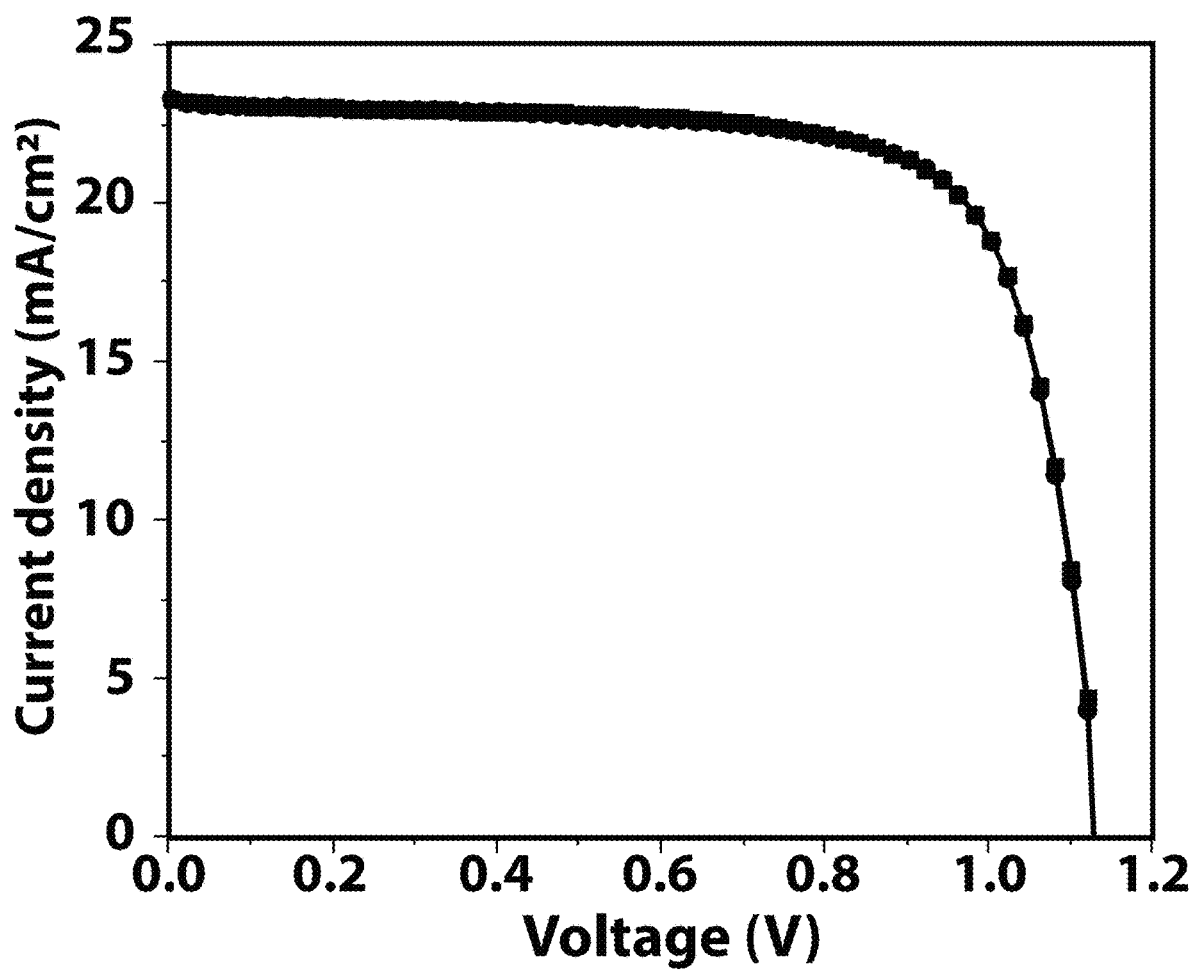
Figure 18E:
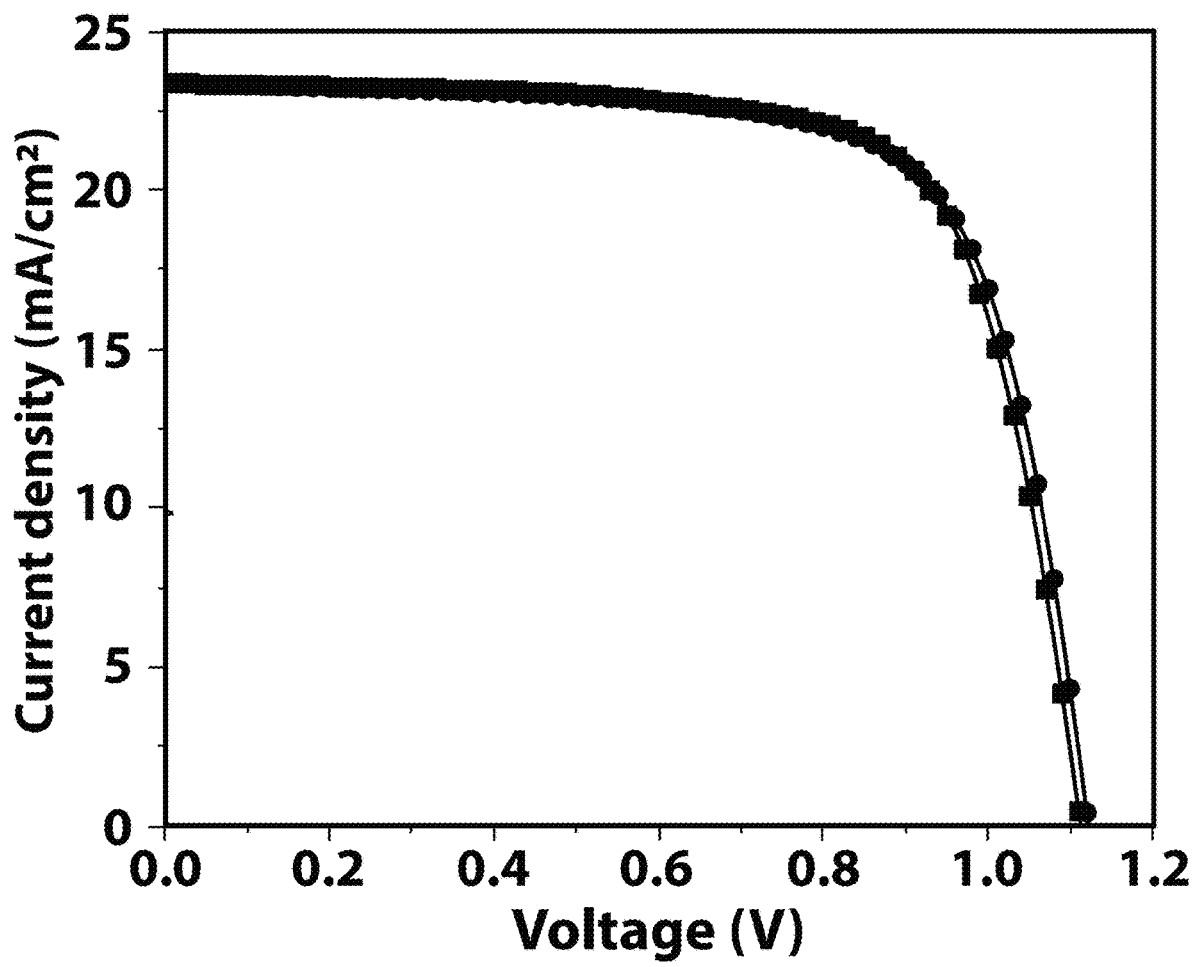
Figure 19A:
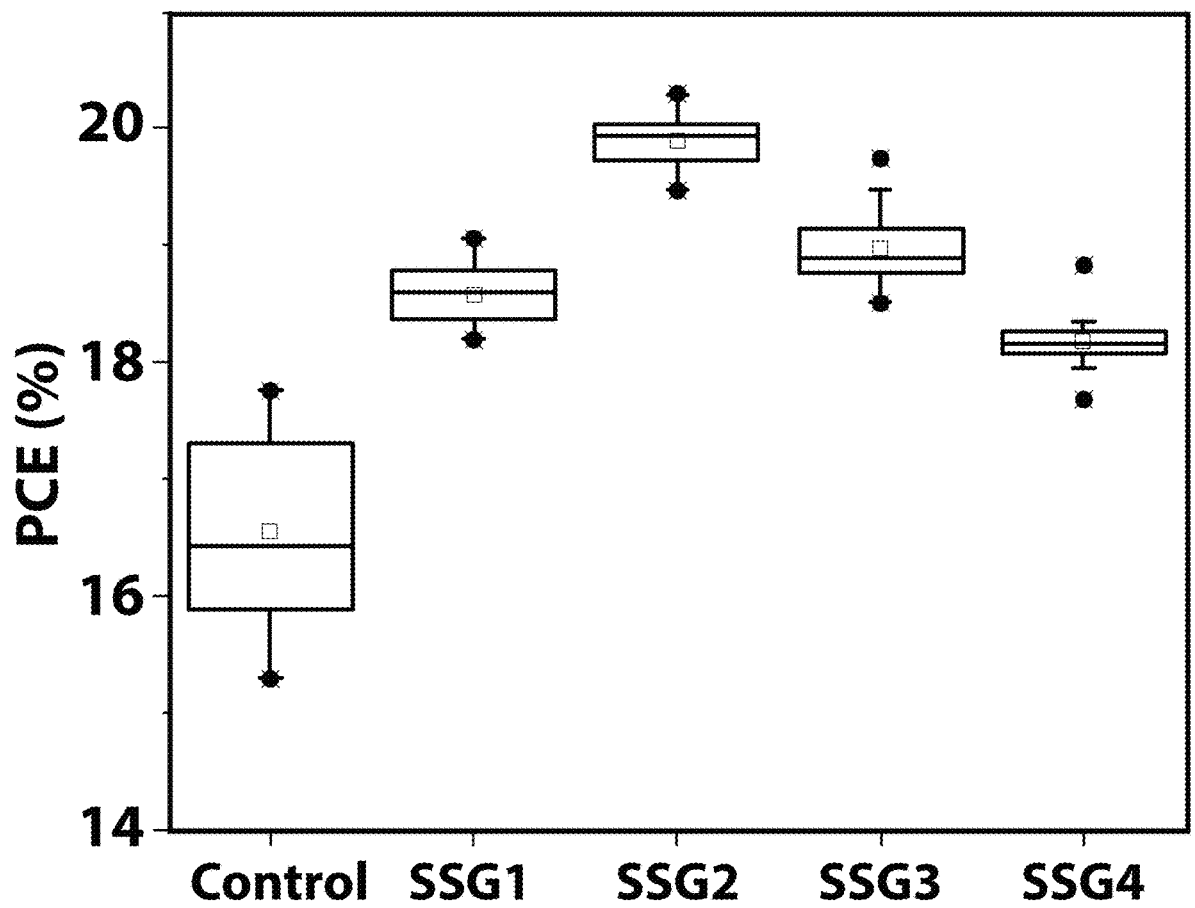
FIG. 19A illustrates the statistical distribution of PCE of perovskite solar cells based on control and SSG perovskite thin films, according to some embodiments of the present disclosure. Due to the relatively small hysteresis, only reverse-scan J-V curves were used to obtain these PV parameters.
Figure 19B:
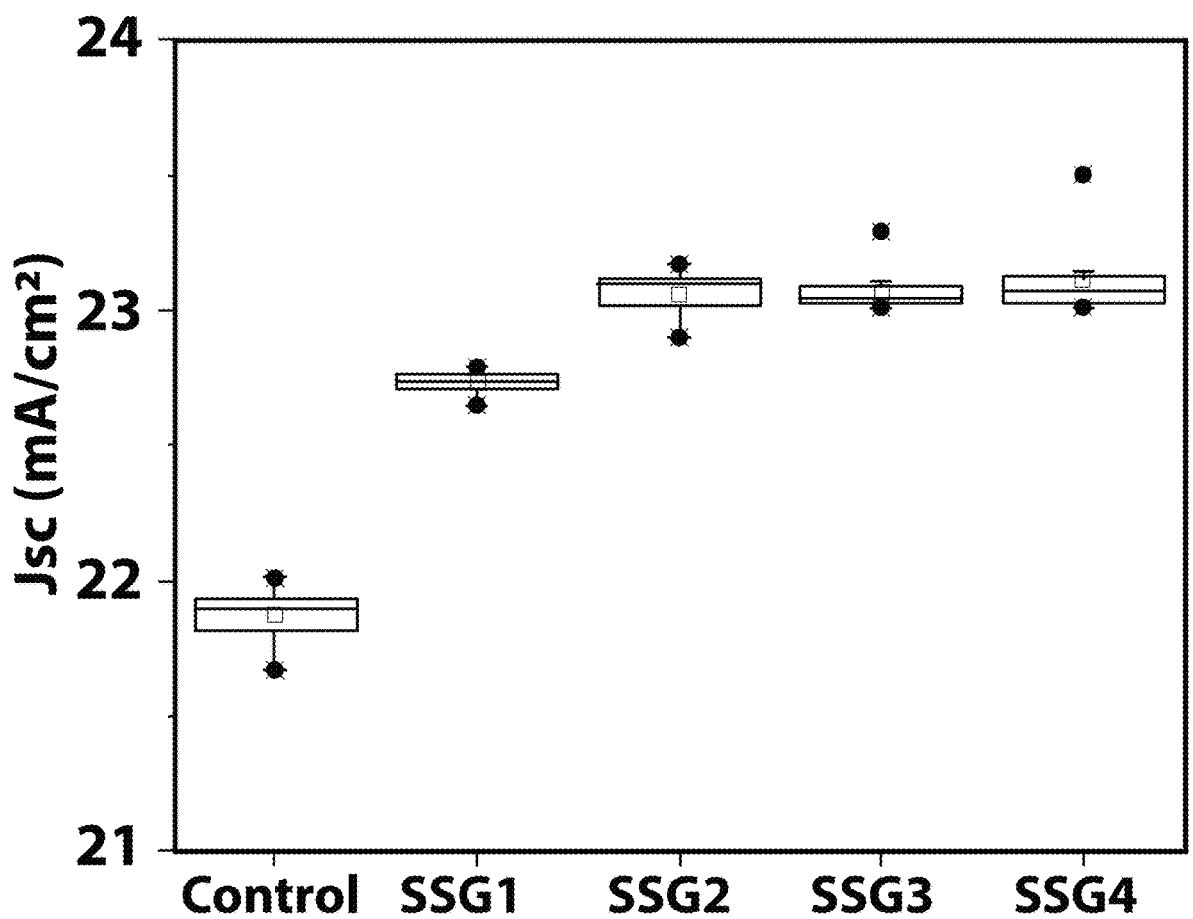
FIG. 19B illustrates the statistical distribution of $J_{sc}$ of perovskite solar cells based on control and SSG perovskite thin films, according to some embodiments of the present disclosure. Due to the relatively small hysteresis, only reverse-scan J-V curves were used to obtain these PV parameters.
Figure 19C:
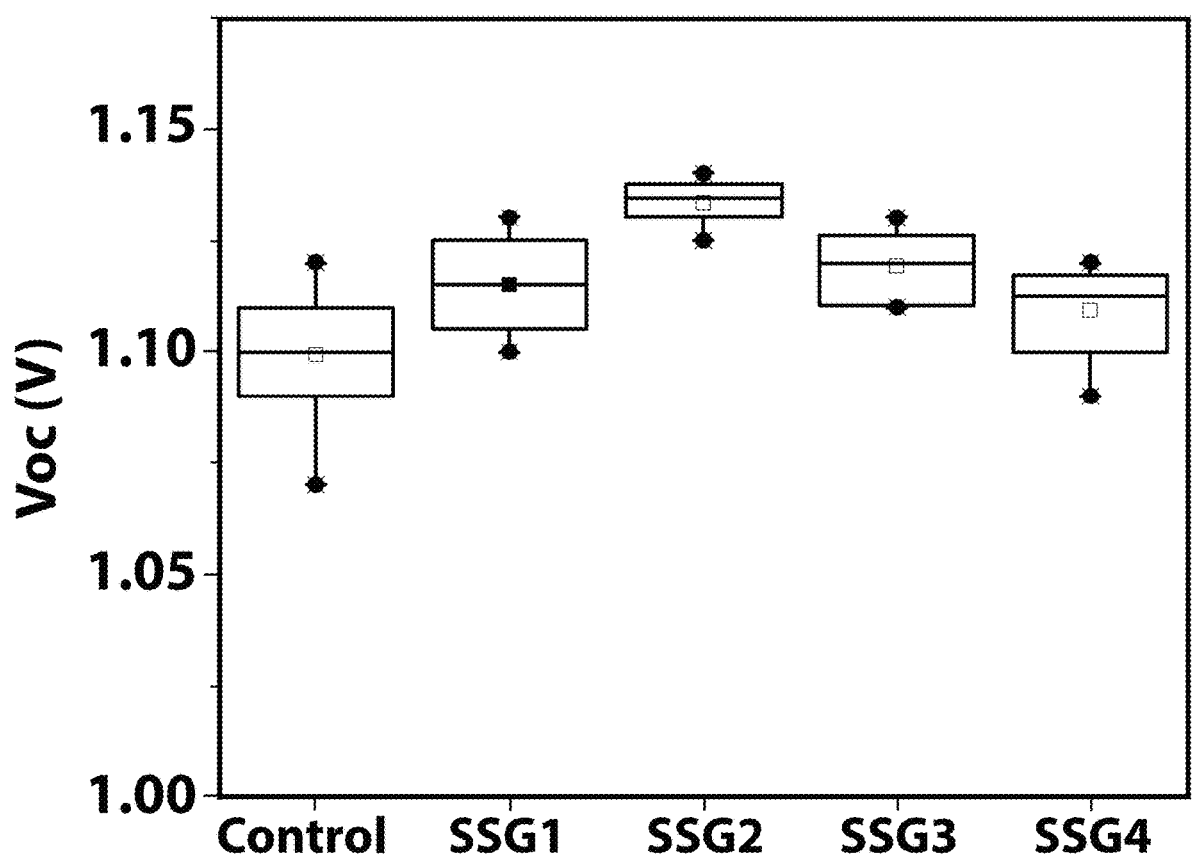
FIG. 19C illustrates the statistical distribution of $V_{OC}$ of perovskite solar cells based on control and SSG perovskite thin films, according to some embodiments of the present disclosure. Due to the relatively small hysteresis, only reverse-scan J-V curves were used to obtain these PV parameters.
Figure 19D:
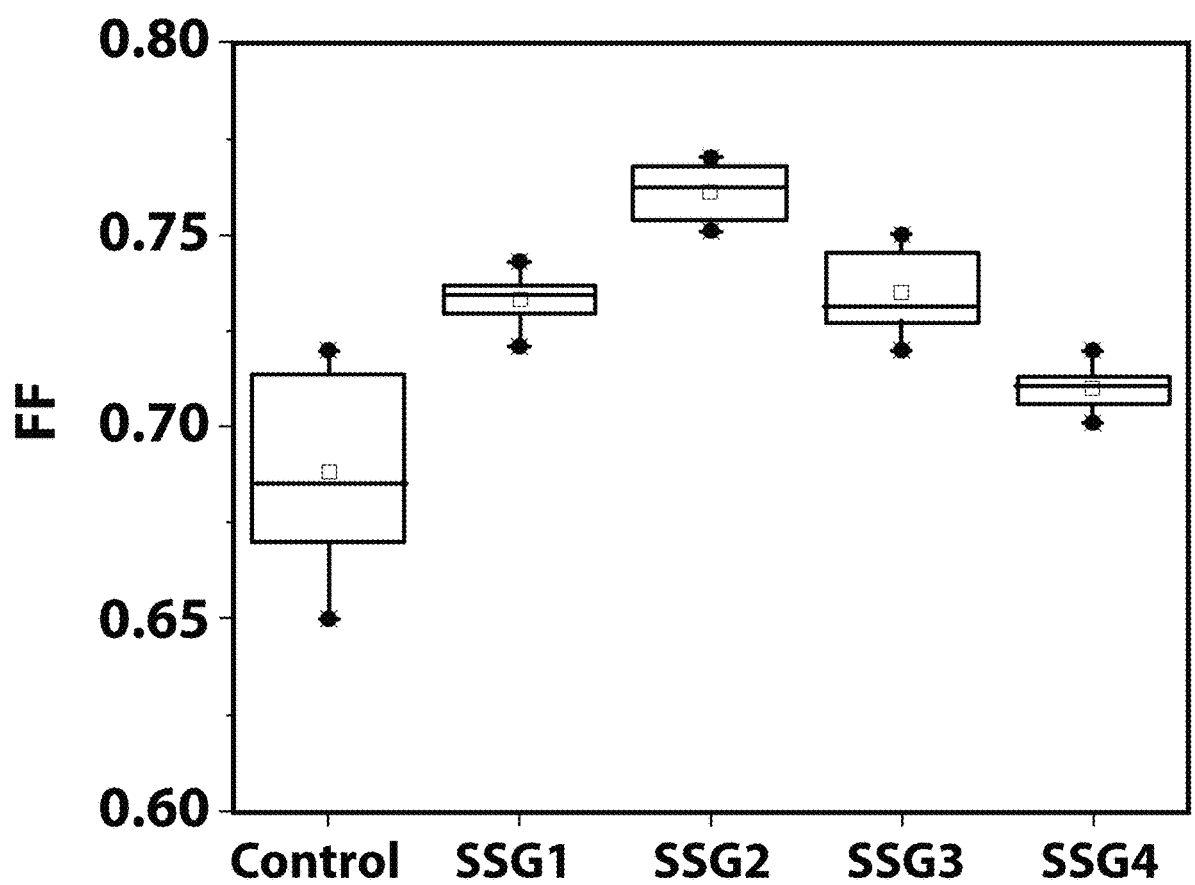
FIG. 19D illustrates the statistical distribution of FF of perovskite solar cells based on control and SSG perovskite thin films, according to some embodiments of the present disclosure. Due to the relatively small hysteresis, only reverse-scan J-V curves were used to obtain these PV parameters.

The control device delivered a PCE of 17.76%, with $V_{oc}$ of 1.12V, $J_{sc}$ of 21.98 mA $cm^{-2}$, and FF of 0.72. In contrast, the SSG1, SSG2, SSG3, and SSG4 perovskite-based devices displayed better performance with PCEs of 19.06%, 20.30%, 19.74%, and 18.83%, respectively. The improvement in $J_{sc}$, $V_{oc}$, and FF to may be primarily due to higher mobility, longer lifetime, lower trap density, and fewer boundaries produced by the SSG process. In addition, the J-V hysteresis between backward and forward scans was also significantly reduced for the devices using perovskite films synthesized using the SSG method, in comparison to the control device, which is consistent with the improvements in structural and optoelectronic properties of SSG perovskites. FIG. 17C shows external quantum efficiency (EQE) spectra of the corresponding PSCs. The integrated current densities estimated from the EQE spectra are 21.4 mA $cm^{-2}$ and 22.8 mA $cm^{-2}$ for the control device and SSG2-synthesized perovskite-based solar cells, respectively. These are in good agreement with the $J_{sc}$ values obtained from the J-V curves. The stabilized power outputs (SPOs) from the control and SSG2 PSCs are 17.01% and 20.20%, respectively (see FIG. 17D), which are consistent with the J-V measurements. The reproducibility of the device performance was evaluated by characterizing 20 cells. Histograms of the PCE parameters of these devices (see FIGS. 19A-19D) indicate excellent reproducibility.

Figure 20A:
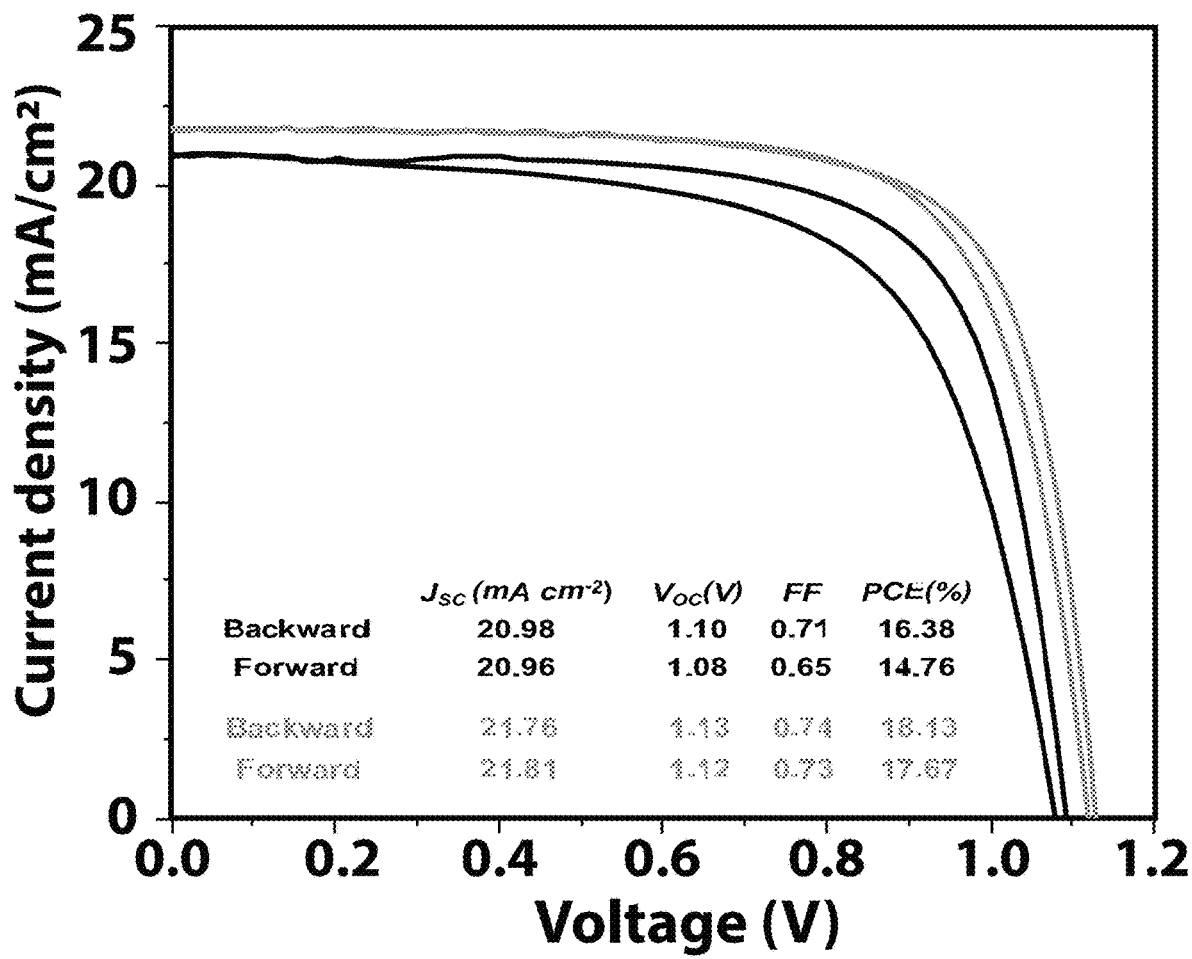
FIGS. 20A (MAPI) and 20B (a mixed perovskite including FA, MA, Pb, I and Br) illustrates J-V curves of perovskite solar cells based on different perovskite composition prepared by the SSG approach, according to some embodiments of the present disclosure. Both backward-scan and forward-scan curves were measured with a bias step of 10 mV and the delay time of 0.1 seconds. Control—dark line; SSG2—lighter line.
Figure 20B:
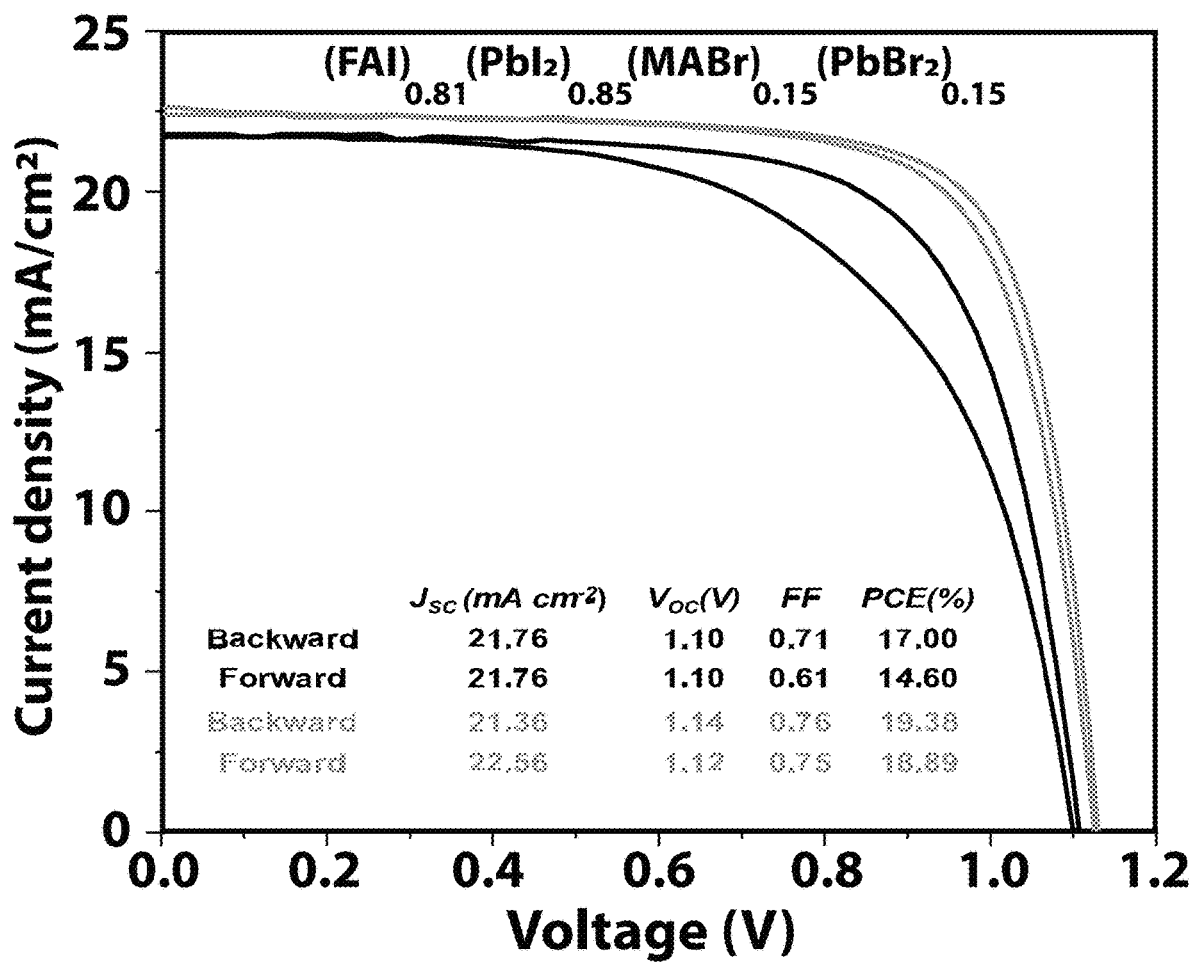
Figure 21A:
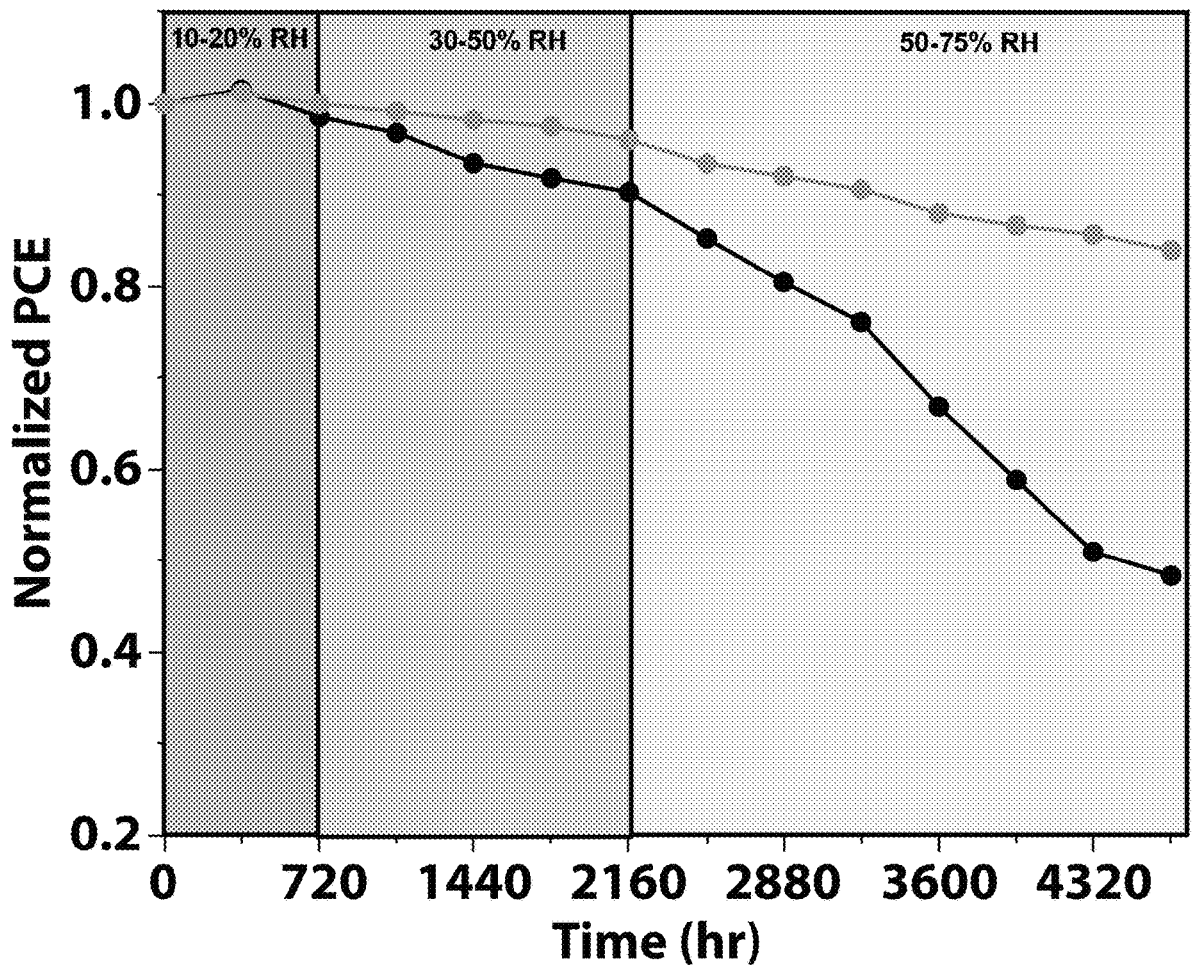
FIGS. 21A-21D illustrates a stability comparison of perovskite solar cells based on the control and SSG2 perovskite thin films, according to some embodiments of the present disclosure. These devices were not encapsulated and were held in dark at room temperature in ambient environment of different relative humidity (RH, as indicated). Control—dark symbols; SSG2—lighter symbols.
Figure 21B:
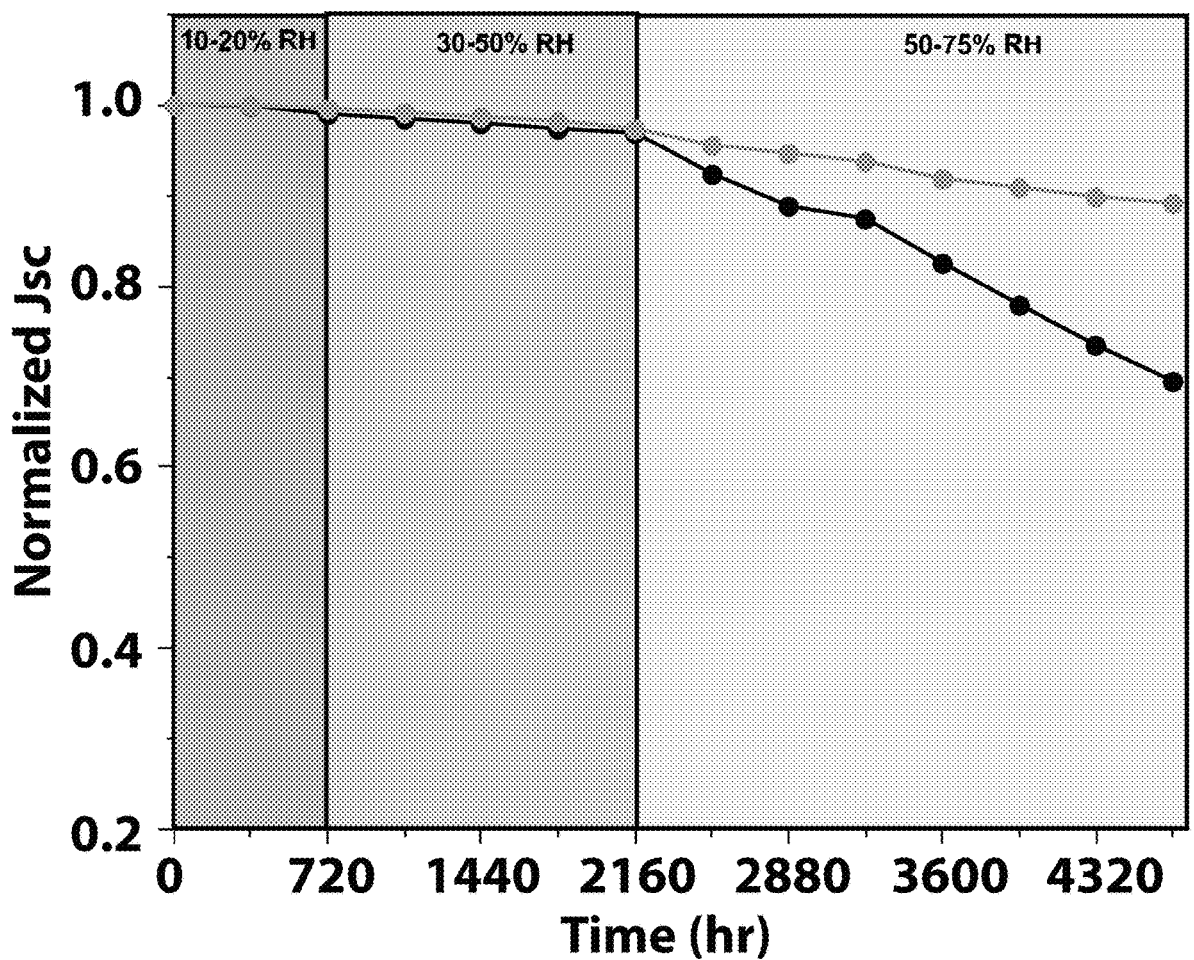
Figure 21C:
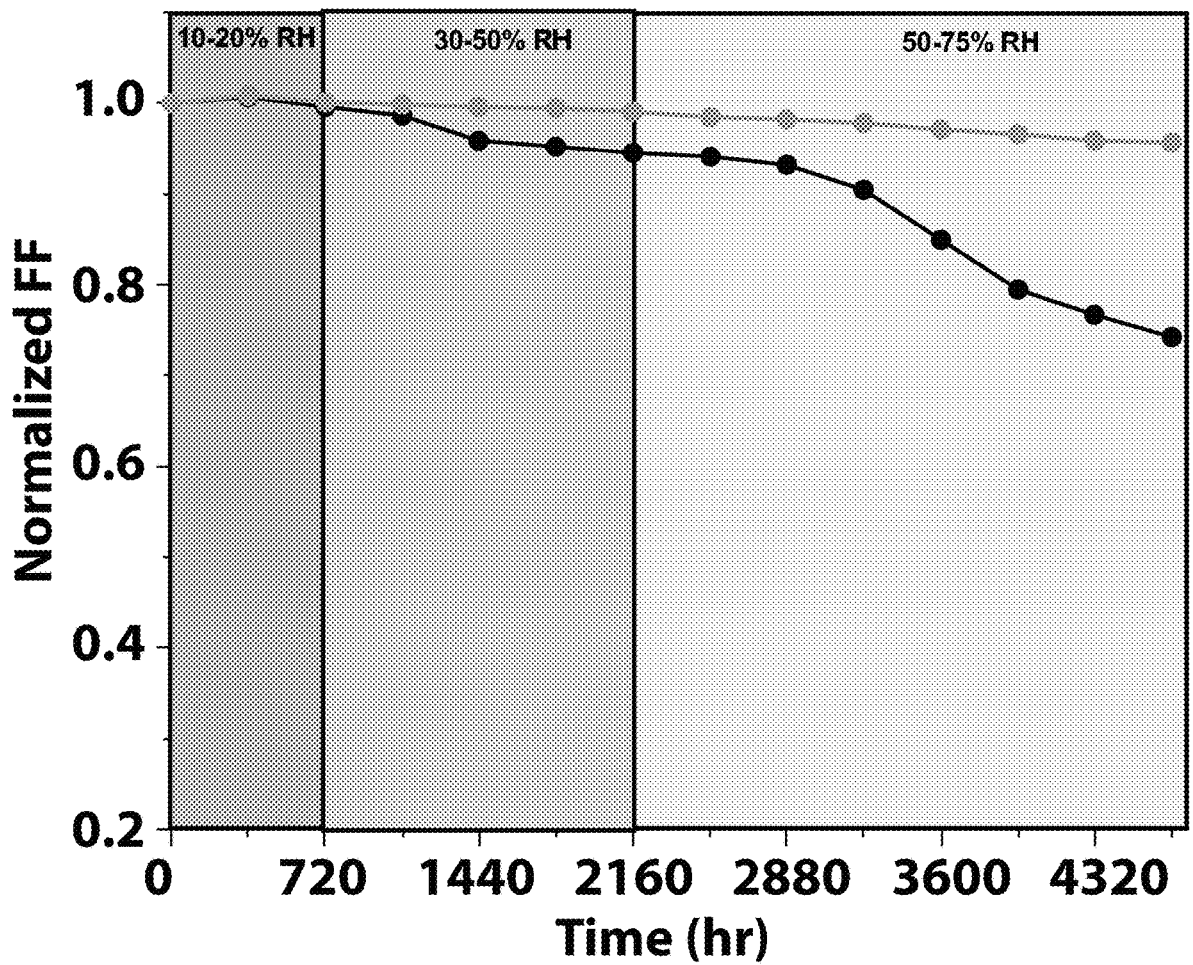
Figure 21D:
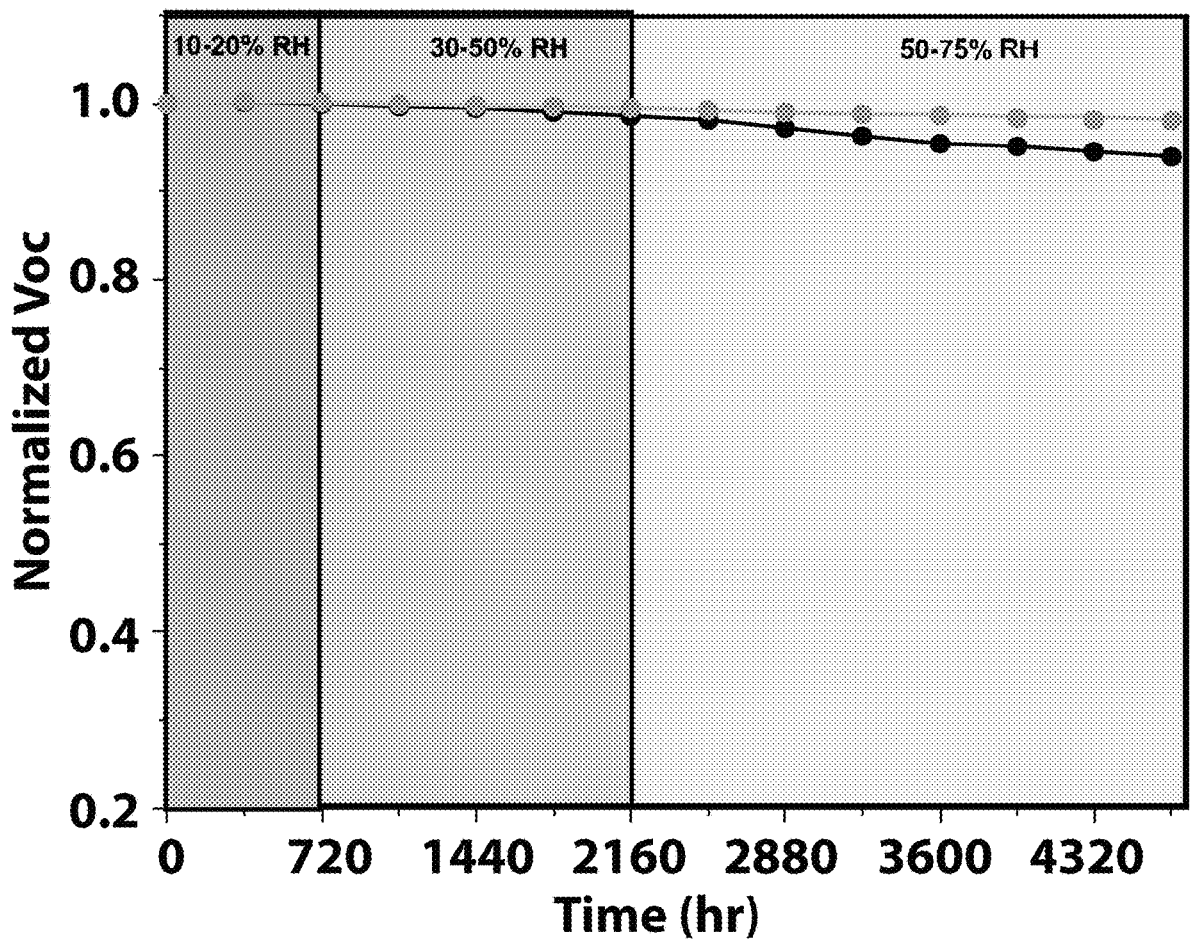
Figure 22A:
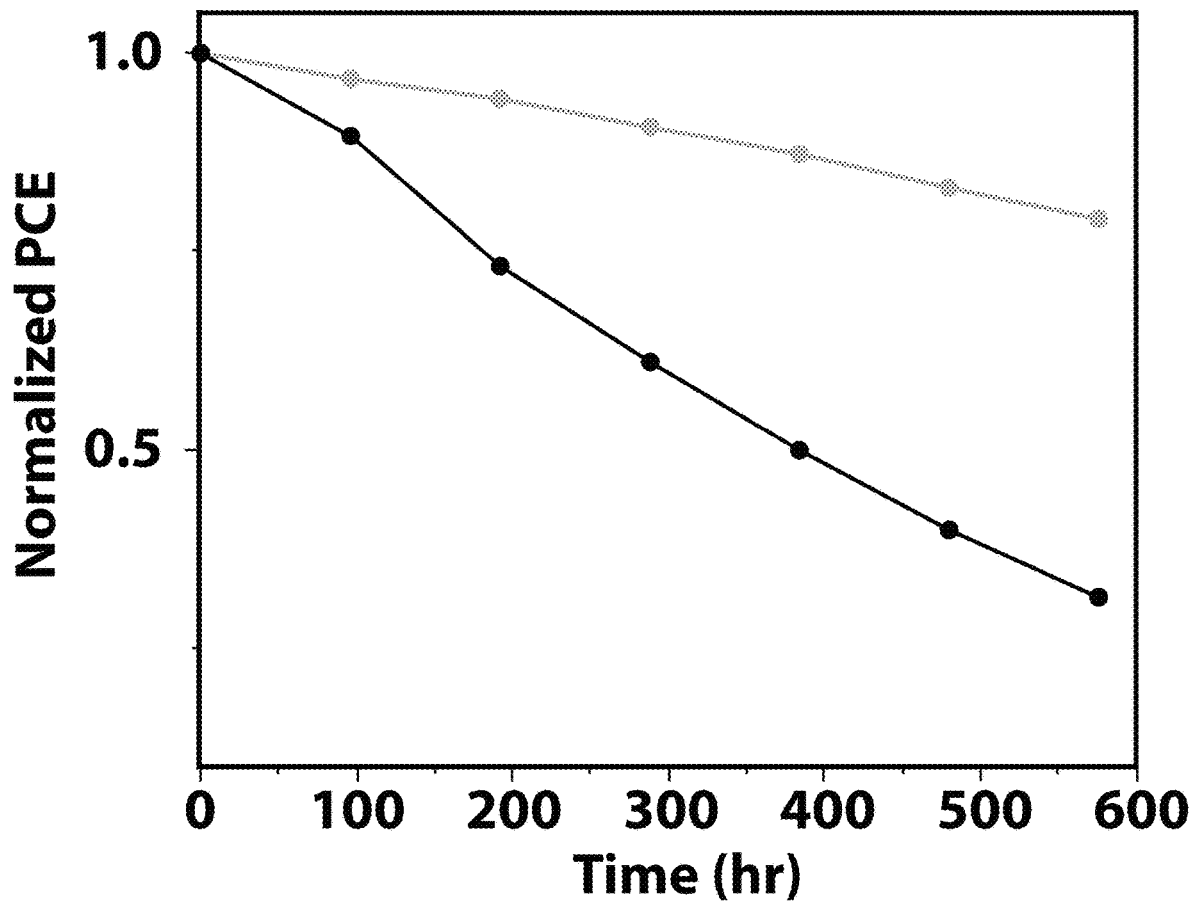
FIGS. 22A-22D illustrates light-soaking stability of perovskite solar cells based on the control and SSG2 perovskite thin films, according to some embodiments of the present disclosure. These devices were not encapsulated and were held at open circuit at 45°-50° C. under continuous illumination (~0.7 sun) in ambient environment of 10%-30% RH. Control—dark symbols; SSG2—lighter symbols.
Figure 22B:
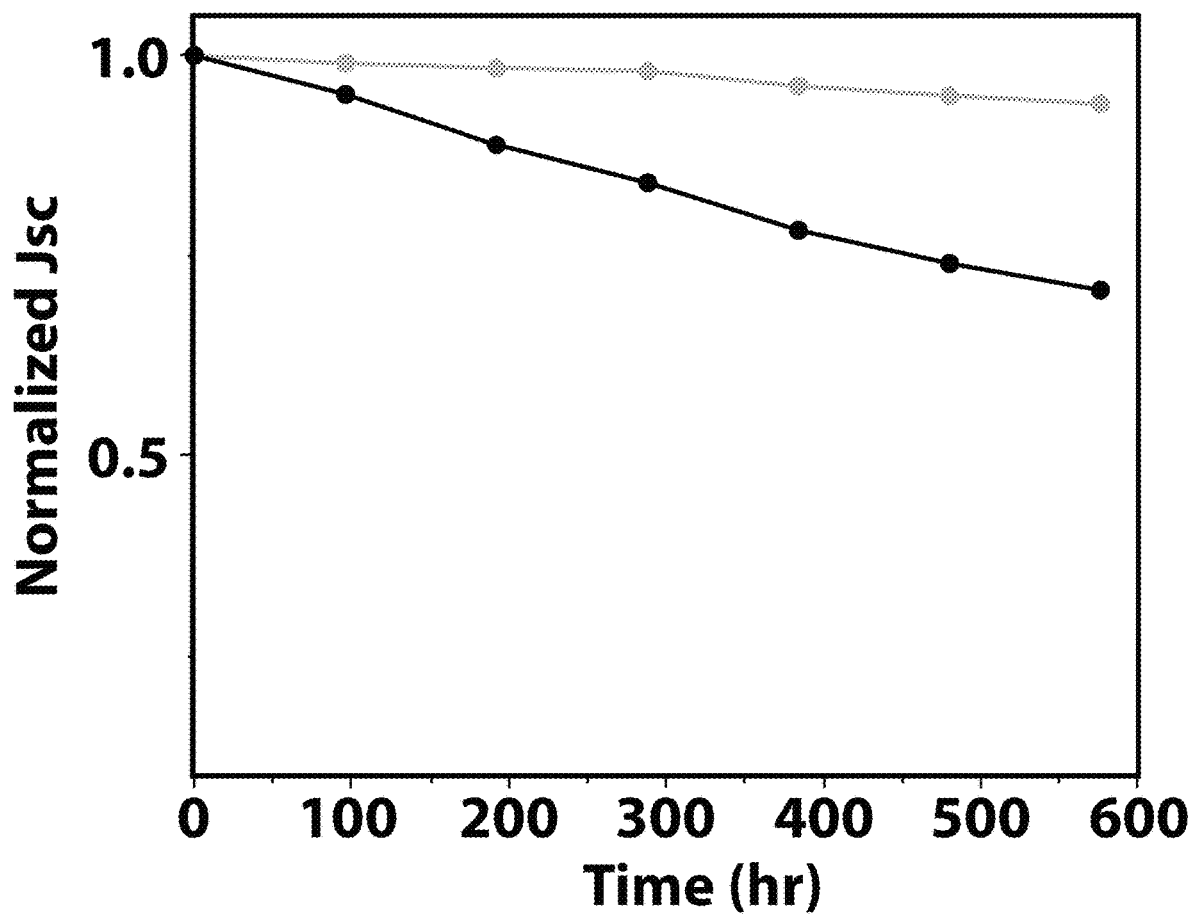
Figure 22C:
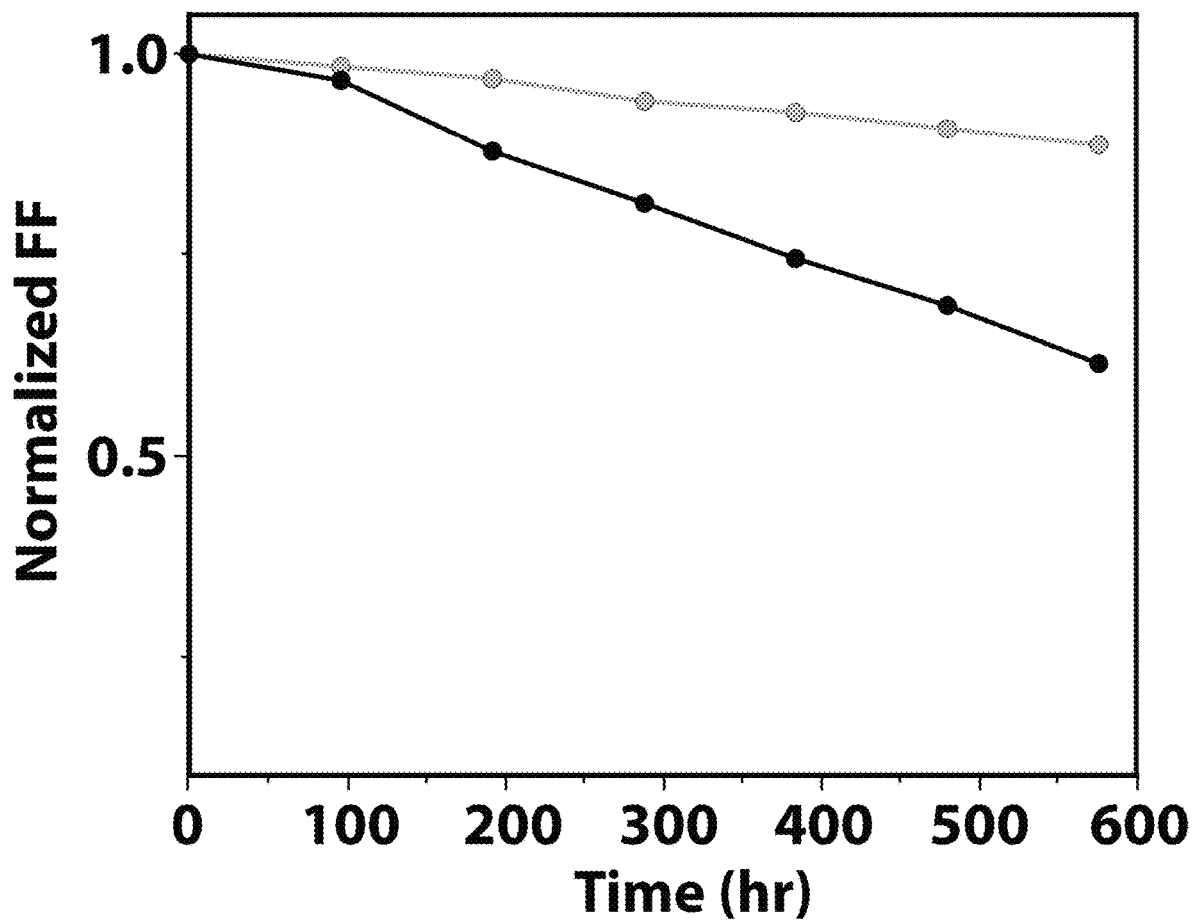
Figure 22D:
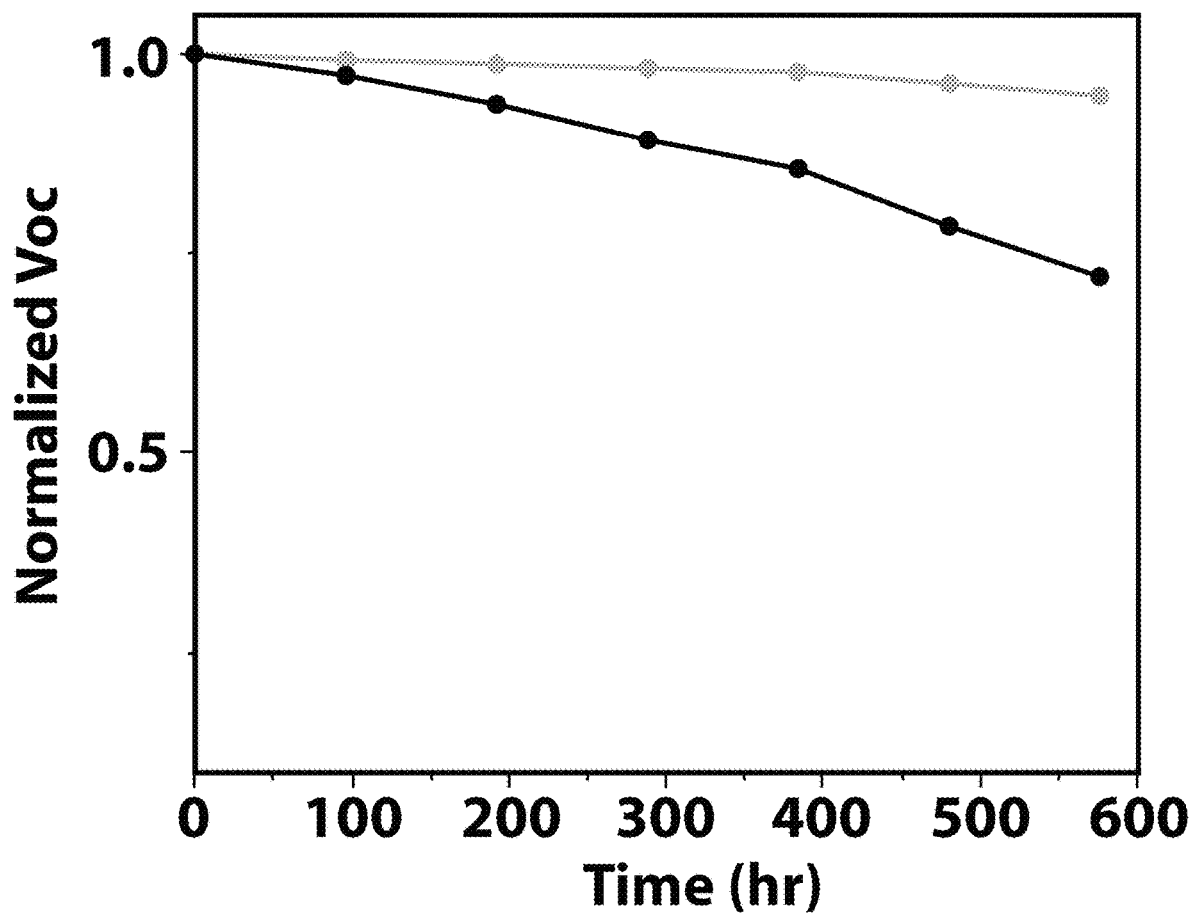

In addition to the triple-cation perovskite composition, two additional perovskite compositions were studied (single-cation: $MAPbI_3$; and double-cation: $[(FAI)_{0.81}(PbI_2)_{0.85}(MABr)_{0.15}(PbBr_2)_{0.15}]$) based on this simple SSG approach. From FIGS. 20A and 20B, the devices both displayed improved PCE and reduced hysteresis compared to the control, indicating the general applicability of this approach for a wide range of perovskite compositions.

Figure 23:
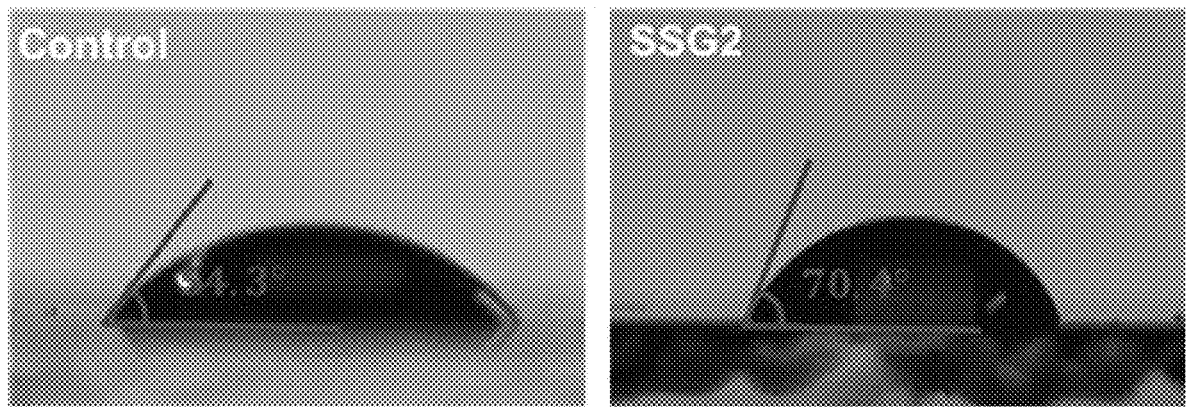
FIG. 23 illustrates contact-angle measurement of water droplet on the control and SSG2 perovskite thin films, according to some embodiments of the present disclosure.

Humidity is known to be a challenging issue for the long-term stability of PSCs. FIGS. 21A-21D show the stability tests of unencapsulated PSCs stored under an ambient environment of different relative humidity levels. The unencapsulated SSG2-based PSC maintained its initial PCE after 720 hours in 10%-20% RH, then 96% of the initial PCE after an additional 1,440 hours in 30%-50% RH, and finally dropped to 84% of the initial PCE after a subsequent 2,520-hour test in 50%-75% RH. In contrast, the unencapsulated control PSC showed PCE degradation to 98%, 90%, and 51% of the initial value after sequential tests in 10%-20% RH for 720 h, then in 30%-50% RH for 1,440 h, and finally in 50%-75% RH for 2,520 hours, respectively. In addition, we further conducted stability testing of the control and SSG2 PSCs kept at open-circuit condition, under continuous illumination at about 0.7 sun intensity, without encapsulation, under an ambient environment of 10%-30% RH at ~45°-50° C. FIGS. 22A-22D shows that the SSG2 PSC maintained 80% of its initial PCE after 576 h, whereas the control PSC maintained only 32% of its initial PCE under the same test condition. This significant improvement in the SSG2 PSC is consistent with improved perovskite properties such as enhanced hydrophobicity (see FIG. 23), larger grain size, fewer grain boundaries, and reduced trap density.

Experimental Methods

Materials. All solution chemicals were purchased from Sigma-Aldrich and used as-received without any other refinement unless otherwise specified. FAI and MABr were purchased from Greatcell Solar. $PbI_2$ and $PbBr_2$ was from TCI Corporation. Spiro-OMeTAD was received from Merck Corporation. The titanium diisopropoxide bis(acetylacetonate), bis(trifluoromethanesulfonyl)imide lithium salt, tert-butylpyridine, and CsI were purchased from Sigma-Aldrich. Substrates are patterned fluorine-doped tin-oxide-coated glass (<15 Ω/square) obtained from Advanced Election Technology Co., Ltd.

Device Fabrication. Devices were prepared on conductive fluorine-doped tin oxide (FTO)-coated glass substrates. The substrates were cleaned extensively by deionized water, acetone, and isopropanol. A compact titanium dioxide ($TiO_2$) layer of about 40 nm was deposited by spray pyrolysis of 7-mL 2-propanol solution containing 0.6-mL titanium diisopropoxide bis(acetylacetonate) solution (75% in 2-propanol, Sigma-Aldrich) and 0.4-mL acetylacetone at 450° C. in air. On top of this layer, mesoporous titanium dioxide was formed by spin-coating 30-nm-sized nanoparticles (Dyesol 30NRD, Dyesol) diluted in ethanol (1:6 w/w) at 4,500 rpm for 15 seconds. The $[(CsPbI_3)_{0.05}(FAPbI_3)_{0.85}$ (MAPbBr$_3$)$_{0.15}$] precursor solution was prepared in a glovebox from a 1.4 M Pb$^{2+}$(PbI$_2$ and PbBr$_2$) and in the mixed solvent of DMF and DMSO; the volume ratio of DMF/DMSO is 4:1. The spin-coating procedure was performed by 2,000 rpm for 10 seconds followed with 6,000 rpm for 30 seconds. At 15 seconds before the last spin-coating step, 140 µL of chlorobenzene were pipetted onto the substrate. Thereafter, the substrate was put onto a hotplate for 1 h at 100° C. Subsequently, the hole-transporting layer (HTM) was deposited on the top of the perovskite by spin coating at 4,000 rpm for 15 seconds. The spiro-OMeTAD solutions were prepared dissolving the spiro-OMeTAD in 1-mL chlorobenzene at a concentration of 60 mM, with the addition of 30 mM bis(trifluoromethanesulfonyl)imide lithium salt from a stock solution in acetonitrile, 200 mM of tert-butylpyridine. The devices were finalized by thermal evaporation of 100-nm gold.

Measurements and Characterizations. SEM (FEI Nova 630, field-emission gun) imaging was performed with an electron-beam voltage of 3 kV and current of 3 nA in the immersion-lens mode. The XRD of the perovskite films was characterized using a Rigaku D-Max 2200 diffractometer with Cu Kα radiation. The optical absorption spectra of perovskite films were measured using an ultraviolet/visible (UV/Vis) spectrophotometer (Cary6000i). Solar cell performance measurements were taken under a simulated AM 1.5G illumination (100 mW/cm$^2$, Oriel Sol3A Class AAA Solar Simulator). The photocurrent density-voltage (J-V) characteristics were measured using a Keithley 2400 source meter. The J-V curves of all devices were measured by masking the active area with a metal mask of area 0.12 cm$^2$. The continuous current and power output were measured using a potentiostat (Princeton Applied Research, Versa STAT MC). External quantum efficiency (EQE) spectra of solar cells were measured using a solar cell quantum-efficiency measurement system (QEX10, PV Measurements).

Kelvin Probe Force Microscopy (KPFM). KPFM was measured by a Veeco D5000 AFM equipped with the Nanoscope V controller. The system stays in an Ar-filled glove box with water/oxygen content <0.1 ppm. KPFM measures the contact potential difference between the probe (Nanosensor PPP-EFM-20, Pt/Ir coated) and sample by probing and nullifying the Coulomb force between the probe and sample. The measured potential resolution is ~10 mV. Topographic and potential images were collected simultaneously during the probe scanning. The scans on TiO$_2$ before and after the wash-away were done roughly on the same location to track the potential change. The potential profiles and images subtraction were performed on the exact locations as judged by AFM images, with an uncertainty of <10 nm.

Transient Absorption (TA) measurement. Microsecond TA spectra were collected using a Helios spectrometer (Ultrafast systems). A Coherent Libra regeneratively amplified Ti:sapphire laser with ~4-W, 1-kHz, and ~100-fs pulse-width output at 800 nm was used for pump-beam generation. The 800-nm beam was directed into a TOPAS optical parametric amplifier to generate a pump pulse at 520 nm and was modulated at 500 Hz through an optical chopper to block every other laser pulse. The probe beam is derived from an EOS system and was electronically delayed with respect to pump laser pulse. The probe beam produced was a broadband visible spectrum from 400 to 900 nm. The probe was then passed through a continuously variable neutral-density filter and a fraction was separated off to be used as a reference that accounts for probe-beam intensity fluctuations. The pump and probe beams were then overlapped at the sample. Visible photodiode arrays (Ultrafast Systems) were used to detect the probe and reference beams for data acquisition.

Time-Resolved Microwave Conductivity. Thin-film perovskite samples deposited directly onto pre-cleaned and UV-ozone-treated quartz substrates (1 cm×2.5 cm×1 mm) were photoexcited through the quartz side of the substrate with 650 nm (5-ns pulse width) from an optical parametric oscillator (Continuum Panther) pumped by the 355-nm harmonic of a Q-switched Nd:YAG laser (Continuum Powerlite). The transient change in photoconductance, ΔG(t), was measured via changes in the microwave power, ΔP(t), due to absorption of microwaves (~9 GHz) by the photogenerated holes and electrons, and is given by:

$$\Delta G(t)=(-1/K)(\Delta P(t)/P), \quad \text{Eq. 1}$$

where K is a calibration factor experimentally determined from the resonance characteristics of the microwave cavity and the dielectric properties of the sample. The end-of-pulse (peak) photoconductance, $\Delta G_{peak}$, can be related to the product of the yield of free-carrier generation, φ, and the sum of the GHz-frequency electron and hole mobilities, $\mu_e$ and $\mu_h$, respectively (termed Σµ), by:

$$\Delta G_{peak} = \beta q_e N(\mu_e + \mu_h) = \beta q_e I_0 F_A \varphi \Sigma \mu \quad \text{Eq. 2}$$

where β=2.2 and is the ratio of the interior dimensions of the waveguide, $q_e$ is the electronic charge, N is the number of photogenerated charge-carrier pairs, $\mu_e$ and $\mu_h$ are the electron and hole mobilities, $I_0$ is the incident photon flux of the excitation laser pulse, and $F_A$ is the fraction of photons absorbed by the sample. In bulk semiconductors, where the photogeneration yield can be assumed to be unity, the photoconductance provides a measure of the carrier mobility. Transient photoconductance data were recorded at pump excitation intensities (~1-sun) where recombination and peak photoconductance is independent of intensity, provided that sufficient signal-to-noise was attainable. Hutter et al. have shown the distinction between carrier dynamics as a function of excitation wavelength in the TRMC experiment for perovskite thin films. At excitation wavelengths deeper within the absorption profile of the film, where nearly all of the photons are absorbed across a thin cross-section of the film, higher-order recombination processes can be observed even at nominally "low" fluences due to the higher density of photogenerated species. Therefore, we excited these samples closer to the absorption onset at 650 nm where generation of charges is more uniform throughout the vertical cross section of the film (where higher-order recombination processes are negligible). Hence, a linear response of the photoconductance is observed and φΣµ becomes constant as a function of fluence. From this linear response, we extract the carrier mobility, which is used to readily calculate charge-carrier density using the corresponding dark conductance data (described below).

Dark Microwave Conductivity: Measurements of steady-state microwave absorption, otherwise known as dark microwave conductivity, were carried out for each of the thin-film perovskite samples (same used in the TRMC experiments) to quantify the dark carrier density for each sample. A thoroughly detailed account of the dark microwave conductivity technique has already been published (see especially the supplemental information), which describes our cavity geometry, simulations of the electric field within, the fitting routines, and caveats to the approach. A brief description of the technique will be presented here.

Dark microwave conductivity is a useful technique to characterize the effective conductivity of a thin-film sample, and it has been demonstrated for MAPbI$_3$ thin films, compacted low-density materials, and also loose powders. Like TRMC, it is a contact-free measurement that does not require a full device-stack architecture or electrodes of any kind. As such, we can evaluate certain intrinsic electrical properties, namely the ~9-GHz conductivity of exclusively the perovskite absorber layer. In the dark conductivity experiment, the sample (first the unique substrate, then again with the film deposited on that substrate) is positioned within a well-defined microwave cavity to maximize interaction with the field and provide a high degree of sensitivity to changes in the sample composition and properties. For all of the dark experiments, we measure the change in microwave power reflection coefficient in the cavity relative to a control (the bare substrate). From the power reflection curves, we use fitting procedures in IgorPro 6.7 to match the complex conductivity of simulated properties in a look-up table (from a series of solved Maxwell's equations using COMSOL) to the experimental data. From the thin-film thickness, carrier mobility, and dark conductivity, we can readily calculate the carrier density in each film.

Space-Charge-Limited Current (SCLC) measurement: The SCLC was based on ITO/MO$_x$(10-nm)/PVK/MO$_x$(10-nm)/Al devices. Typical three-regions I-V curves were observed in both devices in a log-log representation. In the low-bias region, the current density is proportional to voltage, which reflects an ohmic contact with the electrode. With increasing bias, the current density increased abruptly, corresponding to a trap-filled-limit (TFL) current. We calculated the trap-state density ($N_t$) using the TFL voltage equation $N_t = 2\varepsilon\varepsilon_0 V_{TFL}/qd^2$, where $\varepsilon_0$ is the dielectric constant of vacuum permittivity, $\varepsilon$ is the relative dielectric constant of perovskite, q is the elementary charge, d is the thickness of the perovskite film, and $V_{TFL}$ is determined from the J-V curve. The presumptions of this analysis may be questioned in the context of the halide perovskite materials; however, it provides a relative measure of the trap densities and we can estimate the trap densities for corresponding perovskite films.

Time-of-flight secondary-ion mass spectrometry (TOF-SIMS): An ION-TOF TOF-SIMS V Time of Flight SIMS (TOF-SIMS) spectrometer was utilized for depth profiling and chemical imaging of the perovskite utilizing methods outlined in detail by Harvey et. al. Analysis was completed utilizing a 3-lens 30 kV BiMn primary ion gun. Profiling and imaging were completed with the Bi$^{3+}$ primary ion beam, (0.8 pA pulsed beam current), after a light surface cleaning with 1 kV O$^{2-}$ sputter beam (6 nA current, 750×750 μm$^2$) to remove adhered atmospheric contaminants from the substrate a 500×500 μm$^2$ area was imaged with a 1024:1024 primary beam raster, the total dosage was 1×10$^{10}$ ions/cm$^2$, well below the static SIMS limit of 1×10$^{12}$ ions/cm$^2$. The beam resolution in this measurement mode (which is tuned to maximize the mass resolution) is on the order of 3-5 microns.

EXAMPLES

Example 1

A method comprising: applying a first perovskite precursor solution to a substrate to form a first liquid film of the first perovskite precursor solution on the substrate; from the first liquid film, forming a first intermediate solid perovskite layer on the substrate; and repeating at least once, both the applying and the forming, resulting in the creation of at least one additional intermediate solid perovskite layer; and treating a last intermediate solid perovskite layer, resulting from the at least one additional applying and the at least one additional forming, to create a final solid perovskite layer.

Example 2

The method of Example 1, wherein the repeating is performed between 1 and 10 times.

Example 3

The method of Example 2, wherein the repeating is performed between 2 and 5 times.

Example 4

The method of Example 1, wherein: the first perovskite precursor solution comprises a precursor for a perovskite defined by ABX$_3$, where A is a first cation, B is a second cation, and X is an anion.

Example 5

The method of Example 4, wherein the precursor solution comprises at least one of CsPbI$_3$, FAPbI$_3$, MAPbBr$_3$, PbI$_2$, or PbBr$_2$.

Example 6

The method of Example 4, wherein the final solid perovskite layer comprises Cs$_{(1-x-y)}$FA$_x$MA$_y$PbI$_{(3-z)}$Br$_z$, $0 \leq x \leq 1$, $0 \leq y \leq 1$, and $0 \leq z \leq 3$.

Example 7

The method of Example 4, wherein the final solid perovskite layer comprises Pb$_x$Sn$_{(1-x)}$, and $0 \leq x \leq 1$.

Example 8

The method of Example 1, wherein the perovskite precursor solution comprises a polar solvent.

Example 9

The method of Example 8, wherein the polar solvent comprises at least one of dimethyl formamide (DMF)/dimethyl sulfoxide (DMSO), NN-dimethylformamide, γ-butyrolactone, dimethylacetamide, acrylonitrile, tetrahydrofuran, N-methyl-2-pyrrolidone, 1,3-dimethylimidazolidin-2-one, or 1,3-dimethyl-3,4,5,6-tetrahydropyrimidin-2(1H)-one.

Example 10

The method of Example 8, wherein the polar solvent comprises DMF and DMSO ata volume ratio of 4:1 (DMF:DMSO).

Example 11

The method of Example 1, wherein the first perovskite precursor solution comprises a quantum dot.

Example 12

The method of Example 11, wherein a second applying and a second forming utilizes a second perovskite precursor solution that does not contain a quantum dot.

Example 13

The method of Example 1, wherein the first perovskite precursor solution used during the first applying and forming comprises a first precursor.

Example 14

The method of Example 13, wherein a second perovskite precursor solution used during a second applying and a second forming comprises a second precursor that is different from the first precursor.

Example 15

The method of Example 1, wherein each applying is performed by at least one of a liquid phase processing method, a vapor phase processing method, or a gas phase processing method.

Example 16

The method of Example 15, wherein each subsequent applying is performed by at least one of a liquid phase processing method, a vapor phase processing method, or a gas phase processing method.

Example 17

The method of Example 15, wherein the liquid phase processing method comprises at least one of spin-coating, blade-coating, curtain-coating, dip-coating, or spray-coating.

Example 18

The method of Example 15, wherein the vapor phase processing comprises at least one atom layer deposition, chemical vapor deposition, pulsed laser deposition, evaporation, or sputtering.

Example 19

The method of Example 1, wherein the final solid perovskite layer comprises at least one of a physical property or a performance metric that is measurably better than the corresponding physical property or a performance metric of the first intermediate solid perovskite layer.

Example 20

The method of Example 1, wherein the at least one of a physical property or a performance metric comprises at least one of a grain size, a carrier lifetime, a mobility, a defect density, a device efficiency, or a device stability.

Example 21

The method of Example 19, wherein the at least one physical property or performance metric is measurable by at least one of XRD, time-resolved microwave conductivity, transient absorption, space-charge-limited current, scanning electron microscopy, TRPL, or photocurrent density-voltage.

Example 22

The method of Example 1, wherein the forming is performed by contacting the first liquid film with a liquid.

Example 23

The method of Example 22, wherein the liquid comprises chlorobenzene.

Example 24

The method of Example 1, wherein the treating comprises annealing the intermediate solid perovskite layer.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:
1. A method comprising:
a series of applying and converting steps comprising:
a first applying of a first liquid layer of a first solution comprising a perovskite precursor to a substrate;
a first converting of the first liquid layer to a first solid perovskite layer;
a second applying of a second liquid layer of a second solution comprising a perovskite precursor to the first solid perovskite layer; and
a second converting of the second liquid layer to a second solid perovskite layer
wherein:
the second solution dissolves a first portion of the first solid perovskite layer,
a second non-dissolved portion of the first solid perovskite layer remains on the substrate upon which the second solid perovskite layer nucleates and forms, and
the series of applying and converting steps results in a final solid perovskite layer.

2. The method of claim 1, further comprising:
a third applying of a third liquid layer of a third solution comprising a perovskite precursor to the second solid perovskite layer; and
a third converting of the third liquid layer to a third solid perovskite layer.

3. The method of claim 1, wherein:
the perovskite precursor of the first solution comprises a precursor for a perovskite defined by $ABX_3$,
A is a first cation, B is a second cation, and X is an anion.

4. The method of claim 3, wherein:
the perovskite precursor of the first solution comprises at least one of $CsPbI_3$, $FAPbI_3$, $MAPbBr_3$, $PbI_2$, or $PbBr_2$, FA is formamidinium, and MA is methylammonium.

5. The method of claim 4, wherein the final solid perovskite layer comprises $Cs_{(1-x-y)}FA_xMA_yPbI_{(3-z)}Br_z$, $0 \leq x \leq 1$, $0 \leq y \leq 1$, and $0 \leq z \leq 3$.

6. The method of claim 3, wherein the first solution further comprises a polar solvent.

7. The method of claim 6, wherein the polar solvent comprises at least one of dimethyl formamide (DMF)/dimethyl sulfoxide (DMSO), NN-dimethylformamide, γ-butyrolactone, dimethylacetamide, acrylonitrile, tetrahydrofuran, N-methyl-2-pyrrolidone, 1,3-dimethylimidazolidin-2-one, or 1,3-dimethyl-3,4,5,6-tetrahydropyrimidin-2(1H)-one.

8. The method of claim 1, wherein the perovskite precursor of the first solution comprises a perovskite quantum dot.

9. The method of claim 1, wherein the first solution used during the first applying comprises a first perovskite precursor.

10. The method of claim 9, wherein the second solution used during a second applying comprises a second perovskite precursor that is different from the first perovskite precursor.

11. The method of claim 1, wherein each applying is performed by at least one of a liquid phase processing method, a vapor phase processing method, or a gas phase processing method.

12. The method of claim 1, wherein the final solid perovskite layer comprises at least one of a physical property or a performance metric that is measurably better than the corresponding physical property or the performance metric of the first solid perovskite layer.

13. The method of claim 1, wherein the at least one of the first converting or the second converting is performed by contacting at least one of the first liquid layer or the second liquid layer with a solvent.

14. The method of claim 13, wherein the solvent comprises chlorobenzene.

15. The method of claim 1, further comprising treating the second solid perovskite layer to form the final solid perovskite layer.

16. The method of claim 15, wherein the treating comprises annealing the second solid perovskite layer.

17. The method of claim 7, wherein the polar solvent comprises DMF and DMSO at a volume ratio of about 4:1 (DMF:DMSO).

18. The method of claim 12, wherein the at least one of the physical property or the performance metric comprises at least one of a grain size, a carrier lifetime, a mobility, a defect density, a device efficiency, or a device stability.

19. The method of claim 18, wherein the at least one physical property or performance metric is measurable by at least one of XRD, time-resolved microwave conductivity, transient absorption, space-charge-limited current, scanning electron microscopy, TRPL, or photocurrent density-voltage.

20. The method of claim 1, wherein:
the final solid perovskite layer comprises a gradient layer, and
the second non-dissolved portion of the first solid perovskite layer is positioned between the substrate and the gradient layer.

* * * * *